United States Patent [19]

Ohmori et al.

[11] Patent Number: 5,445,171
[45] Date of Patent: Aug. 29, 1995

[54] SEMICONDUCTOR CLEANING APPARATUS AND WAFER CASSETTE

[75] Inventors: Masashi Ohmori; Hiroshi Tanaka; Akira Nishimoto; Hiroshi Sasai, all of Itami; Naohiko Fujino; Satoru Kotoh, both of Amagasaki, all of Japan

[73] Assignee: Mitsubishi Denki Kabushiki Kaisha, Tokyo, Japan

[21] Appl. No.: 123,244

[22] Filed: Sep. 20, 1993

[30] Foreign Application Priority Data

Sep. 25, 1992 [JP] Japan ................ 4-256827
Sep. 10, 1993 [JP] Japan ................ 5-225611

[51] Int. Cl.$^6$ ................ B08B 3/04
[52] U.S. Cl. ................ 134/61; 134/902
[58] Field of Search ................ 134/902, 61

[56] References Cited

U.S. PATENT DOCUMENTS

| | | | |
|---|---|---|---|
| 4,208,760 | 6/1980 | Dexter et al. | 134/902 X |
| 4,974,619 | 12/1990 | Yu | 134/902 X |
| 4,985,722 | 1/1991 | Ushijima et al. | 134/902 X |
| 5,092,011 | 3/1992 | Gommori et al. | 134/902 X |
| 5,168,886 | 12/1992 | Thompson et al. | 134/902 X |
| 5,191,908 | 3/1993 | Hiroe et al. | 134/902 X |
| 5,301,700 | 4/1994 | Kamikawa et al. | 134/902 X |

FOREIGN PATENT DOCUMENTS

| | | | |
|---|---|---|---|
| 316934 | 12/1989 | Japan | 134/902 |
| 188631 | 8/1991 | Japan | 134/902 |
| 256326 | 11/1991 | Japan | 134/902 |
| 719 | 1/1992 | Japan | 134/902 |
| 111315 | 4/1992 | Japan | 134/902 |
| 196531 | 7/1992 | Japan | 134/902 |
| 233729 | 8/1992 | Japan | 134/902 |
| 233747 | 8/1992 | Japan | 134/902 |
| 294535 | 10/1992 | Japan | 134/902 |
| 3187 | 1/1993 | Japan | 134/902 |
| 62955 | 3/1993 | Japan | 134/902 |

*Primary Examiner*—Philip R. Coe
*Attorney, Agent, or Firm*—Leydig, Voit & Mayer

[57] ABSTRACT

A semiconductor cleaning apparatus having: a loader-/unloader portion for injecting/ejecting a product cassette which accommodates a wafer; a product injecting-/ejecting portion for injecting/ejecting the wafer from the product cassette; a cleaning portion for cleaning the wafer; a water cleaning portion for, with water, cleaning the wafer which has been cleaned in the cleaning portion; a drying portion for drying the wafer which has been cleaned with water in the water cleaning portion; and a conveyance portion having a wafer hand for directly holding the wafer ejected from the product cassette in the product injecting/ejecting portion and sequentially conveying the wafer held by the wafer hand to the cleaning portion, the water cleaning portion and the drying portion.

3 Claims, 65 Drawing Sheets

SEMICONDUCTOR CLEANING APPARATUS AND WAFER CASSETTE

BACKGROUND OF THE INVENTION

1. Field of the Invention

The present invention relates to a semiconductor cleaning apparatus for cleaning semiconductor wafers and a wafer cassette for accommodating the semiconductor wafers.

2. Description of the Related Art

The structure of a conventional semiconductor cleaning apparatus is shown in FIG. 90. A product cassette accommodating non-cleaned wafers is injected into a loader/unloader portion 11. The product cassette is, by a conveyance robot (omitted from illustration), moved to a shifting portion 12. In the shifting portion 12, the wafer is shifted from the product cassette to a cleaning cassette. The cleaning cassette accommodating the wafers 1 is held by a cassette hand of a portion 19 for conveying products to be cleaned so that it is sequentially moved to a cleaning portion 14, a water cleaning portion 15 and a drying portion 16. Thus, the process for cleaning the wafers 1 is performed.

FIG. 91 illustrates a cleaning cassette 2 held by the cassette hand of the portion 19 for conveying products to be cleaned. The cleaning cassette 2 is so arranged as to be capable of accommodating a plurality of wafers 1. The cassette hand comprises a chuck-support arm 19$b$ connected to a movable arm 19$a$ and a chuck 19$c$ supported by the foregoing chuck-support arm 19$b$, the chuck 19$c$ supporting a flange 2$a$ of the cleaning cassette 2 so that the cassette 2 is held by the cassette hand.

The process for cleaning the wafers 1 will now be described with reference to FIG. 92. First, the movable arm 19$a$ is retracted while holding the cassette 2 by making use of the chuck 19$c$ and the movable arm 19$a$ is moved along a rod 19$d$ so that the cassette 2 is positioned above a cleaning chamber 14$a$ of a cleaning portion 14. Then, the movable arm 19$a$ is extended to move the cassette 2 downwards to be immersed in a cleaning solution 14$b$ in the cleaning chamber 14$a$. Since the upper end of the cassette 2 is, at this time, substantially the same height of the upper end of the wafer 1 accommodated in the cassette 2, complete immersion of the wafer 1 in the cleaning solution 14$b$ causes the chuck 19$c$ to be immersed in the cleaning solution 14$b$.

The chuck 19$c$ is then opened by the support arm 19$b$, and then the movable arm 19$a$ is retracted as to place the chuck 19$c$ on standby at a position above the cleaning portion 14. After the wafer 1 has been processed in the cleaning solution 14$b$, the movable arm 19$a$ is again extended so that the cassette 2 in the cleaning solution 14$b$ is held to be taken out of the cleaning chamber 14$a$, followed by immersing the cassette 2 in a water cleaning solution 15$b$ in a water cleaning chamber 15$a$. During a period in which the wafer 1 is subjected to the water cleaning process in the water cleaning solution 15$b$, the chuck 19$c$ is on standby at a position above the water cleaning chamber 15$a$. After the water cleaning process has been completed, the chuck 19$c$ is used to take out the cassette 2 in the water cleaning chamber 15$a$, and then the cassette 2 is set into a drying portion 16. During a period in which the wafer 1 is, together with the cassette 2, subjected to the drying process to be performed in the drying portion 16, the chuck 19$c$ is moved to a hand cleaning portion 13 by the movable arm 19$a$. In the hand cleaning portion 13, the chuck 19$c$ is cleaned and dried. Then, the chuck 19$c$ is used to hold the cleaning cassette 2 positioned in the drying portion 16 and to be moved to a standby portion 17.

The cleaning cassette 2 accommodating the wafer 1 subjected to the cleaning process is moved from the standby portion 17 to the shifting portion 12 by a cleaning cassette conveyance portion 18. In the shifting portion 12, the wafer 1 is shifted from the cleaning cassette 2 to the product cassette before the wafer 1 is discharged to the loader/unloader portion 11. It should be noted that the product cassette has a structure similar to that of the cleaning cassette 2.

However, a conventional cleaning apparatus of the type arranged as described above is arranged such that the chuck 19$c$ is immersed in the cleaning solution 14$b$ and the water cleaning solution 15$b$ whenever the cleaning cassette 2 is injected and ejected to and from the cleaning chamber 14$a$ and the water cleaning chamber 15$a$. Therefore, the chuck 19$c$ must be cleaned and dried in the exclusive hand cleaning portion 13 in order to take out the dried wafer 1 and the cassette 2 of the drying portion 16. As an alternative to this, an exclusive conveyance portion having a chuck, which has been previously dried, must be disposed in order to take out the cassette 2 of the drying portion 16. As a result, there arises a problem that the size of the cleaning apparatus cannot be reduced.

Since the portion 19 for conveying products to be cleaned continuously performs the operation for conveying the cleaning cassette 2 accommodating the wafer and the operation for cleaning and drying the cassette hand, the portion 19 for conveying products to be cleaned must perform excessively heavy labor and the time taken to complete the operation becomes too long. Therefore, another problem arises in that the performance of the cleaning apparatus deteriorates.

In the cleaning chamber 14$a$ of the cleaning portion 14, the cleaning solution 14$b$ is heated and the raised temperature is maintained by a heater or the like to perform the process. If light etching is performed, for example, SC1 ($NH_4OH + H_2O_2 + H_2O$) is heated to 40° C. to 50° C. and this level is maintained. If the resist is removed, for example, sulfuric acid, water, and peroxide ($H_2SO_4 + H_2O_2 + H_2O$) is heated to 140° C. to 150° C. and this level is maintained to perform the desired process. Since the semiconductor cleaning apparatus is placed in a clean room, its atmospheric air temperature is controlled to, for example, 25° C. Therefore, the cleaning solution 14$b$ is evaporated from the surface as a chemical mist 14$c$ which is, as shown in FIG. 93, then diffused while wafting on an upflow 14$d$ of a natural convection generated on the surface of the cleaning solution 14$b$. In order to prevent this, a local exhaust duct 14$e$ is locally disposed above the cleaning chamber 14$a$ so that the chemical mist 14$c$ wafting on the upflow 14$d$ of the natural convection is, together with the exhaust flow, sucked.

On the other hand, the conveyance robot of the conveyance portion 19 is moved vertically while holding the cleaning cassette 2 with the cassette hand thereof to immerse the cleaning cassette 2 in the cleaning solution 14 and ejecting the same from the cleaning solution 14$b$.

However, the local exhaust duct 14$e$ cannot completely suck the upflow 14$d$ of the natural convection and the chemical mist 14$c$ from the entire upper surface of the cleaning chamber 14$a$, resulting in that a portion of the chemical mist 14$c$ outwards diffuses. When the cleaning cassette 2 is taken out of the cleaning solution 14b, the cleaning cassette 2, which is wet with the cleaning solution 14b, is raised to an upper position which is not affected by the local exhaust. Therefore, the chemical mist 14c is newly generated in the wet cleaning cassette 2, the chemical mist 14c thus-generated being then diffused. Therefore, the chemical mist 14c adheres the conveyance robot of the conveyance portion in the semiconductor cleaning apparatus. As a result, there arise problems in-that the conveyance robot is corroded and that the adhesion of the chemical mist 14c to the product wafer causes defects.

Another problem arises in that the chemical mist 14c wafts on the circulation flow in the clean room and diffuses and, accordingly, the equipment is corroded or the product wafer is defective.

SUMMARY OF THE INVENTION

The present invention is directed to overcome the foregoing problems and, accordingly, an object of the present invention is to provide a semiconductor cleaning apparatus, the size of which can be reduced and which exhibits excellent processing performance.

Another object of the present invention is to provide a semiconductor cleaning apparatus capable of preventing diffusion of chemical mist generated in a cleaning portion and vapor generated in a drying portion into the semiconductor cleaning apparatus or a clean room.

Another object of the present invention is to provide a wafer cassette capable of taking out a dry wafer from a drying portion while protecting the wafer from being wetted even if no exclusive hand cleaning portion is provided.

A semiconductor cleaning apparatus according to a first aspect of the present invention comprises: a loader/unloader portion for injecting/ejecting a product cassette which accommodates a wafer; a product injecting-/ejecting portion for injecting/ejecting the wafer from the product cassette; a cleaning portion for cleaning the wafer; a water cleaning portion for, with water, cleaning the wafer which has been cleaned in the cleaning portion; a drying portion for drying the wafer which has been cleaned with water in the water cleaning portion; and a conveyance portion having a wafer hand for directly holding the wafer ejected from the product cassette in the product injecting/ejecting portion and sequentially conveying the wafer held by the wafer hand to the cleaning portion, the water cleaning portion and the drying portion.

A semiconductor cleaning apparatus according to a second aspect of the present invention comprises: a loader/unloader portion for injecting/ejecting a product cassette which accommodates a wafer; a cleaning cassette for accommodating the wafer and having handles formed above the accommodated wafer; a shifting portion for shifting the wafer between the product cassette received by the loader/unloader portion and the cleaning cassette; a cleaning portion for, with a cleaning solution, cleaning the wafer accommodated in the cleaning cassette; a water cleaning portion for, with water, cleaning the wafer, which has been cleaned in the cleaning portion, while accommodating the wafer in the cleaning cassette; a drying portion for drying the wafer, which has been cleaned with water in the water cleaning portion, while accommodating the wafer in the cleaning cassette; and a conveyance portion which hold the handles of the cleaning cassette to sequentially convey the cleaning cassette from the loader/unloader portion to the cleaning portion, the water cleaning portion and the drying portion wherein the handles of the cleaning cassette are positioned above the levels of a cleaning solution and cleaning water when the accommodated wafer is completely immersed in the cleaning solution in the cleaning portion and cleaning water in the water cleaning portion.

A semiconductor cleaning apparatus according to a third aspect of the present invention has an arrangement that the loader/unloader portion and the shifting portion are disposed in the widthwise direction of the cleaning apparatus, the conveyance portion is disposed in the central portion of the cleaning apparatus in the longitudinal direction of the cleaning apparatus, and the cleaning portion, the water cleaning portion and the drying portion are disposed on the two sides of the conveyance portion.

A semiconductor cleaning apparatus according to a fourth aspect of the present invention has an arrangement that the loader/unloader portion, the shifting portion, the cleaning portion, the water cleaning portion and the drying portion are disposed to form two lines and the conveyance portion is disposed along the two-line configuration.

A semiconductor cleaning apparatus according to a fifth aspect of the present invention has an arrangement that the loader/unloader portion, the shifting portion, the cleaning portion, the water cleaning portion and the drying portion are disposed around the conveyance portion.

A semiconductor cleaning apparatus according to a sixth aspect of the present invention comprises: a first air conditioning filter for supplying clean air to the cleaning portion, the water cleaning portion and the drying portion to form downflows at positions above the cleaning portion, the water cleaning portion and the drying portion; a first discharge portion disposed in the vicinity of each chamber of the cleaning portion, the water cleaning portion and the drying portion; temperature detection means for detecting the temperature of a cleaning solution of the cleaning portion and/or the temperature of vapor in the drying portion; and air supply pressure changing means for changing the air supply pressure of the first air conditioning filter in accordance with the temperature detected by the temperature detection means.

A semiconductor cleaning apparatus according to a seventh aspect of the present invention comprises: a first air conditioning filter for supplying clean air to the cleaning portion, the water cleaning portion and the drying portion to form downflows at positions above the cleaning portion, the water cleaning portion and the drying portion; a first discharge portion disposed in the vicinity of each chamber of the cleaning portion, the water cleaning portion and the drying portion; a panel above chambers which covers the portions above the cleaning portion, the water cleaning portion and the drying portion, which has openings immediately above the chambers and which has the peripheral portion having a multiplicity of small apertures connected to the first discharge portion; and a drain receiver disposed below the multiple small apertures of the panel above chambers.

A semiconductor cleaning apparatus according to an eighth aspect of the present invention comprises: a first air conditioning filter for supplying clean air to the cleaning portion, the water cleaning portion and the drying portion to form downflows at positions above the cleaning portion, the water cleaning portion and the drying portion; a first discharge portion disposed in the vicinity of each chamber of the cleaning portion, the water cleaning portion and the drying portion; a first heat exchanger for cooling air to be supplied from the first air conditioning filter to the cleaning portion, the water cleaning portion and the drying portion; and a first refrigerator for supplying a cooling medium to the first heat exchanger, wherein air cooled in the first heat exchanger and upflows of natural convections of vapor generated in a cleaning chamber of the cleaning portion or a vapor chamber of the drying portion are made conflict with each other at a position adjacent to the top end of the cleaning chamber or the vapor chamber to condense steam in cooled air and generate water mist.

A semiconductor cleaning apparatus according to a ninth aspect of the present invention comprises: a first air conditioning filter for supplying clean air to the cleaning portion, the water cleaning portion and the drying portion to form downflows at positions above the cleaning portion, the water cleaning portion and the drying portion; a first discharge portion disposed in the vicinity of each chamber of the cleaning portion, the water cleaning portion and the drying portion; and a double-fluid nozzle, which sprays pure water while using clear air or inactive gas as a second fluid, to generate pure-water mist to be mixed into downflows.

A semiconductor cleaning apparatus according to a tenth aspect of the present invention comprises: air curtain blowing means having a blowing out port formed above the cleaning chamber of the cleaning portion and a vapor chamber of the drying portion along one side of the chamber and arranged to blow out, in the horizontal direction, an air curtain, which is equal in the widthwise direction, from the blowing out port toward another side of the chamber; air curtain discharge means having a suction port equally formed in the widthwise direction of another side of the cleaning chamber of the cleaning portion and the vapor chamber of the drying portion to discharge the air curtain sucked through the suction port; and rectifying means disposed in the blowing out port of the air curtain blowing means, arranged to blow out the air curtain to form a layer flow and having a length in the direction of the passage which is gradually shortened in proportion to the distance from the cleaning chamber and the vapor chamber to form a velocity distribution in which the flowing velocity is gradually raised in inverse proportion to the distance from the chamber.

A semiconductor cleaning apparatus according to an eleventh aspect of the present invention comprises: air curtain blowing means having a blowing out port formed above the cleaning chamber of the cleaning portion and a vapor chamber of the drying portion along one side of the chamber and arranged to blow out, in the horizontal direction, an air curtain, which is equal in the widthwise direction, from the blowing out port toward another side of the chamber; air curtain discharge means having a suction port equally formed in the widthwise direction of another side of the cleaning chamber of the cleaning portion and the vapor chamber of the drying portion to discharge the air curtain sucked through the suction port; temperature detection means for detecting the temperature of a cleaning solution of the cleaning portion and/or the temperature of vapor in the drying portion; and air conditioning filter supply pressure changing means for changing the pressure of air to be supplied from the first air conditioning filter in accordance with the temperature detected by the temperature detection means.

A semiconductor cleaning apparatus according to a twelfth aspect of the present invention comprises: air curtain blowing means having a blowing out port formed above the cleaning chamber of the cleaning portion and a vapor chamber of the drying portion along one side of the chamber and arranged to blow out, in the horizontal direction, an air curtain, which is equal in the widthwise direction, from the blowing out port toward another side of the chamber; air curtain discharge means having a suction port equally formed in the widthwise direction of another side of the cleaning chamber of the cleaning portion and the vapor chamber of the drying portion to discharge the air curtain sucked through the suction port; a second heat exchanger for cooling air blown out from the air curtain blowing means; and a second refrigerator for supplying a cooling medium to the second heat exchanger, wherein air cooled in the second heat exchanger and upflows of natural convections of vapor generated in a cleaning chamber of the cleaning portion or a vapor chamber of the drying portion are made conflict with each other at a position adjacent to the top end of the cleaning chamber or the vapor chamber to condense steam in cooled air and generate water mist.

A semiconductor cleaning apparatus according to a thirteenth aspect of the present invention comprises: air curtain blowing means having a blowing out port formed above the cleaning chamber of the cleaning portion and a vapor chamber of the drying portion along one side of the chamber and arranged to blow out, in the horizontal direction, an air curtain, which is equal in the widthwise direction, from the blowing out port toward another side of the chamber; air curtain discharge means having a suction port equally formed in the widthwise direction of another side of the cleaning chamber of the cleaning portion and the vapor chamber of the drying portion to discharge the air curtain sucked through the suction port; and a double-fluid nozzle, which sprays pure water while using clear air or inactive gas as a second fluid, to generate pure-water mist to be mixed into the air curtain blown out from the air curtain blowing means.

A semiconductor cleaning apparatus according to a fourteenth aspect of the present invention comprises: a second air conditioning filter for supplying clean air to the conveyance portion; and a second discharge portion for discharging air from the conveyance portion.

A semiconductor cleaning apparatus according to a fifteenth aspect of the present invention comprises: a gas supply portion which supplies gaseous fluid into the conveyance portion through a gap between any one of the cleaning portion, the water cleaning portion or the drying portion and the conveyance portion to make the pressure in the conveyance portion to be positive; and a fourth discharge portion for discharging a portion of the gas supplied from the gas supply portion from the lower portion of the conveyance portion.

A semiconductor cleaning apparatus according to a sixteenth aspect of the present invention comprises: a fifth discharge portion for discharging air from the end of the locus of the conveyance portion.

A semiconductor cleaning apparatus according to a seventeenth aspect of the present invention comprises: an outer wall of the cleaning apparatus for covering each of the portions; and a sixth discharge portion for discharging air between any one of the cleaning portion, the water cleaning portion and the drying portion and the outer wall.

A semiconductor cleaning apparatus according to an eighteenth aspect of the present invention comprises: a sealed chamber for sealing the cleaning portion, the water cleaning portion, the drying portion and the conveyance portion; and a window structure for injecting-/ejecting the wafer ejected from the product cassette in the shifting portion to and from the sealed chamber.

A semiconductor cleaning apparatus according to a nineteenth aspect of the present invention comprises: a first air conditioning filter for supplying clean air to the cleaning portion, the water cleaning portion and the drying portion; a first discharge portion disposed in the vicinity of each chamber of the cleaning portion, the water cleaning portion and the drying portion; and a demistor connected to the first discharge portion and arranged to remove chemical mist and dried vapor mixed into discharged air.

A wafer cassette according to the present invention is a cleaning wafer cassette for accommodating a plurality of wafers to immerse them into each solution chamber of a cleaning apparatus, the wafer cassette comprising: an accommodating portion for accommodating a plurality of wafers; and a handle portion formed at a position higher than the liquid level in the solution chamber when the cleaning wafer cassette is set in each of the solution chambers.

DESCRIPTION OF THE PREFERRED EMBODIMENTS

Preferred embodiments of the present invention will now be described with reference to the drawings.

First Embodiment

Figure 1:
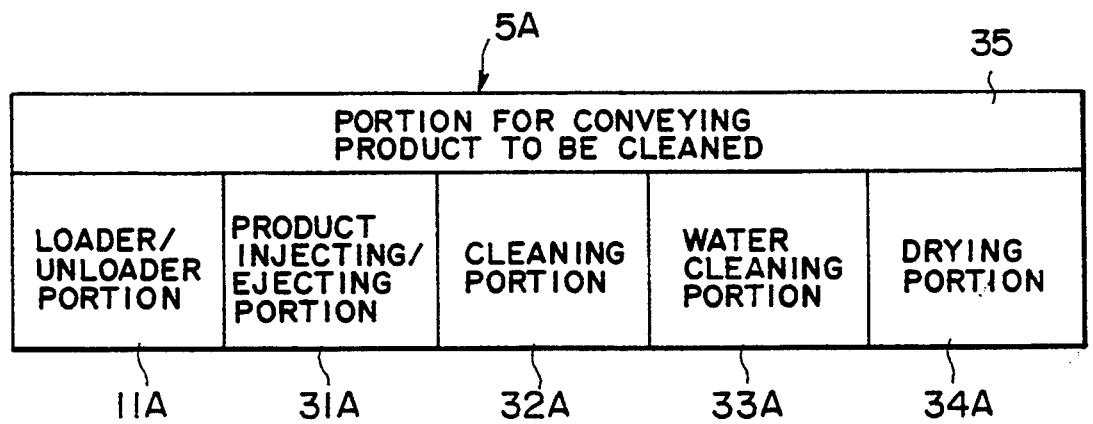
FIG. 1 is a block diagram which illustrates the overall structure of a cleaning apparatus according to a first embodiment of the present invention.
Figure 2:
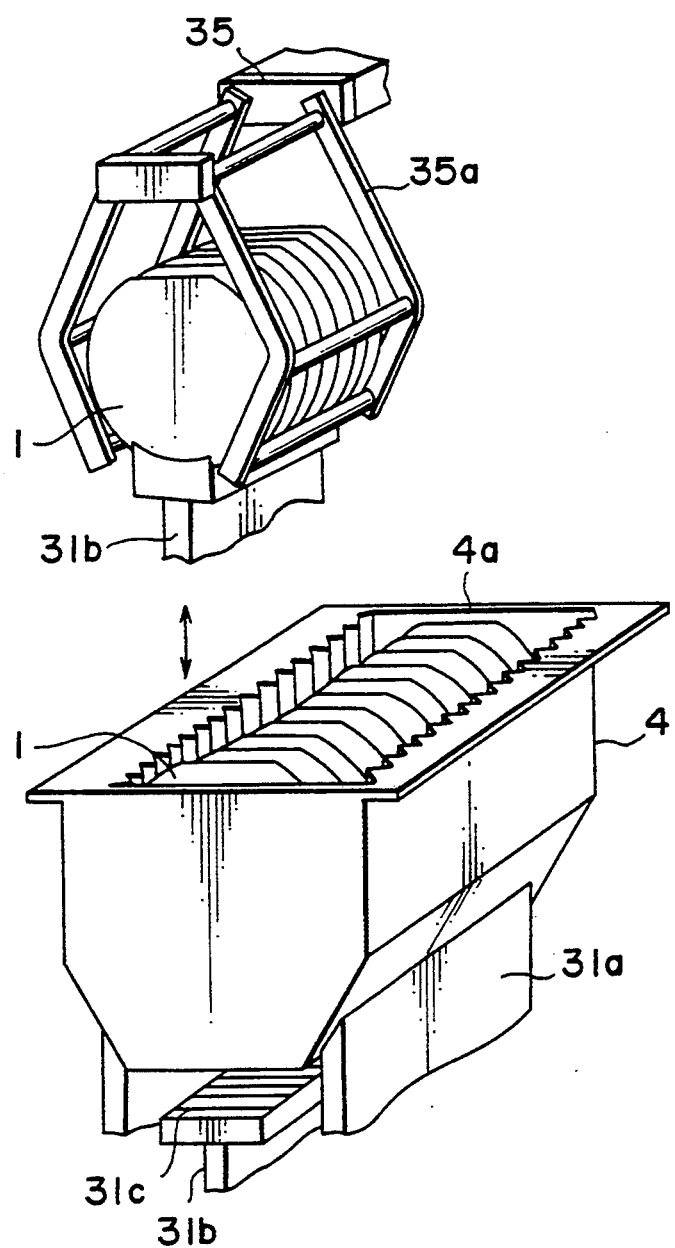
FIG. 2 is a perspective view which illustrates the structure of a product injecting/ejecting portion according to the first embodiment of the present invention.

FIG. 1 schematically illustrates the structure of a semiconductor cleaning apparatus 5A according to a first embodiment of the present invention. In the longitudinal direction of a portion 35 for conveying products to be cleaned, the following elements are sequentially disposed: a loader/unloader portion 11A; a product injecting/ejecting portion 31A; a cleaning portion 32A; a water cleaning portion 33A; and a drying portion 34A. As shown in FIG. 2, the product injecting/ejecting portion 31A has a support frame 31a for supporting a product cassette 4 and a wafer injecting/ejecting jig 31b capable of moving vertically. The product cassette 4 has a plurality of grooves 4a for holding the wafers 1 and having an opened lower portion. The structure is so arranged that the wafer injecting/ejecting jig 31b of the product injecting/ejecting portion 31A can be vertically injected/ejected through the opening portion. The wafer injecting/ejecting jig 31b has, on the upper surface thereof, a plurality of grooves 31c for holding the wafers 1.

Figure 3:
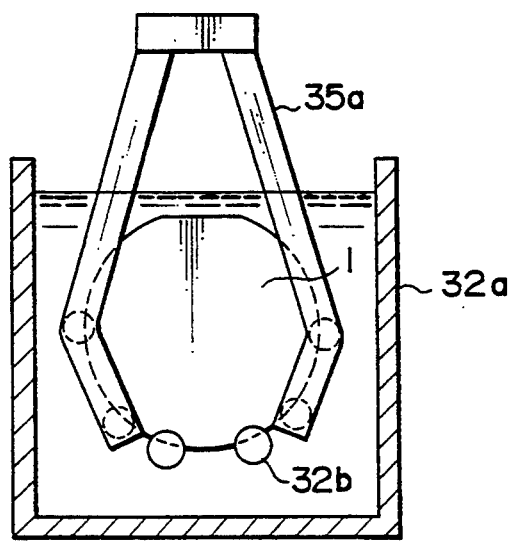
FIGS. 3 and 4 respectively are cross sectional views which illustrate a cleaning chamber and a drying chamber according to the first embodiment of the present invention.

The structure of the cleaning portion 32A is shown in FIG. 3. A cleaning chamber 32a includes a wafer receiver 32b formed therein. The wafer receiver 32b has a plurality of grooves (omitted from illustration) formed therein, the grooves being arranged to receive the edges of the inserted wafers 1 so that the wafers 1 are held. Also the water cleaning portion 33A has a structure similar to that of the cleaning portion 32A shown in FIG. 3.

Figure 4:
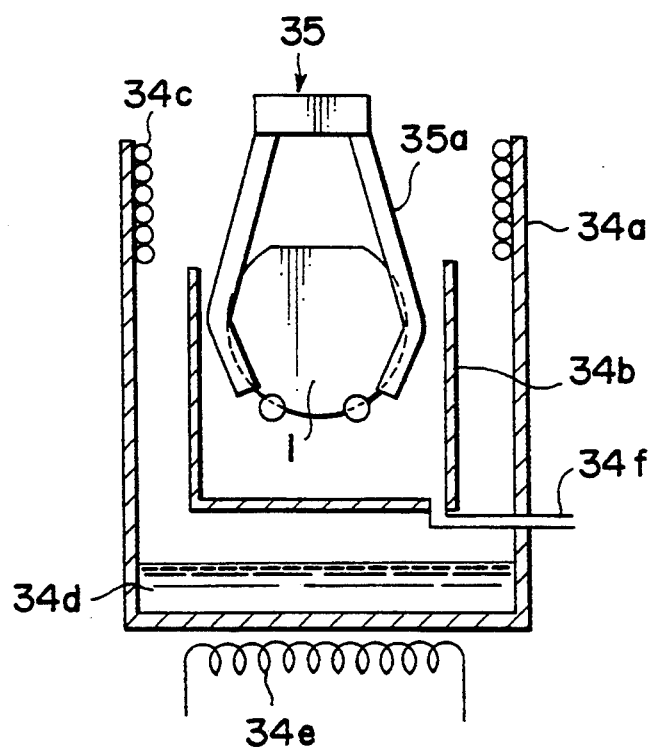

The structure of the drying portion 34A is shown in FIG. 4. A drying chamber 34a includes an isopropylalcohol (hereinafter called "IPA") recovery chamber 34b so that a double structure is formed. A condensing coil 34c is disposed along the inner wall of the upper portion of the drying chamber 34a, while a heater 34e for heating and evaporating the IPA 34d accommodated in the drying chamber 34a is disposed under the drying chamber 34a. Further, a discharge pipe 34f for discharging the IPA recovered into the IPA recovery chamber 34b is connected to the IPA recovery chamber 34b.

The operation of the first embodiment will now be described. First, the product cassette 4 accommodating the plural wafers 1, which have not been cleaned, is injected into the loader/unloader portion 11a. The product cassette 4 is moved to the product injecting-/ejecting portion 31A by a conveyance robot (omitted from illustration), and then the product cassette 4 is placed on the support frame 31a as shown in FIG. 2. When the wafer injecting/ejecting jig 31b is, in this state, moved upwards, the edge of each wafer 1 is inserted into the groove 31c of the wafer injecting/ejecting jig 31b. As a result, the plural wafers 1 are held, and the wafers 1 are pushed upwards from the product cassette 4. Then, the plural wafers 1 are held by a wafer hand 35a of the portion 35 for conveying the products to be cleaned to be moved from the product injecting/producing portion 31A to the cleaning portion 32A. Then, the plural wafers 1 are sent to the wafer receiver 32b in the cleaning chamber 32a shown in FIG. 3. After the wafers 1 have been cleaned in the cleaning portion 32A, the wafers 1 are, by the wafer hand 35a, sent from the cleaning portion 32A to the wafer receiver of the water cleaning portion 33A to be cleaned with water in the water cleaning portion 33A.

Then, the wafers 1 are sent from the water cleaning portion 33A to the drying portion 34A in such a manner that the IPA 34d accommodated in the bottom portion of the drying chamber 34a is previously heated and evaporated by the heater 34e shown in FIG. 4 and a refrigerant is supplied into the condensing coil 34c to previously cool the atmosphere of the upper portion of the drying chamber 34a. As a result, the vapor of the IPA 34d raised from the bottom portion of the drying chamber 34a is cooled and condensed in a portion adjacent to the condensing coil 34c and, accordingly, the IPA 34d is returned to the bottom portion of the drying chamber 34a. As described above, divergence of the IPA 34d to the outside of the drying chamber 34a is prevented, but the drying chamber 34a is filled with the evaporated IPA 34d.

Then, the wafers 1, which have been cleaned with water in the water cleaning portion 33A, and on the surface of which water is left, are held in the recovery chamber 34 while being held by the wafer hand 35a. As a result, the vapor of the IPA 34d, which is in contact with the surface of the wafer 1, is cooled and liquefied by the wafer 1 to be mixed with water left on the surface of the wafer 1. As a result, water droplets on the surface of the wafer 1 are gradually enlarged because the water droplets contain a large quantity of IPA, and then moved downwards along the surface of the wafer 1 until the water droplets drop into the recovery chamber 34b. At this time, foreign matter adhered to the surface of the wafer 1 drops together with the water droplets. The water droplets dropped into the recovery chamber 34b pass through a discharge pipe 34f to be discharged to the outside of the drying chamber 34a. Thus, water on the surface of the wafer 1 is gradually replaced by the IPA. The temperature of the surface of the wafer 1 is gradually raised until it is the same as that of vapor of the IPA 34d. Therefore, the IPA adhered to the surface of the wafer 1 in place of water is evaporated.

After drying has been completed, the portion 35 for conveying the products to be cleaned moves the wafers 1 from the drying portion 34A to the producing injecting/ejecting portion 31A by the wafer hand 35a thereof so that the wafers 1 are inserted into the product cassette 4 placed on the support frame 31a. Then, the product cassette 4 is discharged to the loader/unloader portion 11A by a conveyance robot (omitted from illustration).

When the wafers 1 are cleaned with water in the water cleaning portion 33A, the wafer hand 35a is also cleaned with water in the water cleaning chamber. When the wafers 1 are cleaned in the cleaning portion 32A, the wafer hand 35a may simultaneously be cleaned. However, cleaning of the wafer hand 35a may be omitted.

Since the foregoing first embodiment is so arranged that no cleaning cassette is used at the time of cleaning, water cleaning and drying the wafers, the width of each of the cleaning portion 32A, the water cleaning portion 33A and the drying portion 34A can be shortened by about 15% as compared with the widths of the corresponding portions of the conventional structure. Further, the cleaning cassette standby portion of the conventional semiconductor cleaning apparatus can be omitted, so that the overall length of the cleaning apparatus can be shortened by about 30%.

Second Embodiment

Figure 5:
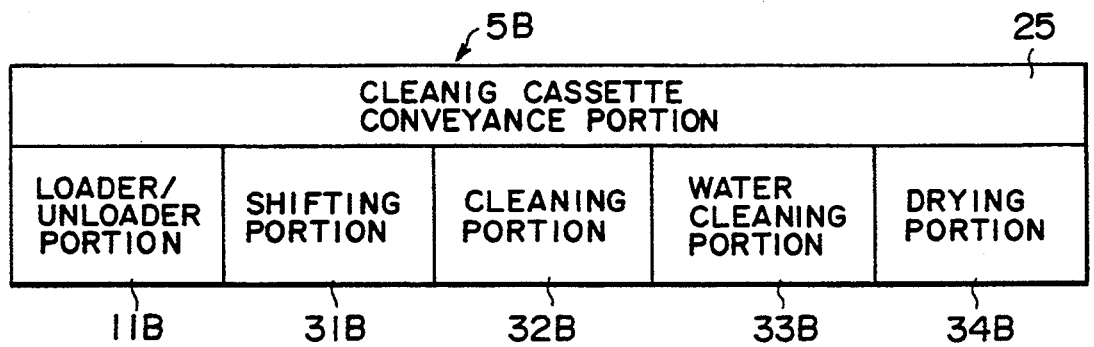
FIG. 5 is a block diagram which illustrates the overall structure of a cleaning apparatus according to a second embodiment of the present invention.
Figure 6:
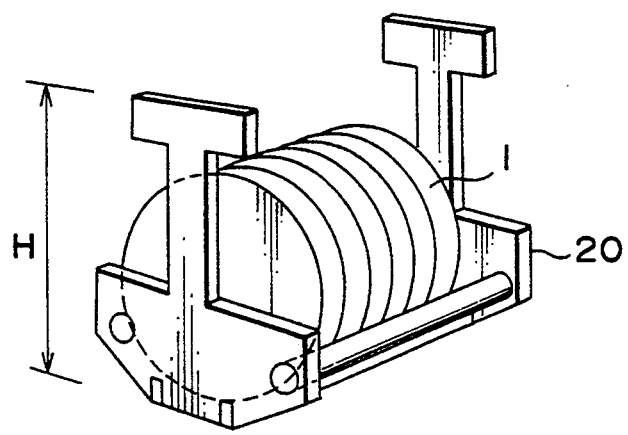
FIG. 6 is a perspective view which illustrates a wafer cassette for use in the second embodiment.

The structure of a cassette-type semiconductor cleaning apparatus 5B according to a second embodiment of the present invention is shown in FIG. 5. In the longitudinal direction of a cleaning cassette conveyance portion 25, the following elements are sequentially disposed: a loader/unloader portion 11B; a shifting portion 31B; a cleaning portion 32B; a water cleaning portion 33B; and a drying portion 34B. In contrast with the first embodiment in which the cassette-less cleaning apparatus is structured in which the wafer 1 is directly held and conveyed by the wafer hand 35a, the second embodiment is arranged in such a manner that a cleaning cassette 20 structured as shown in FIG. 6 is used to enable the wafer 1 to be set in the cleaning chamber and the water cleaning chamber without wetting the chuck of the cassette hand with the cleaning solution and cleaning water.

Figure 7:
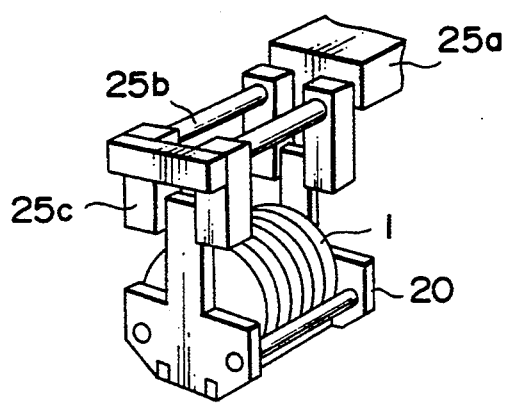
FIG. 7 is a perspective view which illustrates a state where the wafer cassette shown in FIG. 6 is held by a cassette hand.

The cleaning cassette 20 has height H which is sufficiently higher than the height, that is, the diameter of the wafer 1 to be accommodated in the cleaning cassette 20. The plural wafers 1 are, in the shifting portion 31B, shifted from the product cassette to the cleaning cassette 20, and then the wafers 1 are, as shown in FIG. 7, held by the cassette hand of the cleaning cassette conveyance portion 25 to be sequentially moved to the cleaning portion 32B, the water cleaning portion 33B and the drying portion 34B.

Figure 8:
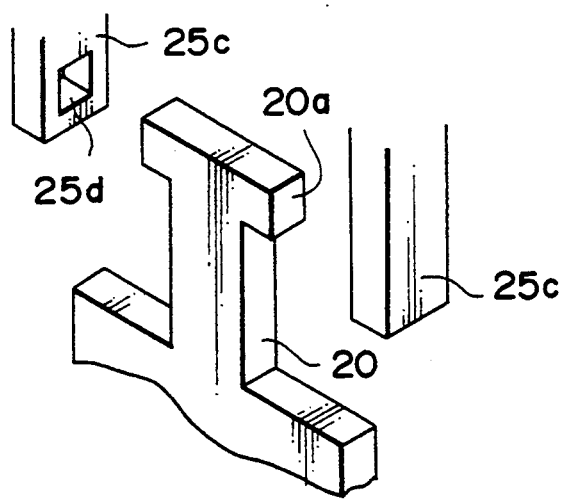
FIG. 8 is an enlarged view which illustrates an essential portion of FIG. 7.

The cassette hand of the cleaning cassette conveyance portion 25 comprises a chuck support arm 25b connected to a movable arm 25a, and a chuck 25c supported by the chuck support arm 25b. As shown in FIG. 8, the chuck 25c has recesses 25d formed therein and accordingly, insertion of handles 20a of the cleaning cassette 20 into the recesses 25d causes the cleaning cassette 20 to be held by the cassette hand.

Figure 9:
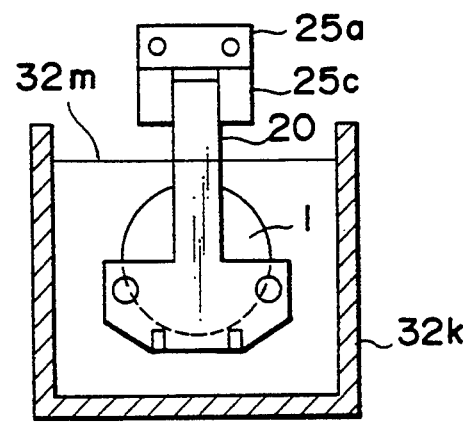
FIGS. 9 and 10 respectively are cross sectional views which illustrate states where the wafer cassette shown in FIG. 6 is set in a cleaning chamber and a drying chamber.

Since the cleaning cassette 20 has the height H, which is sufficiently higher than the wafer 1, the handles 20a disposed at the top end of the cleaning cassette 20 are positioned higher than the liquid level of a cleaning solution 32m as shown in FIG. 9 when the cleaning cassette 20 is, by making use of the cassette hand of the cleaning cassette conveyance portion 25, set in a cleaning chamber 32k of the cleaning portion 32B to completely immerse the wafer 1 in the cleaning solution 32m. Therefore, the chuck 25c of the cassette hand for holding the handles 20a of the cleaning cassette 20 is not wetted with the cleaning solution 32m. When the cleaning cassette 20 is similarly set in the water cleaning portion 33B, wetting of the chuck 25c with cleaning water can be prevented although the wafer 1 is completely immersed in the cleaning water.

Figure 10:
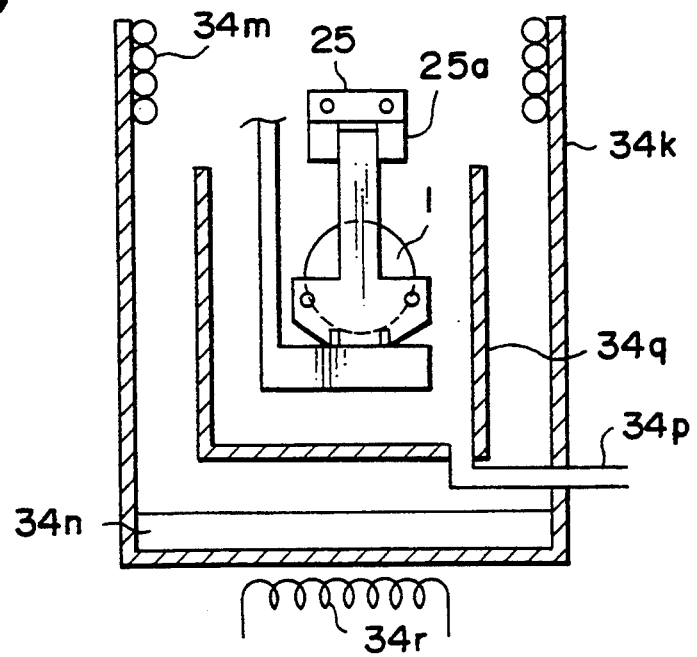

After the water cleaning process has been completed, the wafer 1 is, together with the cleaning cassette 20, dried in the drying portion 34B as shown in FIG. 10. The drying portion 34B has the double structure composed of a drying chamber 34k and an IPA recovery chamber 34q similarly to the drying portion 34A shown in FIG. 4. Further, a condensing coil 34m is disposed along the inner wall of the upper portion of the drying chamber 34k, while a heater 34r for heating accommodated IPA 34n is disposed under the drying chamber 34k. Further, a discharge pipe for discharging the IPA accommodated in the IPA recovery chamber 34q is connected to the IPA recovery chamber 34q.

Since this embodiment is so arranged that chuck 25c of the cassette hand is not wetted with the cleaning solution 32m or cleaning water as described above, the chuck 25 can be used as it is to take out the dried cleaning cassette 20 of the drying portion 34B. That is, an exclusive hand cleaning portion for cleaning and drying the cassette hand can be omitted from the structure, resulting in a small-size cleaning apparatus.

Third Embodiment

Figure 11:
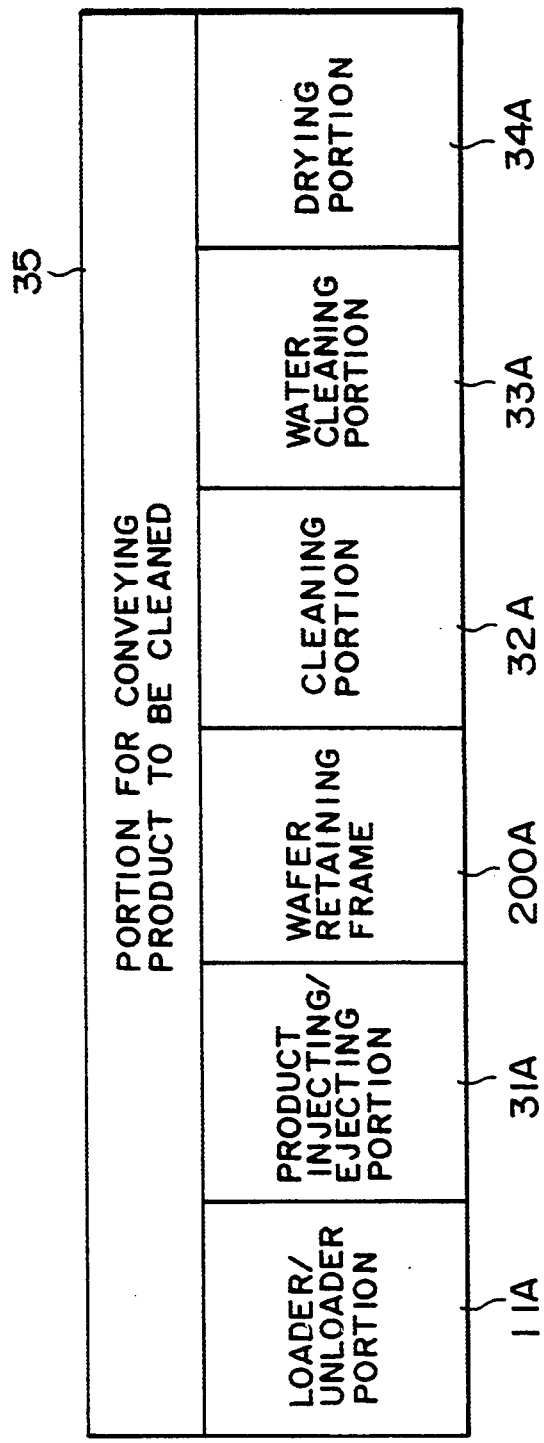
FIGS. 11 and 12 respectively are block diagrams which illustrate the overall structure of a cleaning apparatus according to a third embodiment and a fourth embodiment.

FIG. 11 illustrates the structure of a semiconductor cleaning apparatus according to a third embodiment. In the longitudinal direction of a cleaning product conveyance portion 35, the following elements are sequentially disposed: a loader/unloader portion 11A, a product injecting/ejecting portion 31A; a wafer retaining frame 200A; a cleaning portion 32A; a water cleaning portion 33A; and a drying portion 34A. The cleaning product conveyance portion 35 sequentially conveys the wafer in an order as: the product injecting/ejecting portion 31A; the cleaning portion 32A; the water cleaning portion 33A; and the drying portion 34A. In order to sequentially perform the conveyance, the portion which then receives the wafer must have no wafer. That is, the wafer can be conveyed only in a case where at least any one of the product injecting/ejecting portion 31A, the cleaning portion 32A and the drying portion 34A has no wafer.

However, the process to be performed in the cleaning portion 32A is so arranged that the processing time is strictly controlled and has no arrangement that the state of empty in the ensuing water cleaning portion 33A is confirmed to commence the cleaning process in order to improve the processing performance. Accordingly, the third embodiment comprises the wafer retaining frame 200A to overcome a problem raised in that the wafers cannot be conveyed sequentially for some reason or other, such as trouble in the product injecting-/ejecting portion 31A or the drying portion 34A. If the wafers cannot be conveyed sequentially, the wafer set in the water cleaning portion 33A is first laid aside on to the wafer retaining frame 200A, and then the wafer subjected to the cleaning process in the cleaning portion 32A is sent to the water cleaning portion.

If the wafer retaining frame 200A is provided with a water cleaning function, the wafer immersed in the cleaning solution can be directly laid aside from the cleaning portion 32A to the wafer retaining frame 200A in an abnormal case in which the wafers cannot be conveyed sequentially. The water cleaning function may be realized by, for example, a structure in which pure water is sprayed against the wafer or a structure in which the wafer is immersed in the water cleaning chamber arranged similarly to the water cleaning portion 33A. By providing the water cleaning function as described above, the wafer to which the cleaning solution adheres can be, on the wafer retaining frame, cleaned with water. As a result, continuation of the cleaning process can be prevented.

Fourth Embodiment

Figure 12:
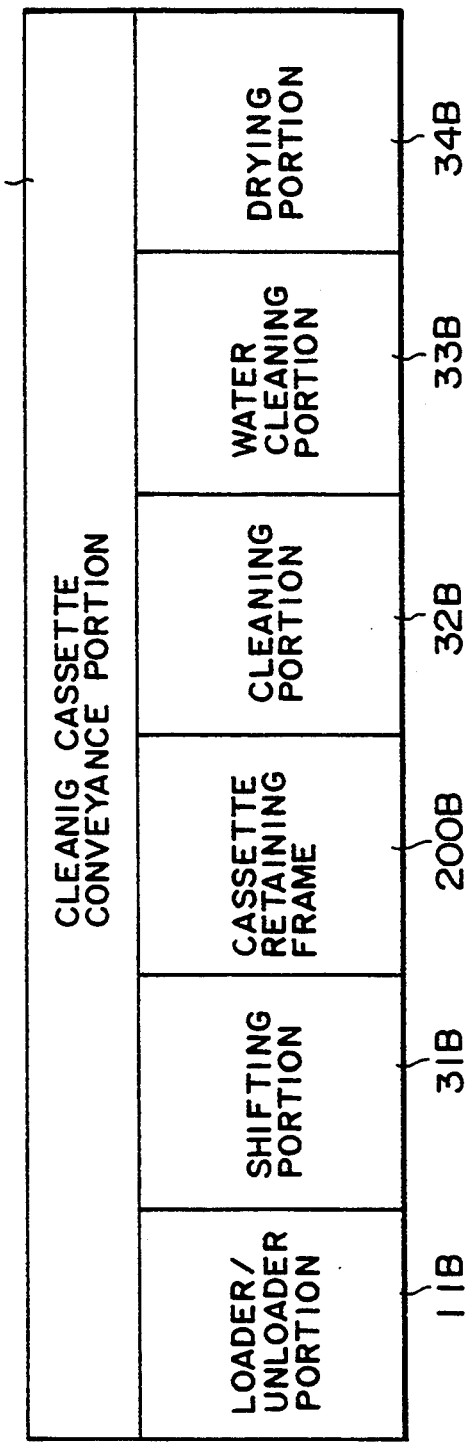

A cassette-type cleaning apparatus having a cassette retaining frame 200B similarly to the third embodiment is shown in FIG. 12. If trouble has occurred in a shifting portion 31B or a drying portion 34B or the like so that the wafers cannot sequentially be conveyed, the cleaning cassette set in the water cleaning portion 33B is laid aside on to the cassette retaining frame 200B, and then the wafer subjected to the cleaning process in the cleaning portion 32B is, together with the cleaning cassette, conveyed to the water cleaning portion 33B.

If the cassette retaining frame 200B is provided with a water cleaning function, the wafer immersed in the cleaning solution can be directly laid aside from the cleaning portion 32B to the wafer retaining frame 200B in an abnormal case in which the wafers cannot be conveyed sequentially.

Fifth Embodiment

Figure 13:
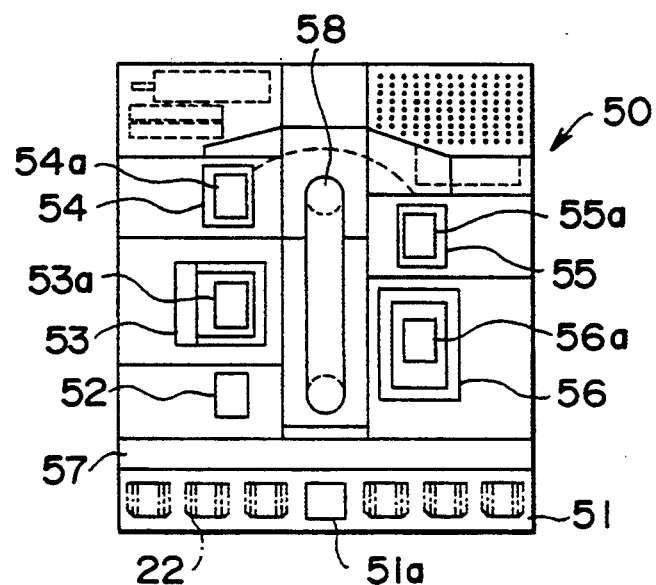
FIGS. 13 and 14 respectively are a plan view and a front elevational view which illustrate a cleaning apparatus according to a fifth embodiment.

The overall structure of a cleaning apparatus so arranged that the wafer 1 is, by handling, cleaned, according to a fifth embodiment is shown in FIG. 13. The cleaning apparatus comprises a main processing portion 50 for performing the steps of the cleaning process and a loader/unloader portion 51. A conveyance portion 58 is disposed in the central portion of the main processing portion 50 in the longitudinal direction of the cleaning apparatus. The conveyance portion 58 is provided with a conveyance robot having a movement shaft in the longitudinal direction of the cleaning apparatus and a rotational shaft for rotating a wafer hand. The structure of the robot is shown in detail in FIGS. 38 and 39, to be described below. On the two sides of the conveyance portion 58, a wafer retaining frame 52, a cleaning chamber 53a of the cleaning portion 53, water cleaning chambers 54a and 55a of the water cleaning portions 54 and 55 and a drying chamber 56a of the drying portion 56 are disposed in the longitudinal direction of the cleaning apparatus to form two lines. Examples of the structure of the cleaning chamber 53a and the water cleaning chambers 54a and 55a are described below with respect to FIGS. 33 and 34. A loader/unloader portion 51 is disposed at an end portion of the conveyance portion in a direction of the width of the cleaning apparatus to have a long distance, the loader/unloader portion 51 having six product cassette retaining frames and one wafer retaining frame so that six product cassettes and a batch of wafers 1 taken out of the product cassette can be placed in the loader/unloader portion 51. Further, a robot 57 for shifting the wafers 1 between the product cassette 22 placed in the loader/unloader portion 51 and the wafer retaining frame 51a is disposed adjacent to the loader/unloader portion 51.

Figure 14:
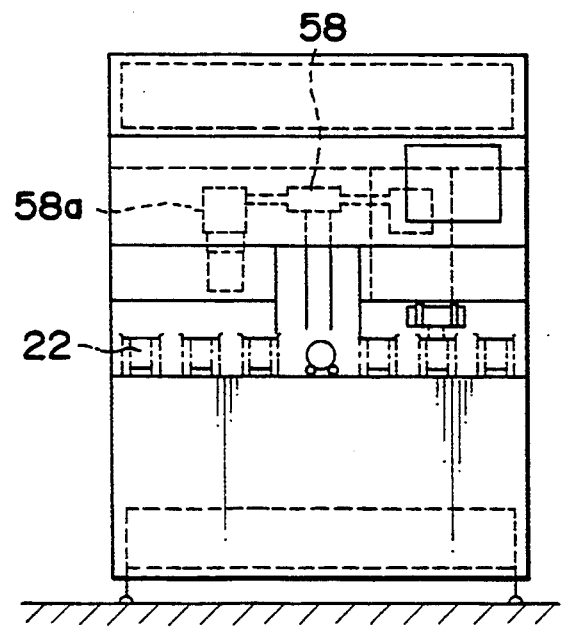

FIG. 14 is a front elevational view which illustrates the cleaning apparatus and in which reference numeral 58a represents a wafer hand of the conveyance portion 58.

The operation of the cleaning apparatus according to the fifth embodiment will now be described. The product cassette 22 accommodating the wafer 1 is placed in the product cassette retaining frame of the loader/unloader portion 51. The robot 57 takes out the wafer 1 from the product cassette 22 to shift the wafer 1 to the wafer retaining frame 51a. The wafer 1 thus-shifted is held by the wafer hand 58a of the conveyance portion 58 to be shifted to the wafer retaining frame 55 in which the wafer 1 is on standby. Then, the conveyance portion 58 sets the wafer 1 into the cleaning chamber 53a of the cleaning portion 53. After the wafer 1 has been subjected to a predetermined cleaning process, the conveyance portion 58 sets the wafer 1 into the water cleaning chamber 54a of the water cleaning portion 54. After a predetermined water cleaning process has been completed, the conveyance portion 58 sends the wafer 1 into the water cleaning chamber 55a of the water cleaning portion 55 to clean the wafer 1 with water. By sequentially performing the water cleaning processes in the two water cleaning chambers 54a and 55a, the time required to complete the water cleaning process can be shortened and an assured water cleaning effect can be expected.

The conveyance portion 58 sets the wafer 1 subjected to the water cleaning process into the drying chamber 56a of the drying portion 56 to subject the wafer 1 to the drying process. After drying has been completed, the conveyance portion 58 takes out the wafer from the drying chamber 56a to shift the wafer 1 on to the wafer retaining frame 51 of the loader/unloader portion 51. The robot 57 holds the wafer 1 placed on the wafer retaining frame 51a to shift the wafer 1 to an empty product cassette placed on the product cassette retaining frame.

Although the fifth embodiment is arranged as a cassette-less cleaning apparatus for directly handling the wafer 1, disposition of a wafer cassette retaining frame in place of each of the wafer retaining frames 51a and 52 and use of a cassette hand in place of the wafer hand in the conveyance portion 58 enables a cassette-type cleaning apparatus to have a similar layout. In this case, as shown in FIG. 14, the conveyance portion 58 transports a cleaning cassette 21 having handles inside the main processing portion 50 as the wafers in the cleaning cassette 21 are cleaned.

Sixth Embodiment

Figure 15:
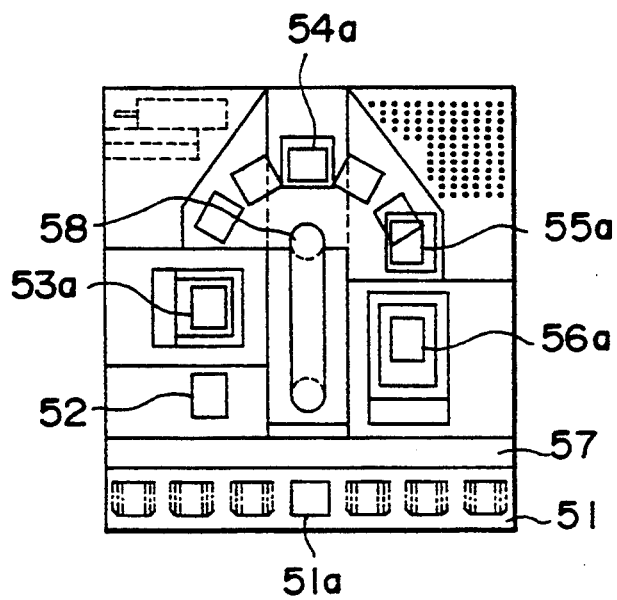
FIGS. 15 to 17 respectively are plan views which illustrate cleaning apparatuses according to sixth to eighth embodiments.

FIG. 15 illustrates the overall structure of a cleaning apparatus according to a sixth embodiment. A wafer retaining frame 52 and a cleaning chamber 53a are disposed on one side of a conveyance portion 58. Further, a second water cleaning chamber 55a and a drying chamber 56a are disposed on the residual side of the conveyance portion 58. In addition, a first water cleaning chamber 54a is disposed on the locus of rotation of the wafer hand of the conveyance portion 58. By disposing one of the plural units forming the cleaning apparatus on the locus of the rotation of the wafer hand of the conveyance portion 58 as described above, a small-size cleaning apparatus having the same number of units as that of the cleaning apparatus according to the fifth embodiment shown in FIGS. 13 and 14 can be realized.

Also in the sixth embodiment, disposition of the wafer cassette retaining frame in place of each of the wafer retaining frames 51a and 52 and use of the cassette hand in place of the wafer hand in the conveyance portion 58 enable a cassette-type cleaning apparatus to be formed to have a similar layout.

Seventh Embodiment

Figure 16:
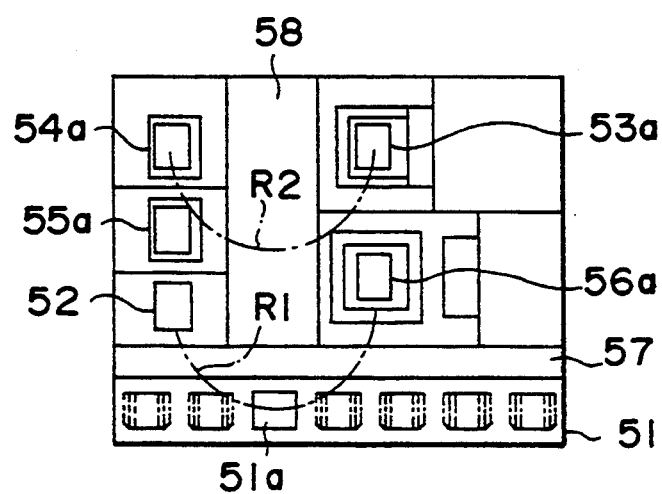

FIG. 16 illustrates the overall structure of a cleaning apparatus according to a seventh embodiment. A wafer retaining frame 52, a second water cleaning chamber 55a and a first water cleaning chamber 54a are disposed on one side of a conveyance portion 58. Further, a cleaning chamber 53a and a drying chamber 56a are disposed on the residual side of the conveyance portion 58. The conveyance portion 58 has a semicircular locus R1 of rotation of a wafer hand passing through a wafer retaining frame 51a of a loader/unloader portion 51 and a semicircular locus R2 of rotation of the wafer hand passing through the cleaning chamber 53a and the first water cleaning chamber 54a and facing the loader/unloader portion 51.

Since the rotation loci R1 and R2 of the wafer hand of the conveyance portion 58 are set to face the loader/unloader portion 51, a small-size cleaning apparatus can be realized.

Also in the seventh embodiment, disposition of the wafer cassette retaining frame in place of each of the wafer retaining frames 51a and 52 and use of the cassette hand in place of the wafer hand in the conveyance portion 58 enable a cassette-type cleaning apparatus to be formed to have a similar layout.

Eighth Embodiment

Figure 17:
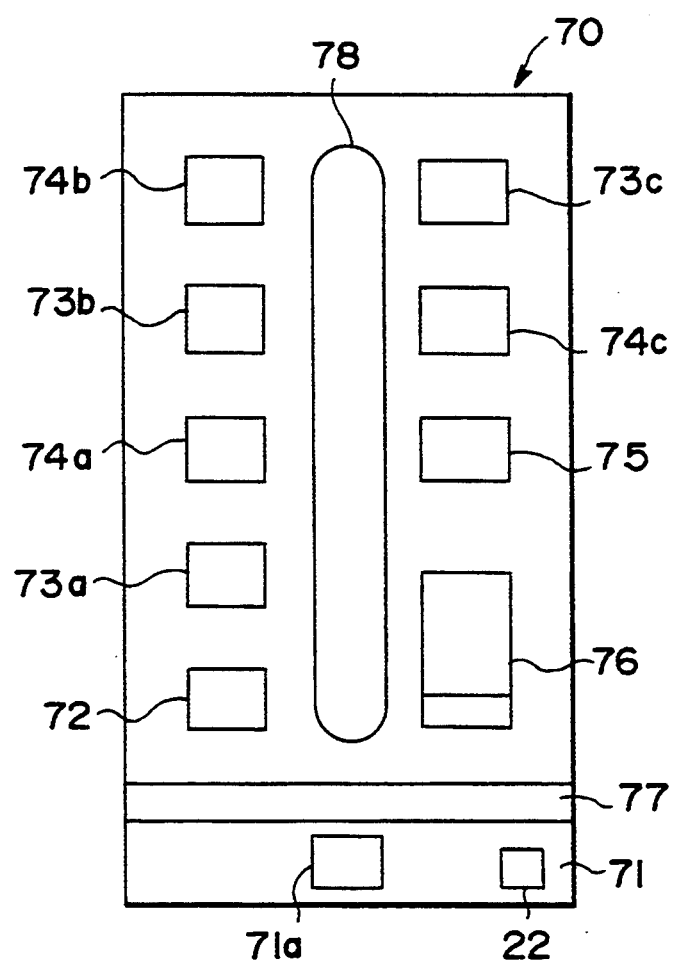

FIG. 17 illustrates the overall structure of a cleaning apparatus according to an eighth embodiment. The cleaning apparatus according to this embodiment uses three chemical solutions to clean the wafer 1. On the two sides of a conveyance portion 78 of a main processing portion 70, a wafer retaining frame 72, a first cleaning chamber 73a, a first water cleaning chamber 74a, a second cleaning chamber 73b, a second water cleaning chamber 74b, a third cleaning chamber 73c, a third water cleaning chamber 74c, a water cleaning chamber 75 and a drying chamber 76 are disposed in the longitudinal direction of the cleaning apparatus to form two lines. Further, a shifting robot 77 is disposed in an end portion of the conveyance portion 78, and a loader/unloader portion 71 is disposed adjacent to the shifting robot 77. The first to third cleaning chambers 73a to 73c respectively accommodate different chemical solutions.

The operation of the eighth embodiment will now be described. A product cassette 22 accommodating the wafer 1 is placed on a product retaining frame of the loader/unloader portion 71. The shifting robot 77 takes out the wafer 1 of the product cassette 22 to shift the wafer 1 to the wafer retaining frame 71a of the loader/unloader portion 71. The wafer 1 thus-shifted is held by the wafer hand of the conveyance portion 78 to be shifted to the wafer retaining frame 72 in which the wafer 1 is on standby. Then, the conveyance portion 78 sets the wafer 1 into the first cleaning chamber 73a. After the wafer 1 has been subjected to a predetermined cleaning process, the conveyance portion 78 sets the wafer 1 into the first water cleaning chamber 74a. After a predetermined water cleaning process has been completed, the conveyance portion 78 shifts the wafer 1 to the second cleaning chamber 73b to subject the wafer 1 to a predetermined cleaning process. Further, the conveyance portion 78 shifts the wafer 1 to the second water cleaning chamber 74b. Similarly, the wafer 1 is sequentially shifted to the third cleaning chamber 73c and the third water cleaning chamber 74c so that the cleaning processes using the three chemical solutions are sequentially completed.

Then, the conveyance portion 78 takes out the wafer 1 of the third water cleaning chamber 74c to set the wafer 1 into the final water cleaning chamber 75 to perform a predetermined water cleaning process. The conveyance portion 78 sets the wafer cleaned with water in a predetermined manner into the drying chamber 76. Thus, the drying process is performed. After drying has been completed, the conveyance portion 78 takes out the wafer 1 of the drying chamber 76 to shift the wafer 1 on to the wafer retaining frame 71a of the loader/unloader portion 71. The shifting robot 77 holds the wafer 1 placed on the wafer retaining frame 71a to shift the wafer 1 to an empty product cassette placed on the product cassette retaining frame.

Although the description is about a structure in which only wafers 1 of only one lot are present in the cleaning apparatus, wafers 1 of plural lots may be present in the cleaning apparatus and each unit may process the corresponding wafer.

Also in the eighth embodiment, disposition of the wafer cassette retaining frame in place of each of the wafer retaining frames 71a and 72 and use of the cassette hand in place of the wafer hand in the conveyance portion 78 enable a cassette-type cleaning apparatus to be formed to have a similar layout.

Ninth Embodiment

Figure 18:
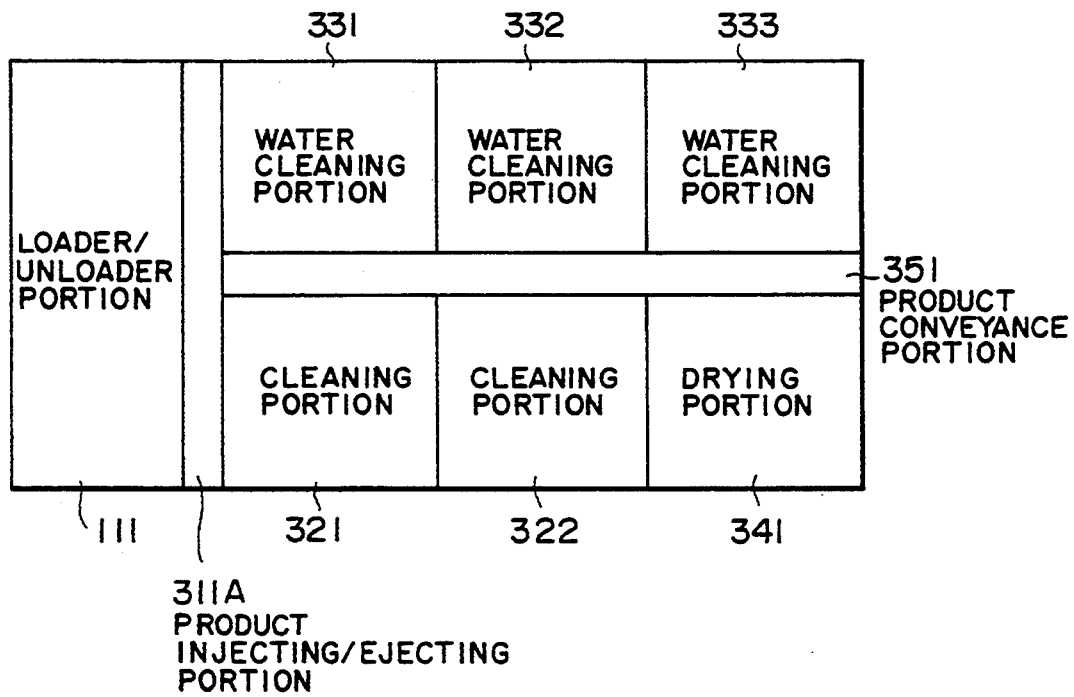
FIG. 18 is a block diagram which illustrates a cleaning apparatus according to a ninth embodiment.

A semiconductor cleaning apparatus according to this embodiment does not need to have the following units along one straight line: the loader/unloader portion 11A; the product injecting/ejecting portion 31A; the cleaning portion 32A; the water cleaning portion 33A and the drying portion 34A. A cleaning apparatus shown in FIG. 18 is, for example, arranged so that a product conveyance portion 351 is connected to a product injecting/ejecting portion 311A disposed in parallel to the loader/unloader portion 111, and the water cleaning portion 331 and the cleaning portion 321 are disposed to face each other while interposing the product conveyance portion 351. Similarly, the water cleaning portion 332 and the cleaning portion 322 are disposed to face each other, and the water cleaning portion 333 and the drying portion 341 are disposed to face each other. As described above, the plural cleaning portions and plural water cleaning portions are sometimes required depending upon the cleaning process. By employing the configuration shown in FIG. 18, the overall length of the semiconductor cleaning apparatus can be shortened. In particular, the disposition is made such that the cleaning portion in which a chemical solution is used and the water cleaning portion in which water cleaning is performed face each other to eliminate an adverse influence of the vapor of the chemical solution generated in the cleaning portion upon the other unit.

Figure 19:
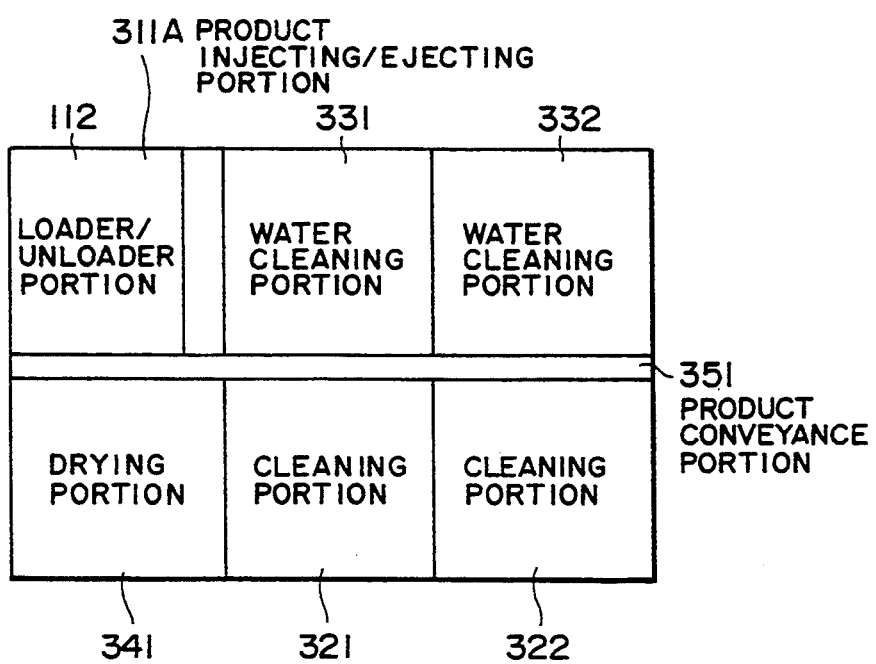
FIGS. 19 to 25 respectively are block diagrams which illustrate modifications of the ninth embodiment.

Another configuration shown in FIG. 19 may be employed in which the loader/unloader portion 112 and the product injecting/ejecting portion 311A face the drying portion 341 while interposing the product conveyance portion 351, the water cleaning portion 331 faces the cleaning portion 321, and the water cleaning portion 332 face the cleaning portion 322. As a result of the configuration thus-made, the overall length of the cleaning apparatus can be shortened.

Figure 20:
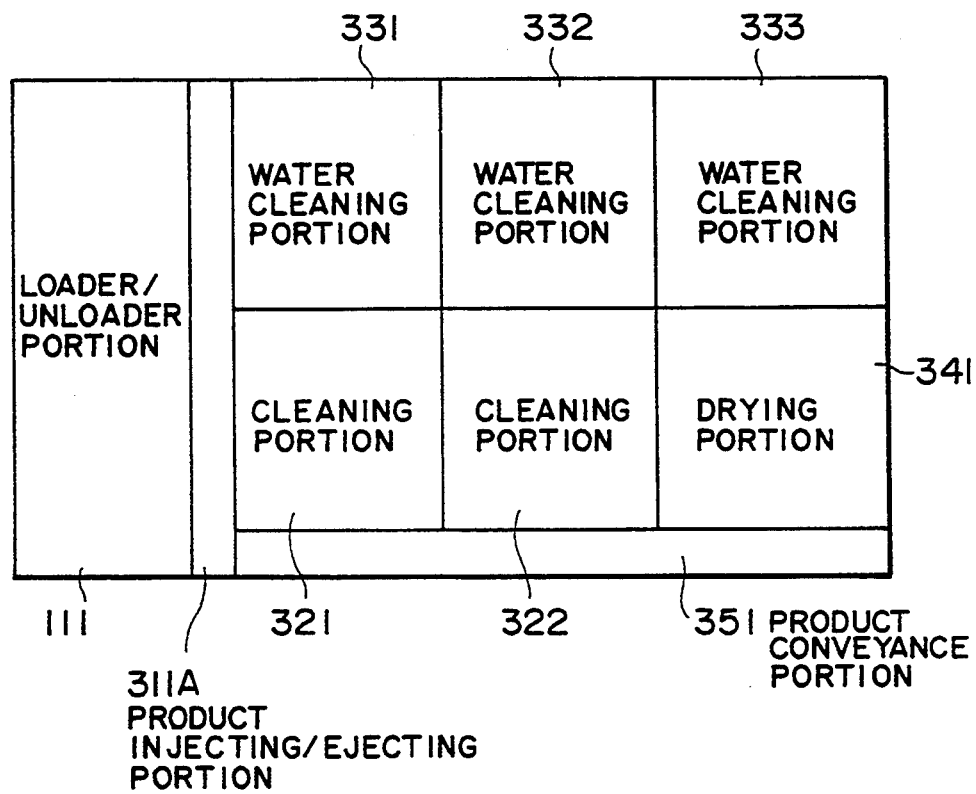
Figure 21:
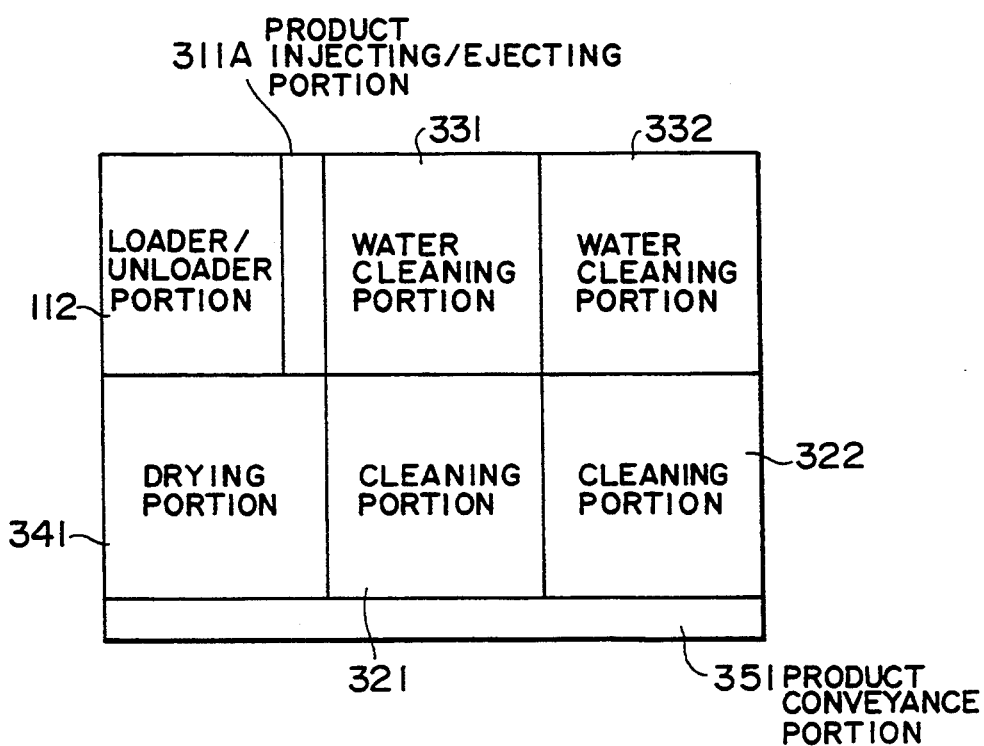
Figure 22:
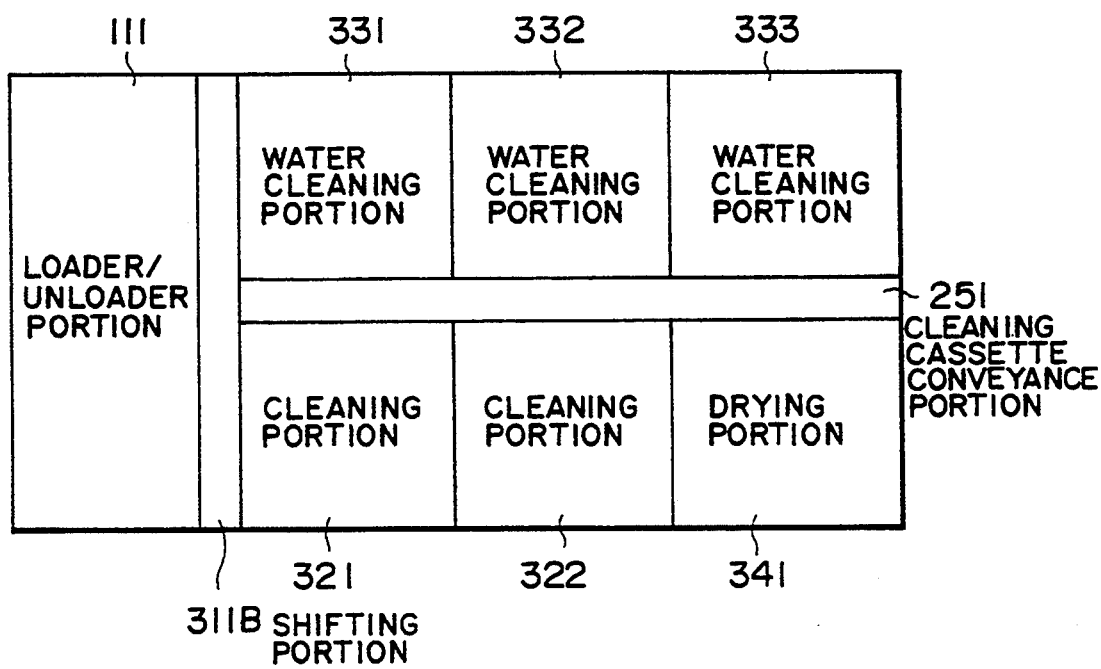
Figure 23:
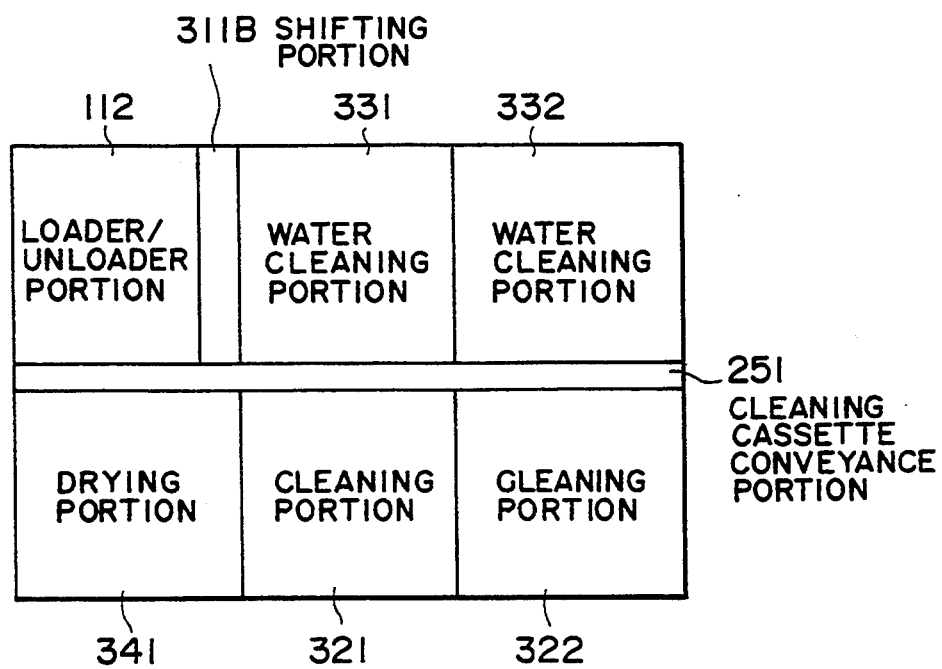
Figure 24:
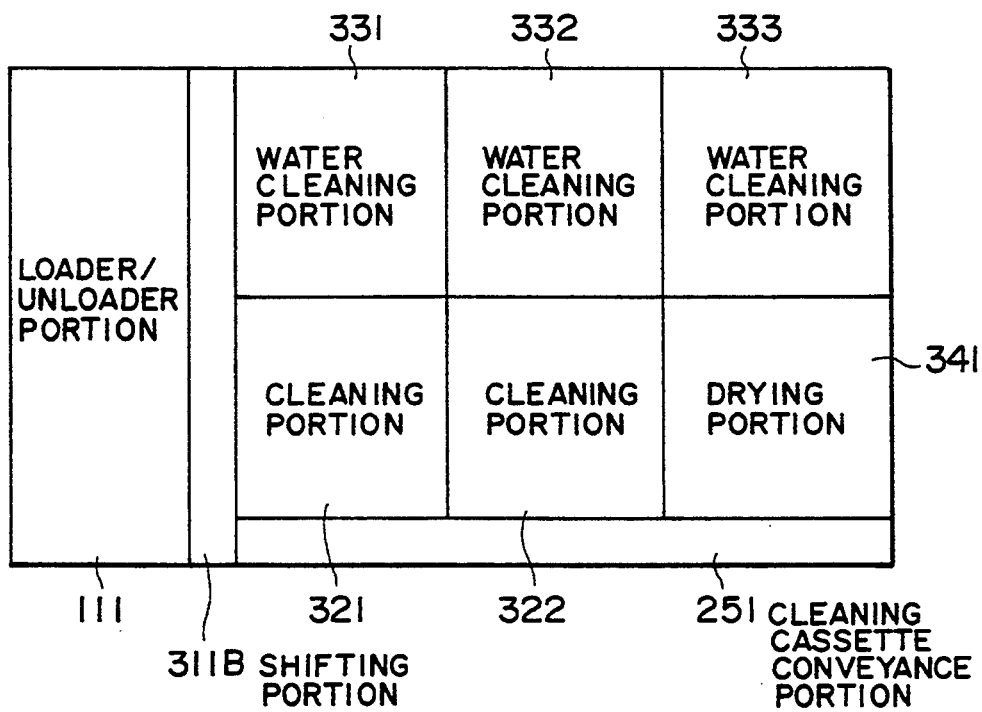
Figure 25:
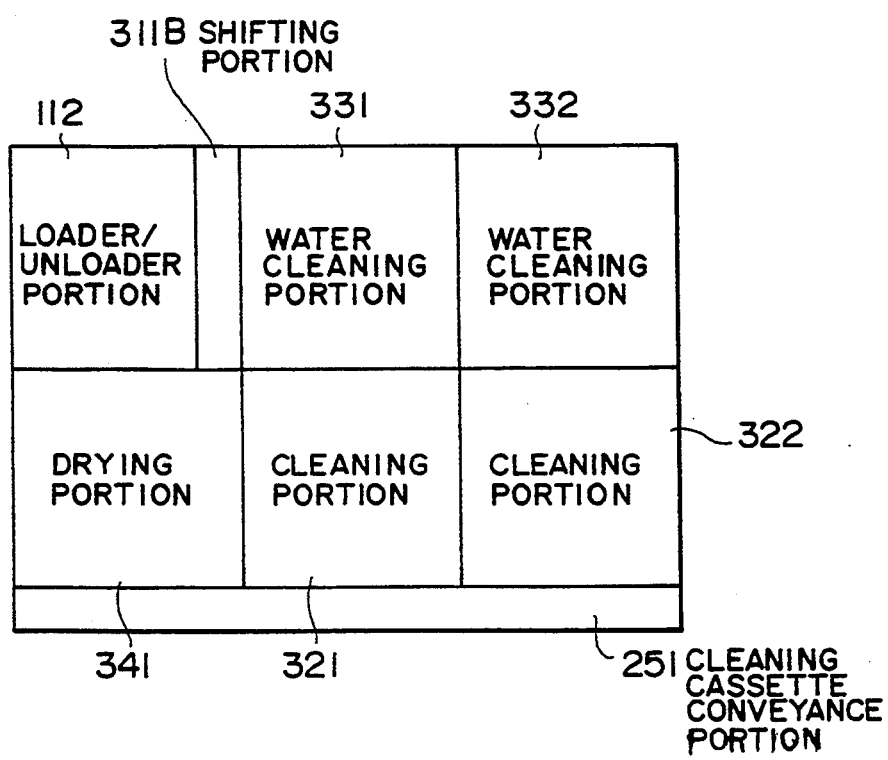

Other structures as shown in FIG. 20 and 21 may be employed in which the product conveyance portion 351 is disposed on either side of the two lines of units in place of the central portion.

Each of the cleaning apparatuses shown in FIGS. 18 to 21 is the cassette-less type cleaning apparatus for directly handling the wafer 1 by the wafer hand thereof. Other structures shown in FIGS. 22 to 25 may be employed for the cleaning apparatus in which a shifting portion 311B is disposed in place of the product injecting/ejecting portion 311A and a cleaning cassette conveyance portion 251 is disposed in place of the product conveyance portion 351. In each case, a cassette-type cleaning apparatus having a similar layout can be structured.

Tenth Embodiment

Figure 26:
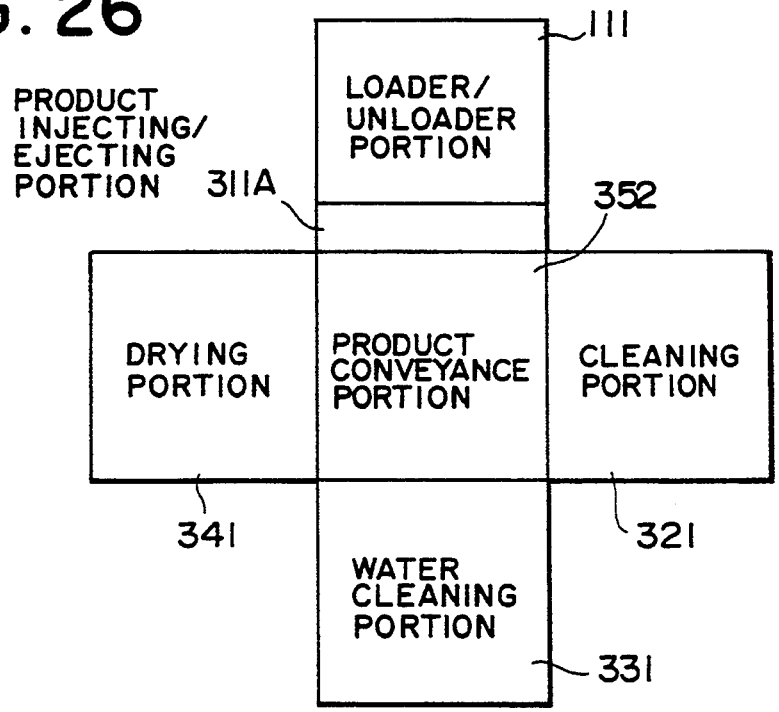
FIG. 26 is a block diagram which illustrates a cleaning apparatus according to a tenth embodiment.
Figure 27:
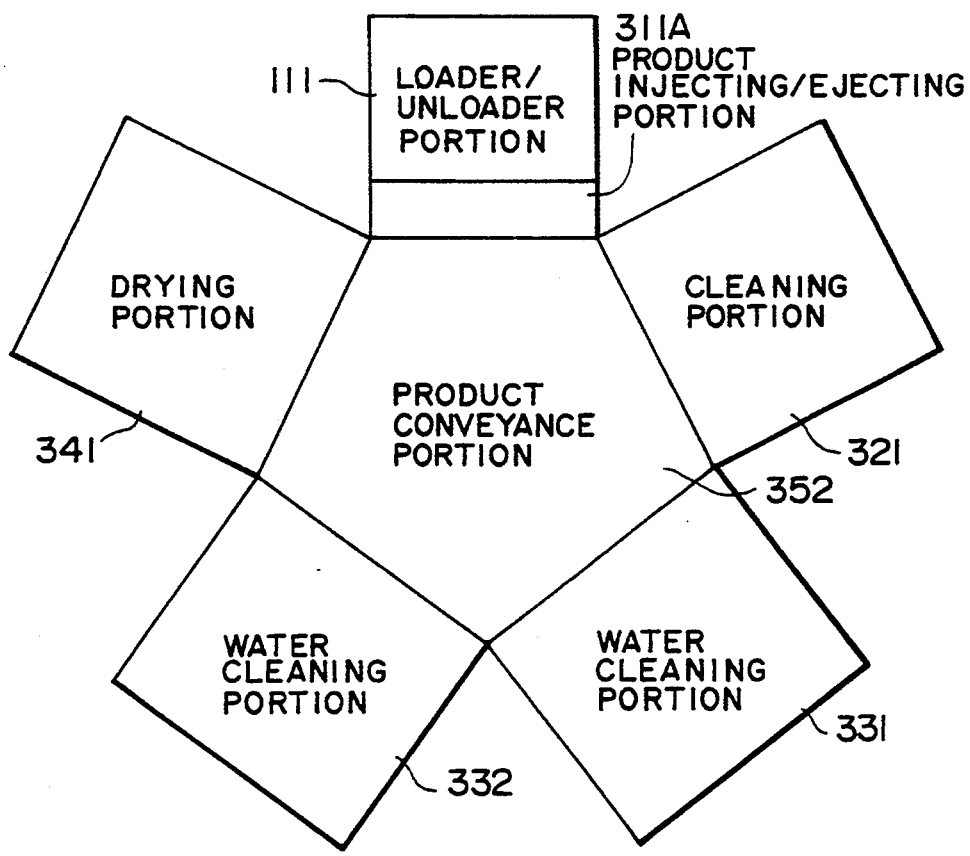
FIGS. 27 to 29 respectively are block diagrams which illustrate modifications of the tenth embodiment.

Another configuration may be employed in which the loader/unloader portion 111, the product injecting/ejecting portion 311A, the cleaning portion 321, the water cleaning portion 331 and the drying portion 341 are disposed around the product conveyance portion 352 as shown in FIG. 26. The product conveyance portion 352 comprises a rotatable arm to shift the wafer to each surrounding unit. Although the structure shown in FIG. 26 has the arrangement that the four units are disposed around the product conveyance portion 352, the structure is not limited to this. For example, a configuration shown in FIG. 27 may be employed in which five units including the second water cleaning portion 332 are disposed around the product conveyance portion 352. As a result of the configuration shown in FIG. 26 or 27, the area of the product conveyance portion 352 can be reduced, and the overall length of the cleaning apparatus can be shortened.

Figure 28:
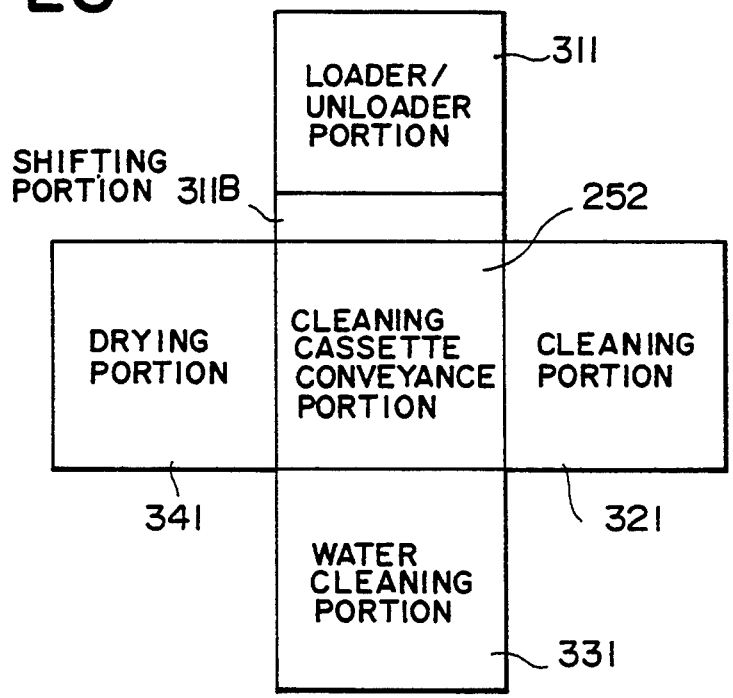
Figure 29:
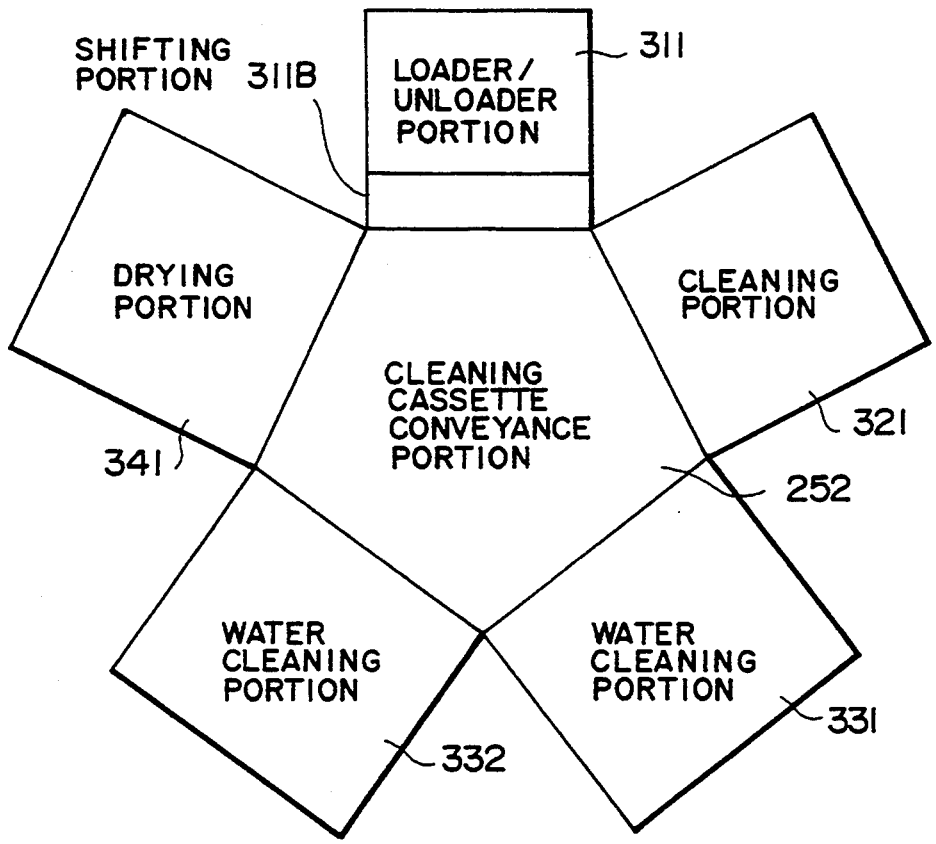

Each of the cleaning apparatuses according to the tenth embodiment is the cassette-less type cleaning apparatus for directly handling the wafer 1 by the wafer hand thereof. Other structures shown in FIGS. 28 and 29 may be employed for the cleaning apparatus in which a shifting portion 311B is disposed in place of the product injecting/ejecting portion 311A and a cleaning cassette conveyance portion 252 is disposed in place of the product conveyance portion 352. In each case, a cassette-type cleaning apparatus having a similar layout can be structured.

Eleventh Embodiment

Figure 30:
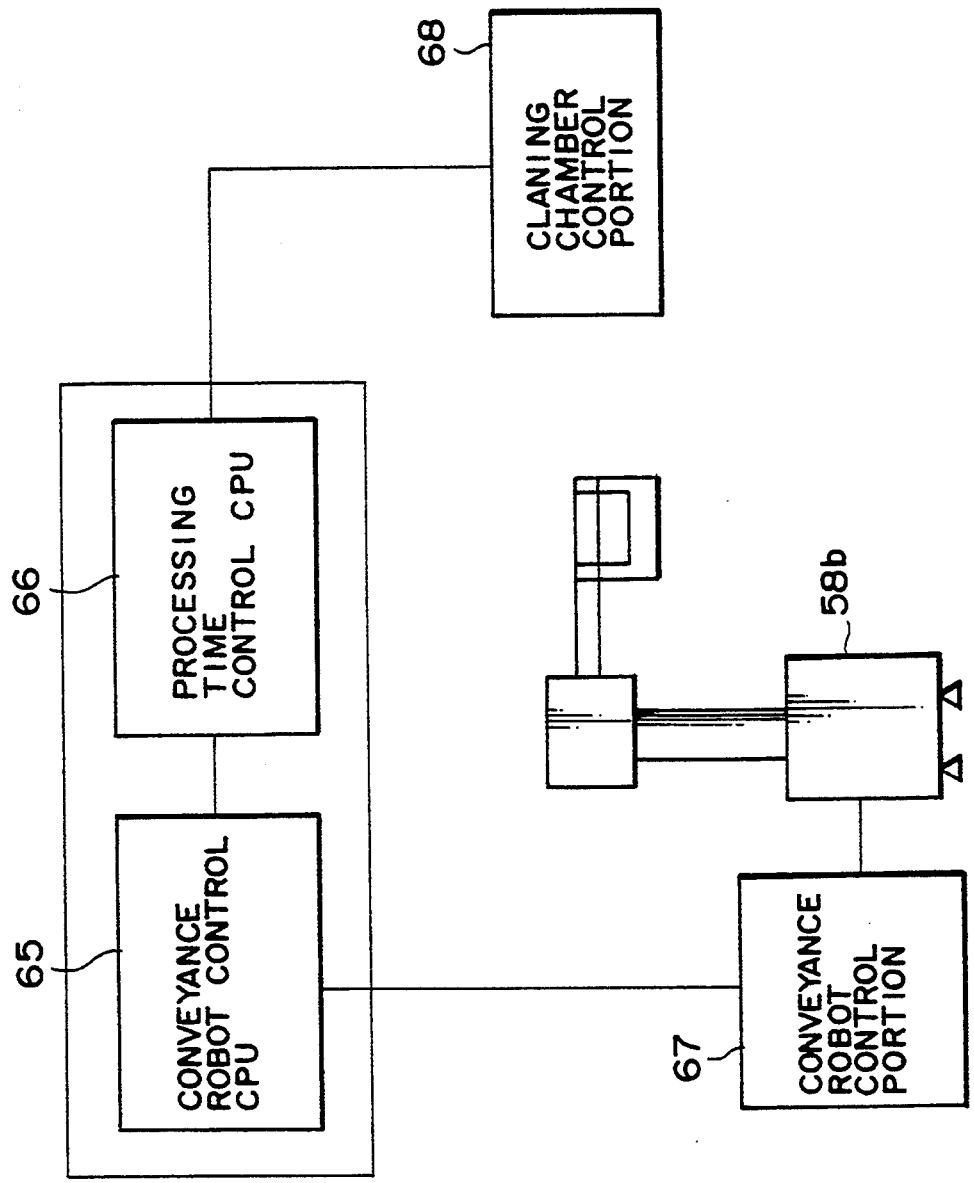
FIG. 30 is a block diagram which illustrates the structure of a conveyance control system according to an eleventh embodiment.

FIG. 30 illustrates the structure of a system for controlling the conveyance performed by a conveyance robot according to the eleventh embodiment. A conveyance-robot control portion 67 is connected to a conveyance robot 58b, and a conveyance-control CPU 65 is connected to the conveyance-robot control portion 67. A cleaning-chamber control portion 68 is connected to the conveyance-control CPU 65 while interposing a processing-time control CPU 66.

The operation of the eleventh embodiment will now be described with reference to FIG. 31.

Figure 31:
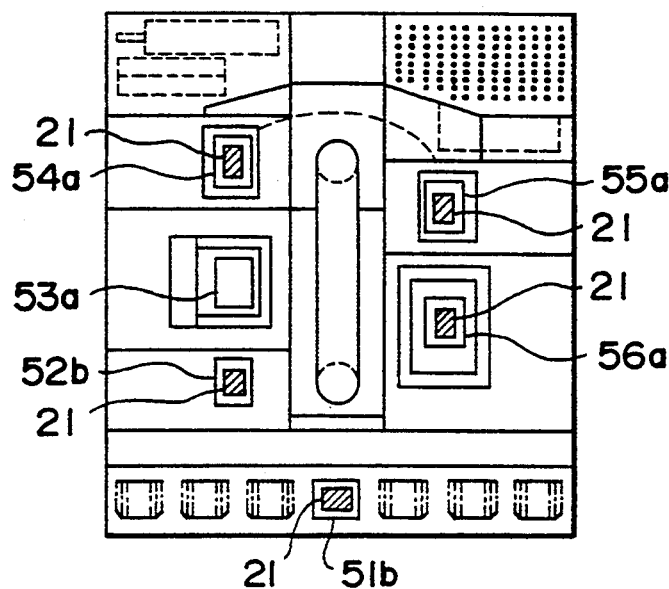
FIG. 31 is a plan view which illustrates a cleaning apparatus for explaining the operation of the eleventh embodiment.

An assumption shown in FIG. 31 is made such that wafer cassettes 21 designated with diagonal lines are being processed in each of the loader/unloader portions 51, the cleaning wafer cassette retainers 51b and 52b of the main processing portion 50, the first and second water cleaning chambers 54a and 55a and the drying chamber 56a. That is, FIG. 31 shows a state where only the cleaning chamber 53a in the cleaning apparatus has no wafer cassette 21 which is being processed.

In accordance with an instruction issued from the conveyance-robot control CPU 65, the conveyance-robot control portion 67 so controls the conveyance robot 58b as to perform the following sequential operations: the conveyance robot 58b shifts the wafer cassette 21 placed on the cleaning wafer cassette retaining frame 52b of the main processing portion 50 into the cleaning chamber 53a, and then the conveyance robot 58b shifts the wafer cassette 21 on the wafer cassette retaining frame 51b of the loader/unloader portion 51, shifts the wafer cassette 21 in the drying chamber 56a to the wafer cassette retaining frame 51b of the loader/unloader portion 51, shifts the wafer cassette 21 in the second water cleaning chamber 55a into the drying chamber 56a, and shifts the wafer cassette 21 in the first water cleaning chamber 54a into the second water cleaning chamber 55a. After a predetermined processing time has passed, the wafer cassette 21 is similarly shifted while moving an empty portion in which no wafer cassette 21 is present, that is, the first water cleaning chamber 54a, to the center. On the wafer cassette retaining frame 51b of the loader/unloader portion 51, the shifting robot 57 takes out the cleaned wafer 1 from the wafer cassette 21 to be accommodated in the product cassette 22. Further, the wafer 1, which has not been cleaned, in the other product cassette 22 is shifted to the wafer cassette 21.

The processing time control CPU 66 connected to the cleaning chamber control portion 68 transmits control timing with which a predetermined processing time is determined. If the timing, at which the conveyance robot 58 shifts the wafer cassette 21, is determined depending upon the predetermined processing time of the main processing portion 50, a case sometimes occurs in that no wafer 1 is injected into the wafer cassette 21 on the wafer cassette retaining frame 51b in the loader/unloader portion 51. In this case, the empty wafer cassette 21 is not on standby at another position, but the empty cassette 21 is, as it is, shifted to the conveyance passage in the main processing portion 50.

Figure 32:
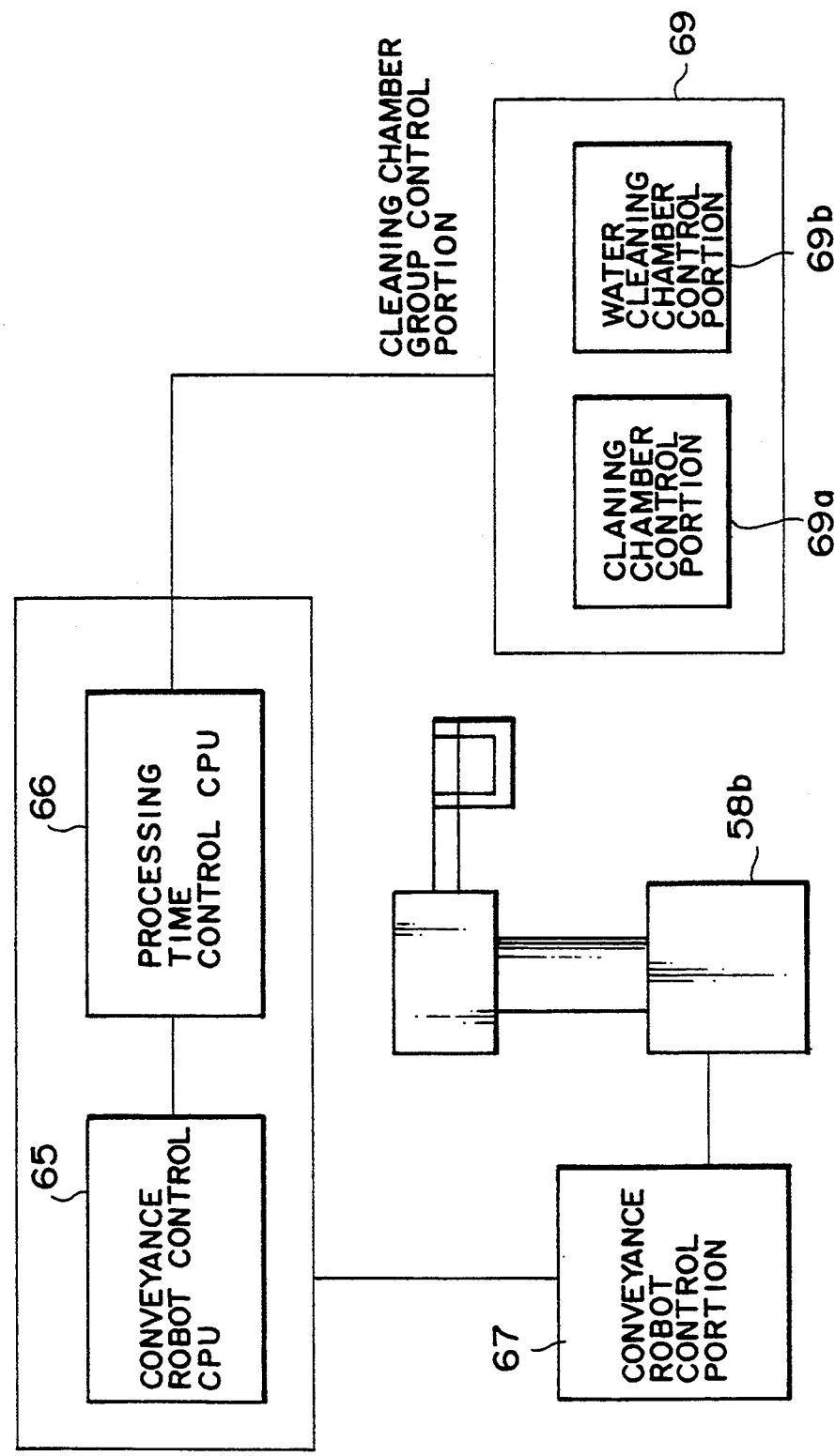
FIG. 32 is a block diagram which illustrates a modification of the eleventh embodiment.

A cleaning-chamber-group control portion 69 may, as shown in FIG. 32, be connected to the processing-type control CPU 66 in place of the cleaning-chamber control portion 68 of the system shown in FIG. 30. The cleaning-chamber-group control portion 69 comprises a cleaning-chamber-control portion 69a for controlling the cleaning chamber 53a and a water-cleaning-chamber control portion 69b for controlling the water cleaning chambers 54a and 55a. As a result, an effect can be obtained in a case where two units in the cleaning apparatus are in empty states where they have no wafer cassette 21. An assumption is made that the cleaning chamber 53a and the first water cleaning chamber 54a have no wafer cassette 21 which is being processed and that each of the loader/unloader portions 51, the cleaning cassette retaining frames 51b and 52b of the main processing portion 50, the second water cleaning chamber 55a and the drying chamber 56a has the wafer cassette 21 which is being processed.

In accordance with an instruction issued from the conveyance-robot control CPU 65, the conveyance-robot control portion 67 controls the conveyance robot 58b to perform the following sequential operations: the conveyance robot 58b shifts the wafer cassette 21 placed on the cleaning wafer cassette retaining frame 52b of the main processing portion 50 into the cleaning chamber 53a, and then the conveyance robot 58b shifts the wafer cassette 21 in the cleaning chamber 53a into the first water cleaning chamber 54a after a predetermined time has passed. Since the first water cleaning chamber 54a is in an empty state at this time, the wafer cassette 21 can be shifted to the first water cleaning chamber 54a immediately after a predetermined time has passed in the cleaning portion 53.

Then, the conveyance robot 58b sequentially shifts the wafer cassette 21 on the wafer cassette retaining frame 51b of the loader/unloader portion 51 to the wafer cassette retaining frame 52b of the main processing portion 50, shifts the wafer cassette 21 in the drying chamber 56a to the wafer cassette retaining frame 51b of the loader/unloader portion 51, and shifts the wafer cassette 21 in the second water cleaning chamber 55a into the drying chamber 56a. The wafer cassette 21 shifted from the cleaning chamber 53a to the first water cleaning chamber 54a is, by the conveyance robot 58b, shifted to the second water cleaning chamber 55a after a predetermined processing time has passed. As described above, the wafer cassettes 21 are shifted while moving the empty portion having no wafer cassette 21 to the center. On the wafer cassette retaining frame 51b of the loader/unloader portion 51, the shifting robot 57 takes out the cleaned wafer 1 from the wafer cassette 21 to cause the wafer 1 to be accommodated in the product cassette 22 and shifts the wafer 1, which has not been cleaned, in the other product cassette 22 to the wafer cassette 21.

At the control timing instructed by the cleaning-chamber control portion 69a and the processing-time control CPU 66 connected to a water-cooling chamber control portion 69b, the processing time in the cleaning chamber 53a and the processing time in the water cleaning chambers 54a and 55a are determined. If the moving timing for the wafer cassette 21 has come in a case where no wafer 1 is injected into the wafer cassette 21 on the wafer cassette retaining frame 51b of the loader/unloader portion 51, the empty wafer cassette 21 is not on standby at another portion, but the empty wafer cassette 21 is shifted into the conveyance passage in the main processing portion 50 as it is.

Twelfth Embodiment

Figure 33:
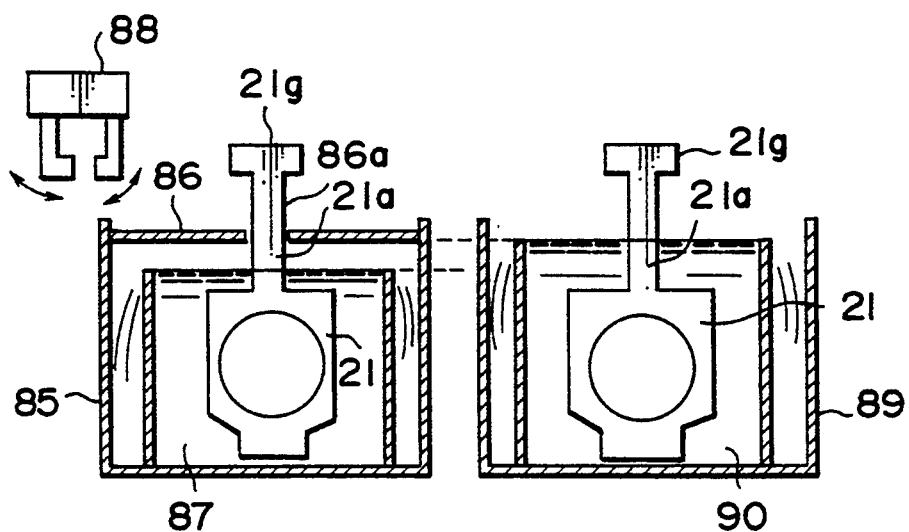
FIG. 33 is a cross sectional view which illustrates a cleaning chamber and a water cleaning chamber according to a twelfth embodiment and a thirteenth embodiment.

If the cleaning apparatus according to each of the embodiments is so arranged that an insulating plate 86 having an opening 86a, through which the handles 21g of the wafer cassette 21 are made to appear after the wafer cassette 21 has been set in the cleaning chamber 85, is disposed on the cleaning chamber 85, adhesion of mist to the handles 21g of the wafer cassette 21 occurring due to the cleaning process can be prevented. That is, the contamination of the cassette hand 88 that takes place when the handles 21g of the cleaned wafer cassette 21 are held by the cassette hand 88 of the conveyance robot can be prevented. As shown in FIG. 33, the handles 21g of the cleaning cassette 21, which are disposed above the cassette's accommodating portion in which wafers can be accommodated, are higher than the liquid level in the cleaning chamber 85 when the cassette 21 is immersed in cleaning solution.

Thirteenth Embodiment

By making the level of a water solution 90 in a water cleaning chamber 89 higher than the level of a cleaning solution in the cleaning chamber 85 as shown in FIG. 33, the support plate 21a of the wafer cassette 21 immersed in the cleaning solution 87 in the cleaning process can be completely cleaned with water.

Fourteenth Embodiment

Figure 34:
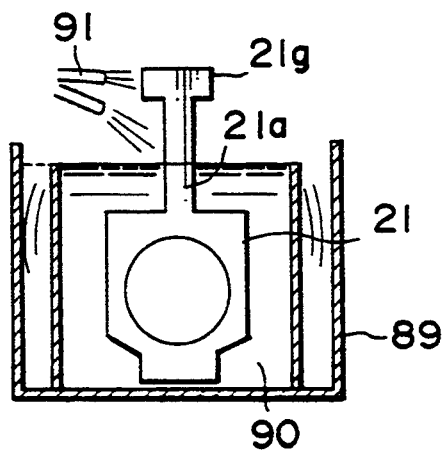

If the structure is arranged in such a manner that, as shown in FIG. 34, pure water and drying gas are sprayed from a nozzle 91 to a portion of the handles 21g of the wafer cassette 21 and the support plate 21a appearing outside when the wafer cassette 21 is set in the water cleaning chamber 89, mist adhered due to the cleaning process can be removed.

Fifteenth Embodiment

Figure 35:
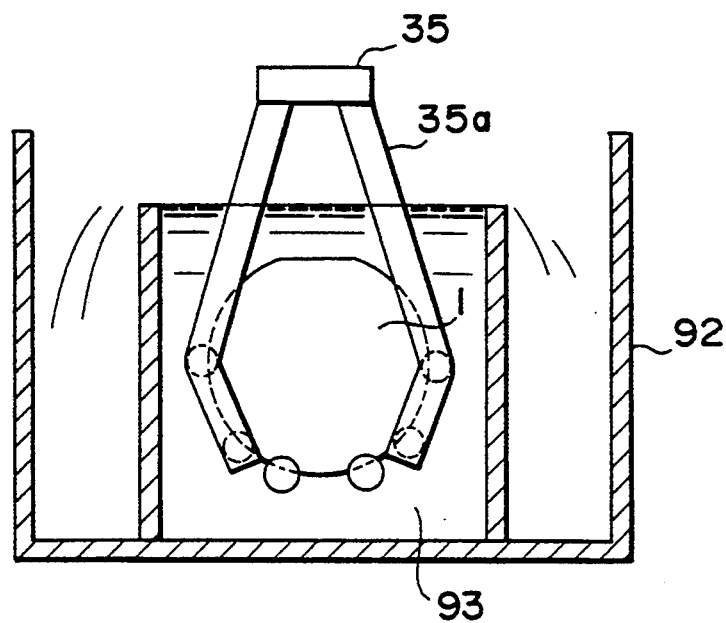
FIGS. 34 and 35 respectively are cross sectional views which illustrate a water cleaning chamber according to a fourteenth embodiment and a fifteenth embodiment.

By immersing, as shown in FIG. 35, the wafer hand 35a of the conveyance portion 35 in pure water 93 in the water cleaning chamber 92 from a moment the wafer 1 is set in the water cleaning chamber 92, the cleaning solution and mist adhered to the wafer hand 35a during the cleaning process can be removed.

Sixteenth Embodiment

Figure 36:
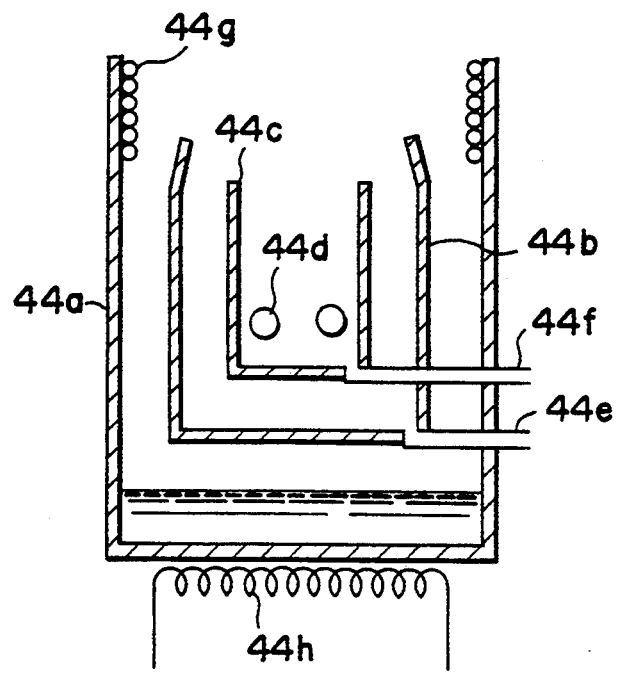
FIG. 36 is a cross sectional view which illustrates a drying chamber according to a sixteenth embodiment.

The drying portion may be structured as shown in FIG. 36. An IPA recovery chamber 44b for the wafer hand is disposed in a drying chamber 44a, and an IPA recovery chamber 44c for the wafer is disposed in the recovery chamber 44b. The IPA recovery chamber 44c for the wafer has a wafer receiver 44d. The wafer receiver 44d has a plurality of grooves to receive the ends of the inserted wafers 1 to hold the wafers 1. Discharge pipes 44e and 44f for recovering IPA containing water are respectively connected to the bottom portions of the IPA recovery chambers 44b and 44c. A condensing coil 44g is disposed along the inner wall of the upper portion of the drying chamber 44a, and a heater 44h is disposed under the drying chamber 44a.

Figure 37:
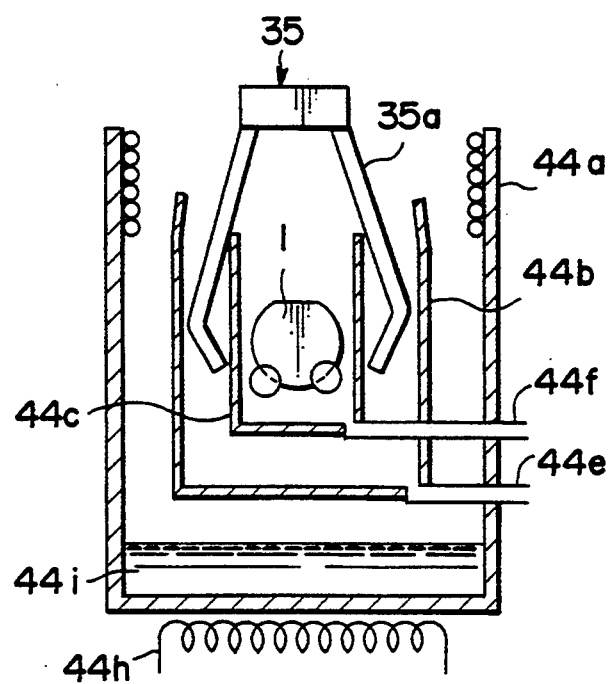
FIG. 37 is a cross sectional view which illustrates a state where the wafer and the wafer hand are being dried in the drying chamber shown in FIG. 36.

The operation to be performed in the drying portion according to the sixteenth embodiment will now be described. The wafer 1 cleaned with water in the water cleaning portion 33A shown in FIG. 1 is held by the wafer hand 35a of the product conveyance portion 35 to be received by the wafer receiver 44d of the drying portion as shown in FIG. 37. Then, only the wafer hand 35a is disposed between the two recovery chambers 44b and 44c. An IPA 44i accommodated in the bottom portion of the drying chamber 44a is heated and evaporated by the heater 44h, and it is condensed on the surface of the wafer 1 and that of the wafer hand 35a. Then, water droplets drop from the surface of the wafer 1 into the recovery chamber 44c and water drops drop from the surface of the wafer hand 35a into the recovery chamber 44b before water is discharged outside through the discharge pipes 44f and 44e. Thus, water and foreign matter on the surfaces of the wafer 1 and the wafer hand 35a can be removed.

Since the sixteenth embodiment has the arrangement that water droplets are individually recovered from the wafer 1 and the wafer hand 35a, contamination of the wafer 1 with the IPA, which has processed the wafer hand 35a, can be prevented while simultaneously processing and drying the wafer 1 and the wafer hand 35a.

Seventeenth Embodiment

The cleaning apparatus according to the fifth embodiment shown in FIG. 13 may be arranged in such a manner that wafers 1 of a plurality of lots are present in the cleaning apparatus and each of the cleaning portion 53, the water cleaning portions 54 and 55 and the drying portion 56 simultaneously process the wafers 1 of the corresponding lots. Since wafers 1 for 6 lots can be simultaneously set in the foregoing cleaning apparatus including the wafer retaining frame 51a of the loader/unloader portion 51 and the wafer retaining frame 52 on the side of the product conveyance portion 58, disposition of six or more product cassette retaining frames in the loader/unloader portion 51 maximizes the operation efficiency of the cleaning apparatus. A product-identification tag is usually fastened to each product cassette 22, the product-identification tag being positioned adjacent to this side of the cleaning apparatus by controlling the direction of each product cassette retaining frame.

Eighteenth Embodiment

Figure 38:
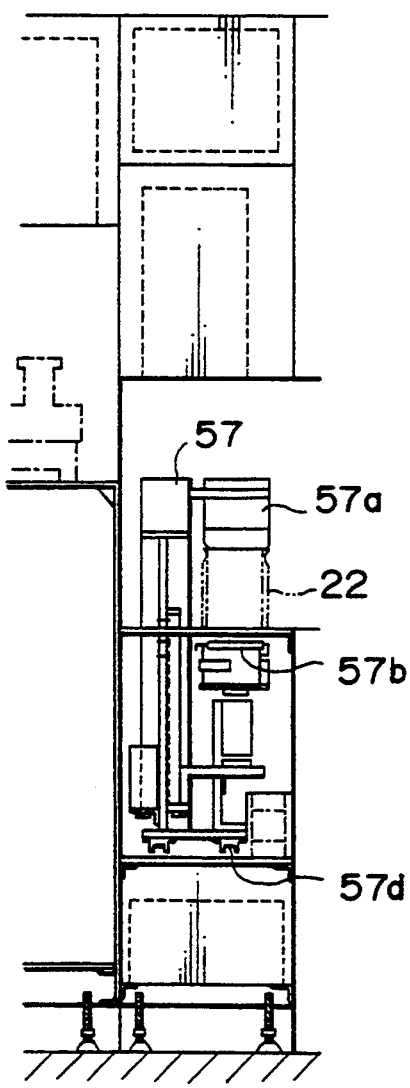
FIG. 38 illustrates a robot for use in a cleaning apparatus according to a eighteenth embodiment.
Figure 39:
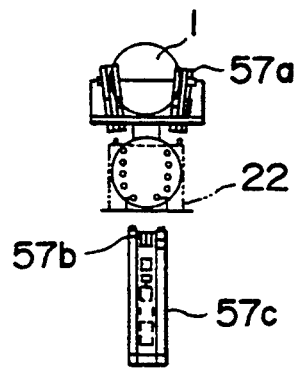
FIG. 39 is a detailed drawing of FIG. 38.

The detailed structure of the robot 57 according to the fifth embodiment shown in FIG. 13 is shown in FIGS. 38 and 39. The robot 57 is so arranged as to shift the wafer 1 between the product cassette 22 placed in the loader/unloader portion 51 and the wafer retaining frame 51a. The robot 57 comprises a hand 57a for holding the wafer 1, an orientation-flat aligning device 57b for aligning the orientation flat of the wafer 1 accommodated in the product cassette 22 and a projecting member 57c for upwardly projecting the wafer 1 in the product cassette 22 over the product cassette 22.

The robot 57 is, along the rail 57d, moved to the position of the product cassette 22 placed on the product cassette retainer of the loader/unloader portion 51. The robot 57 uses the orientation-flat aligning device 57b to align the orientation-flat directions of the plural wafers 1 accommodated in the product cassette 22, and then the projecting member 57c upwardly projects the wafer 1 from the product cassette 22 over the product cassette 22. In this state, the robot 57 holds the wafer 1 with the hand 57a thereof, and moves the projecting member 57c downwards, the robot 57 being then moved to a position of the wafer retaining frame 51a of the loader/unloader 51. At this time, the projecting member 57c is moved upwards from a position below the wafer cassette 21 to support the wafer 1 held by the hand 57a. After the hand 57a has released the wafer 1, the projecting member 57c is moved downwards to shift the wafer 1 to the wafer retaining frame 51a.

The robot 57 is a robot provided for a cassette-less cleaning apparatus for directly handling the wafer 1 to shift the wafer 1 between the product cassette 22 and the wafer retaining frame 51a. A robot for shifting the wafer 1 between the product cassette placed in the loader/unloader portion and the wafer cassette placed on the wafer cassette retaining frame can be constituted similarly used in a cassette-type cleaning apparatus.

Nineteenth Embodiment

Figure 40:
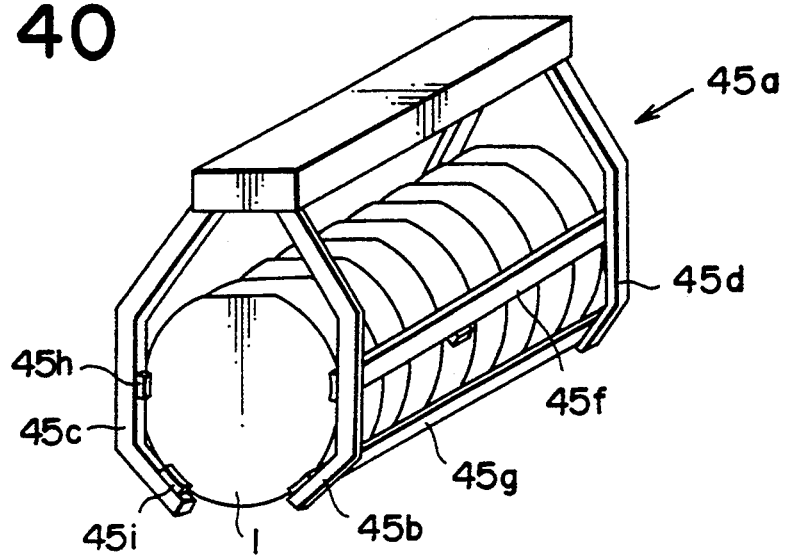
FIG. 40 is a perspective view which illustrates a wafer hand according to a nineteenth embodiment.
Figure 41:
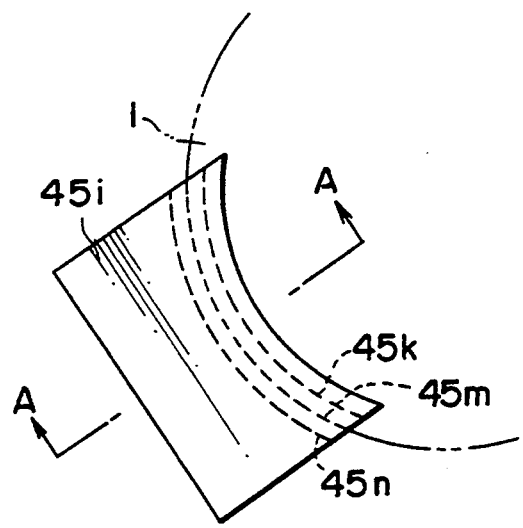
FIG. 41 is a front elevational view which illustrates a wafer support rod of the wafer hand shown in FIG. 40.
Figure 42:
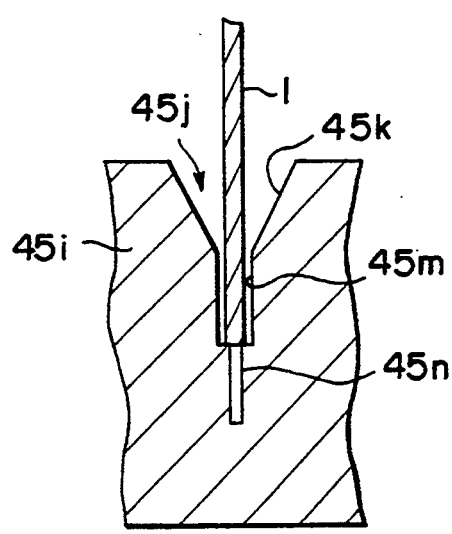
FIG. 42 is a cross sectional view taken along line A—A of FIG. 41.

A wafer hand 45a structured as shown in FIG. 40 may be used as the wafer hand for the product conveyance portion. Wafer support rods 45f and 45g for establishing the connection between the arm 45b and 45d of two arm pairs 45b–45c and 45d -45e are disposed, while wafer support rods 45h and 45i for establishing the connection between the arm 45c and 45e are provided. The foregoing wafer support rods 45f to 45i are disposed in parallel to one another while each having plural wafer receiving grooves 45j shown in FIGS. 41 and 42 therein. The wafer receiving groove 45j is composed of a wafer guide portion 45k to be formed into a tapered cross sectional shape, a wafer support portion 45m for. supporting the wafer 1 and a discharge portion 45n for discharging the IPA condensed on the surface of the wafer 1 and on that of the wafer receiving groove 45j. For example, an 8-inch wafer having a thickness of 725 $\mu$m is so arranged that the width of the groove in the wafer support portion 45m is 900 $\mu$m and the width of the groove in the discharge portion 45n is 200 to 700 $\mu$m.

By using the wafer hand 45a according to the nineteenth embodiment, a plurality of wafers 1 can assuredly be held and, accordingly, the processing performance can be improved. Since each wafer receiving groove 45j has the discharge portion 45n, drying of the wafer 1, which is held by the wafer hand 45a, can be performed in the drying portion 34 arranged as shown in FIG. 4 in such a manner that contaminated IPA because it has cleaned the surface of the wafer 1 and that of the wafer end 45a flows to the discharge portion 45n of each wafer receiving groove 45j to drop in to the recovery chamber 34b. As a result, re-adhesion of water and foreign matter from the contaminated IPA to the wafer 1 can be prevented and, accordingly, the wafer 1 can be cleaned and dried in a short time.

The discharge portion 45n of each wafer receiving groove 45j may be omitted. In a case where a drying portion arranged as shown in FIG. 36 such that the IPA recovery chamber 44c for the wafer and the IPA recovery chamber 44b for the wafer hand are individually provided is used, the wafer hand 45a comes in contact with the vapor of IPA in a state where the wafer hand 45a is positioned away from the wafer 1. Therefore, the discharge portion 45n can be omitted from the wafer receiving groove 45j.

Figure 43:
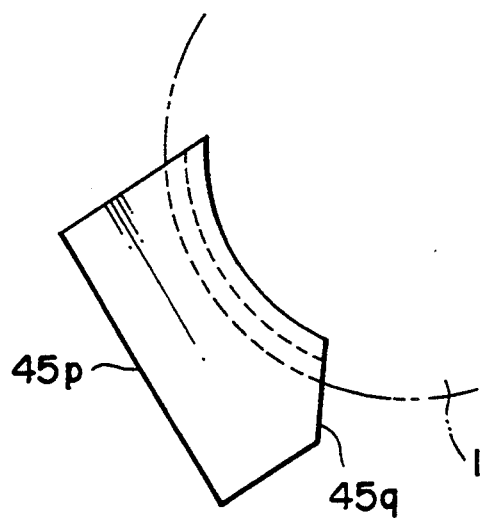
FIGS. 43 and 44 respectively are cross sectional views which illustrate a wafer support rod according to modifications.

A wafer support rod 45p arranged as shown in FIG. 43 may be used. The wafer support rod 45p has a vertical cut portion 45q in the longitudinal direction thereof. By forming the foregoing cut portion 45q, the contaminated IPA which has cleaned the surface of the wafer 1 and that of the wafer hand 45a is able to easily drop in the drying portion. Therefore, the wafer 1 can be cleaned and dried in a shorter time.

Figure 44:
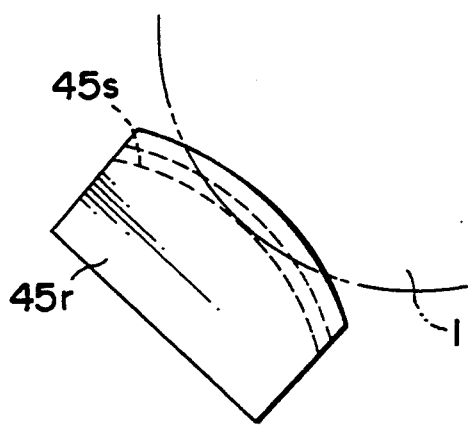

If a wafer support rod 45r having a projecting circular arc portion as shown in FIG. 44 is used to support the wafer 1, the contact area between the wafer 1 and the wafer receiving groove 45s can be minimized. Therefore, amount of the IPA left in the foregoing contact portion can be reduced and, therefore, the wafer 1 can be cleaned and dried in a short time.

Twentieth Embodiment

Figure 45:
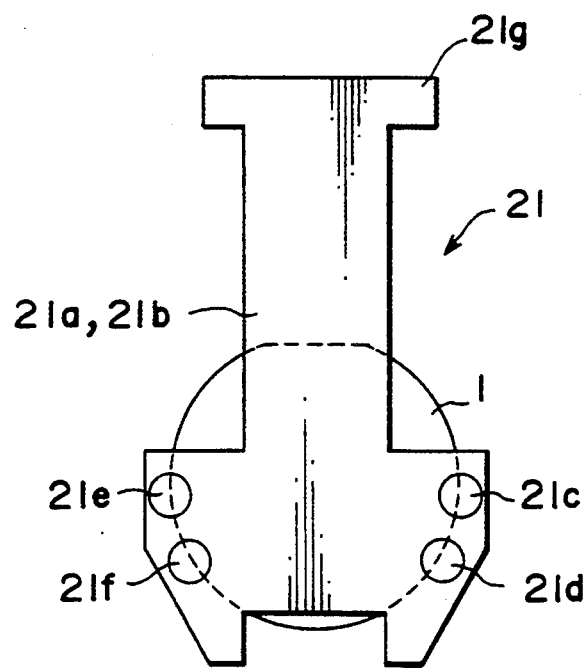
FIGS. 45 and 46 respectively are a side elevational view and a front elevational view which illustrate a wafer cassette according to a twentieth embodiment.
Figure 46:
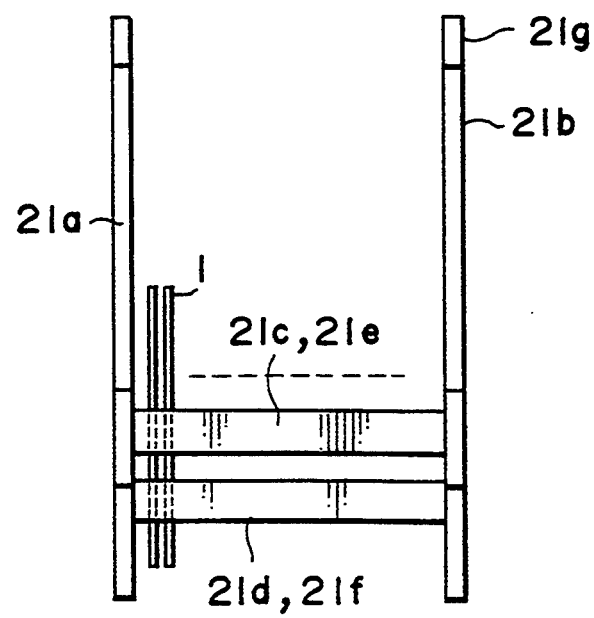

A cleaning wafer cassette 21 according to a twentieth embodiment is shown in FIGS. 45 and 46. The wafer cassette 21 is composed of a pair of support plates 21a and 21b, and wafer support rods 21c to 21f are disposed to run parallel to each other as to establish the connection between the support plates 21a and 21b. Each of the wafer support rods 21c to 21f has a plurality of wafer receiving grooves (omitted from illustration) for supporting the wafers 1. Each of the support plates 21a and 21b has a height sufficiently higher than the height of the wafer 1 to be accommodated in the wafer cassette 21, that is, the diameter of the wafer 1. Further, each of the support plates 21a and 21b has handles 21g at the upper ends thereof to hold the wafer cassette 21.

Figure 47:
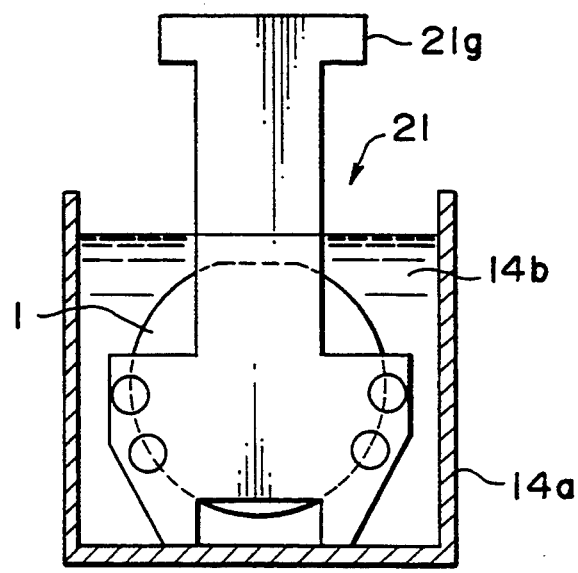
FIG. 47 is a cross sectional view which illustrates a state where the wafer cassette according to the twentieth embodiment is set in the cleaning chamber.

A state where the wafer 1 is accommodated in the wafer cassette 21 and the wafer cassette 21 is set in the cleaning chamber 14a is shown in FIG. 47. Since each of the support plates 21a and 21b has a height which is sufficiently higher than the wafer 1, the handles 21g of the wafer cassette 21 are positioned above the level of the cleaning solution 14b if the wafer 1 is completely immersed in the cleaning solution 14. Therefore, the chuck of the cassette hand for holding the handles 21g is not wetted with the cleaning solution 14b. That is, an exclusive hand cleaning portion for cleaning and drying the cassette hand can be omitted from the structure. As an alternative to this, an operation for changing the wetted cassette hand to a dry cassette hand can be omitted.

Since the wafer cassette 21 has a surface area which is smaller than that of a conventional box-shape wafer cassette and the wafer 1 appears considerably as compared with the same, the cleaning effect can be improved. Furthermore, the fact that the width of the wafer cassette 21 is narrow enables the size of the chamber of each unit to be reduced similarly to the cassette-less cleaning apparatus according to the first embodiment. Further, the following advantages obtainable from the cassette-type apparatus can be realized: the wafer 1 can be protected from damage at the time of conveyance as compared with the cassette-less type; and the adjustment at the time of maintenance can easily be completed.

Twenty-First Embodiment

Figure 48:
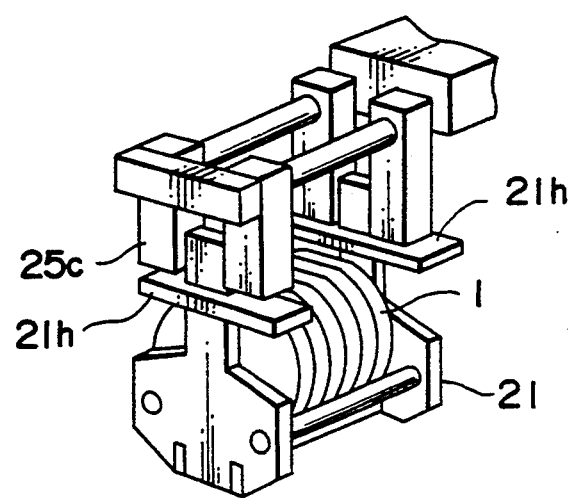
FIG. 48 is a perspective view which illustrates a wafer cassette according to a twenty-first embodiment.

If the cleaning solution 14b or cleaning water 15b is a bubble-forming solution, there is a fear that the upper end portion of the wafer cassette 21 will be wetted with droplets of the solution due to bubble formation. Accordingly, disposition of a solution block 21h along the outer surface of the wafer cassette 21 as shown in FIG. 48 blocks the droplets due to the formation of bubbles. Therefore, the upper end of the wafer cassette 21 cannot be wetted with the droplets. As a result, wetting of the chuck 25c of the cassette hand can effectively be prevented.

Twenty-Second Embodiment

Figure 49:
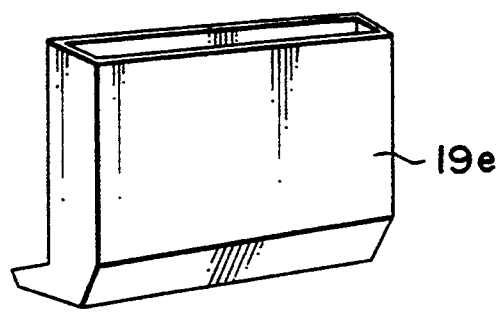
FIG. 49 is a perspective view which illustrates an exclusive glove for use in a cleaning apparatus according to a twenty-second embodiment.
Figure 50:
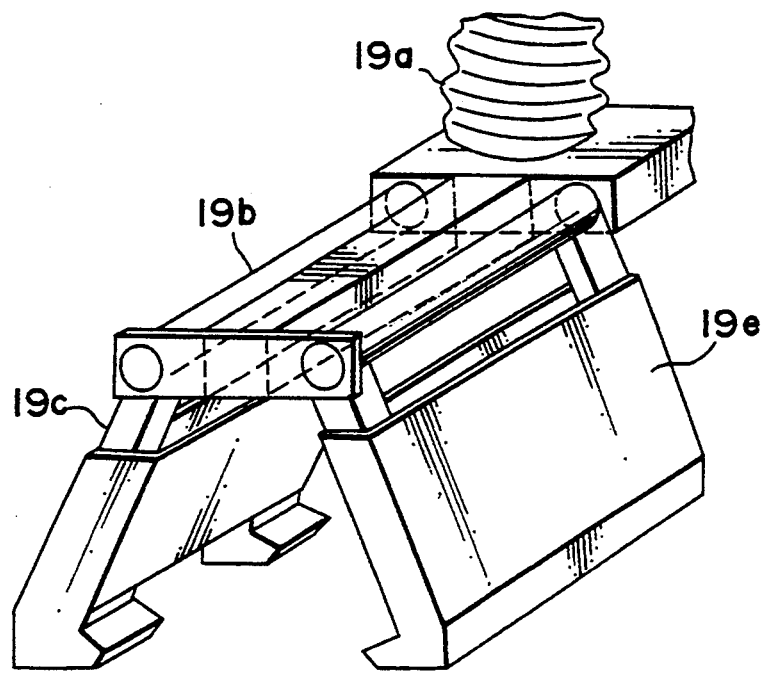
FIG. 50 is a perspective view which illustrates a cassette hand to which the exclusive glove shown in FIG. 49 is fastened.

A conventional wafer cassette 2 may comprise chucks 19c, to which exclusive gloves 19e, arranged as shown in FIG. 49, are fastened in order to protect the chuck 19c of the cassette hand from being wetted with the cleaning solution 14b or cleaning water 15b to perform the cleaning process and the water cleaning process. A cassette hand comprising the chucks 19c, to which the exclusive gloves 19e are fastened, is shown in FIG. 50.

Figure 51:
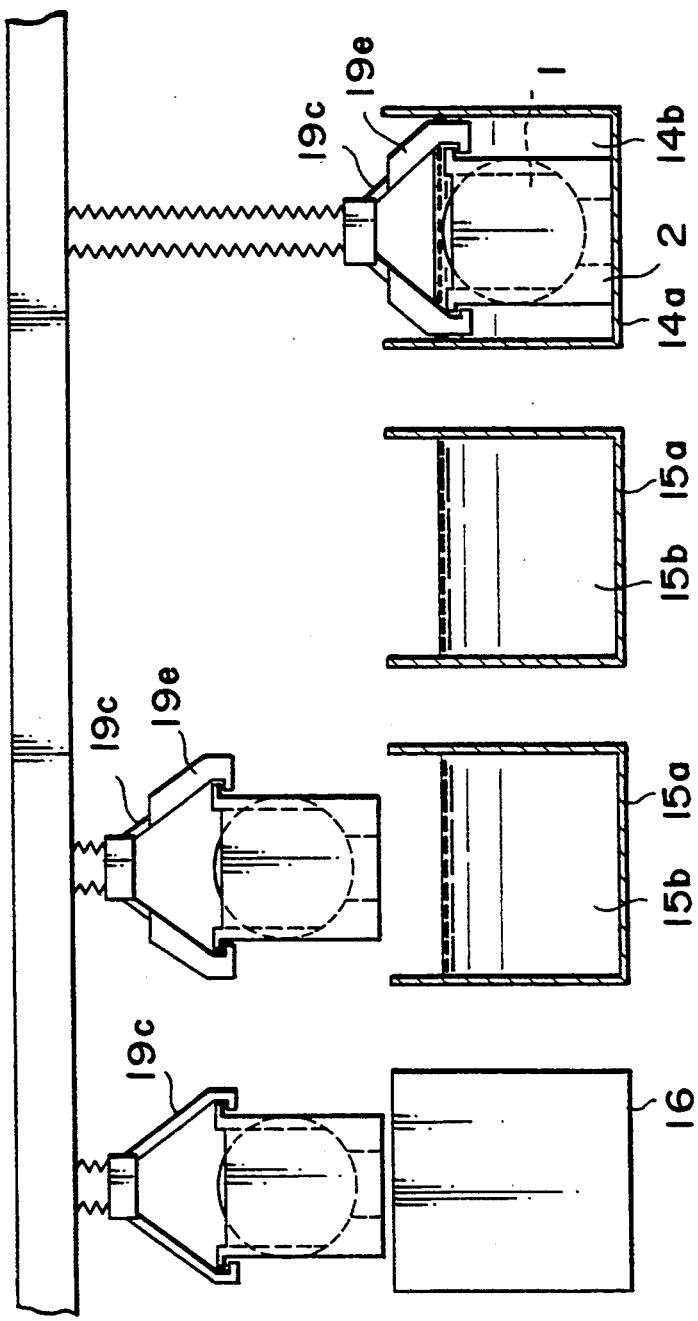
FIG. 51 illustrates a cleaning process to be performed in a case where the exclusive glove according to the twenty-second embodiment is used.

As shown in FIG. 51, the chucks 19c, to which the exclusive gloves 19e are fastened, are used to set the wafer cassette 2 in the cleaning chamber 14a in such a manner that the wafer 1 is completely immersed in the cleaning solution 14b. Although a portion of the exclusive glove 19e is immersed in the cleaning solution 14b at this time, the chuck 19c is not wetted with the cleaning solution 14b. When the wafer cassette 2 is set in the cleaning water 15b in the water cleaning chamber 15a, wetting of the chuck 19c with cleaning water 15b can be prevented although a portion of the exclusive glove 19e is immersed in cleaning water 15b. After the water cleaning process has been completed, the wafer cassette 2, to which the exclusive gloves 19e are fastened, is set in the drying portion 16 to perform the drying process. After the drying process has been completed, the exclusive gloves 19e are removed from the chuck 19c, and the chuck 19c is directly used to take out the dried wafer cassette 2 from the drying portion 16. As a result, an exclusive hand cleaning portion for cleaning and drying the cassette hand can be omitted.

Figure 52:
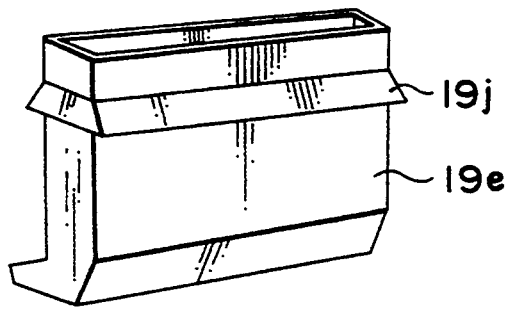
FIG. 52 is a perspective view which illustrates an exclusive glove according to a modification of the twenty-second embodiment.

If the cleaning solution 14b or cleaning water 15b is a bubble forming solution, there will be a fear that the chuck 19c is wetted with the droplets of the solution. Accordingly, a solution block 19j is formed along the outer end of the exclusive glove 19e as shown in FIG. 52 so that droplets of the solution are blocked by the solution block 19j. As a result, wetting of the top end of the exclusive glove 19e with the droplet of the solution can be prevented. As a result, wetting of the chuck 19c of the cassette hand can be prevented effectively.

Figure 53:
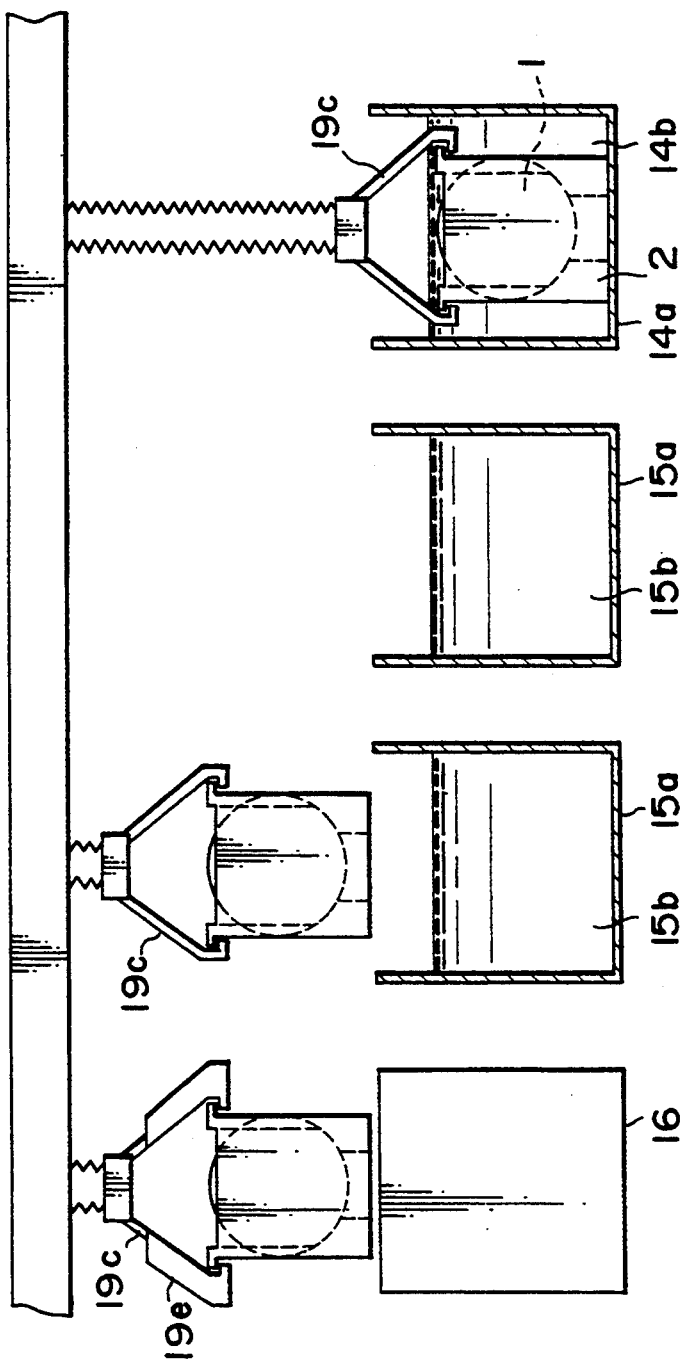
FIG. 53 illustrates another cleaning process to be performed in a case where the exclusive glove according to the twenty-second embodiment is used.

Another arrangement may be employed, as shown in FIG. 53, in which the chuck 19c is directly used from the cleaning process to the drying process to handle the wafer cassette 2 and the exclusive glove 19e is fastened to the chuck 19c only at the time of taking out the dried wafer cassette 2 from the drying portion 16. Even if the chuck 19c is wetted, fastening of the exclusive glove 19e enables the dried wafer 1 and the wafer cassette 2 to be taken out from the drying portion 16 while preventing the dried wafer 1 and the wafer cassette 2 from being wetted.

Twenty-Third Embodiment

Figure 54:
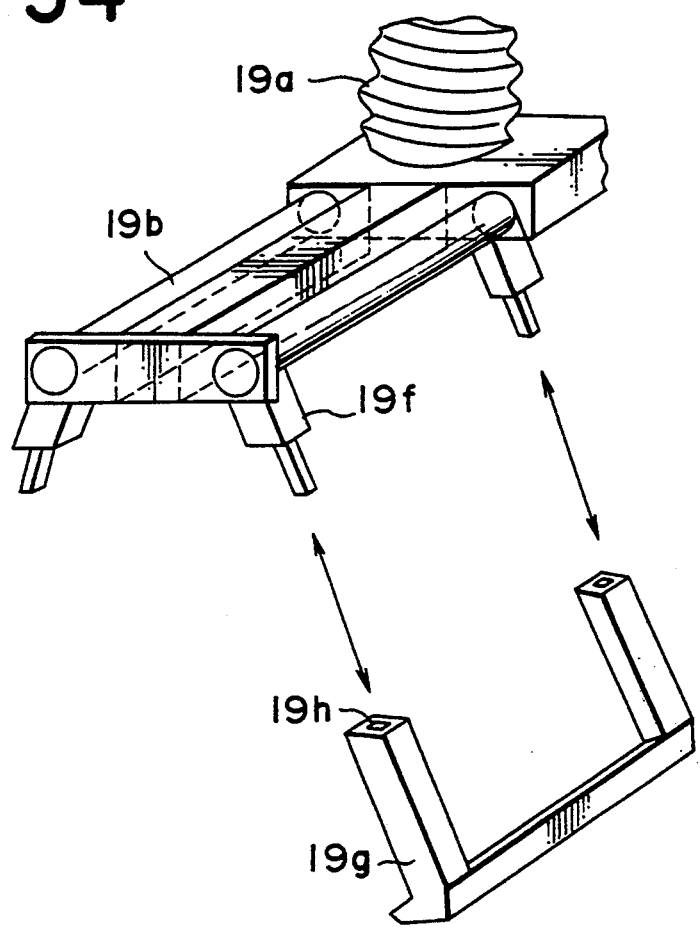
FIGS. 54 and 55 respectively are an exploded perspective view and a perspective view which illustrate a cassette hand according to a twenty-third embodiment.
Figure 55:
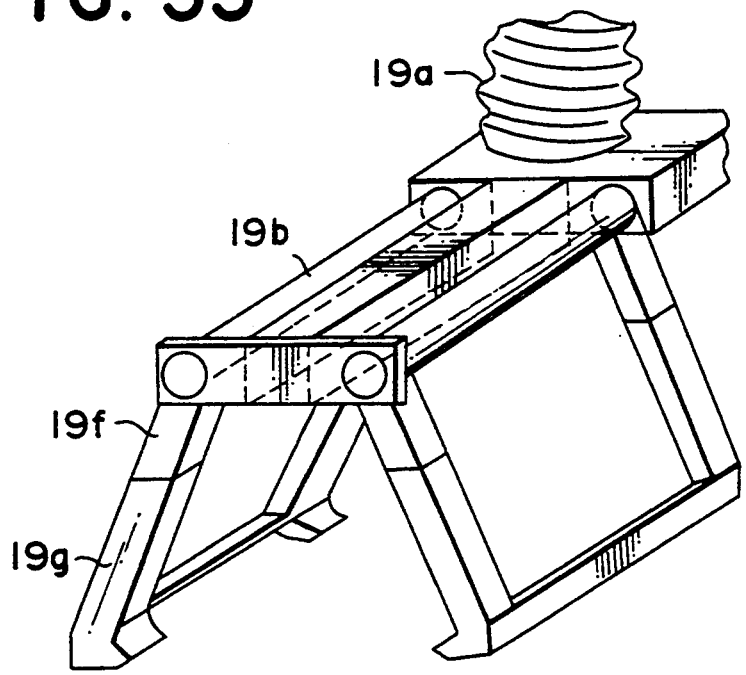

FIG. 54 illustrates a cassette hand according to a twenty-third embodiment. The foregoing cassette hand comprises a changeable-chuck connection jig 19 connected to a movable arm 19a while interposing a chuck support arm 19b, and a movable chuck 19g detachably provided for the connection jig 19f. The connection jig 19f includes an electromagnet, while the changeable chuck 19g is made of magnetic material. The leading portion of the connection jig 19f is inserted into a fastening hole 19h formed in the changeable chuck 19g and an electric current is caused to pass through the electromagnet of the connection jig 19f so that the fastening chuck 19g is connected to the connection jig 19f as shown in FIG. 55 to serve as a portion of the cassette hand.

Figure 56:
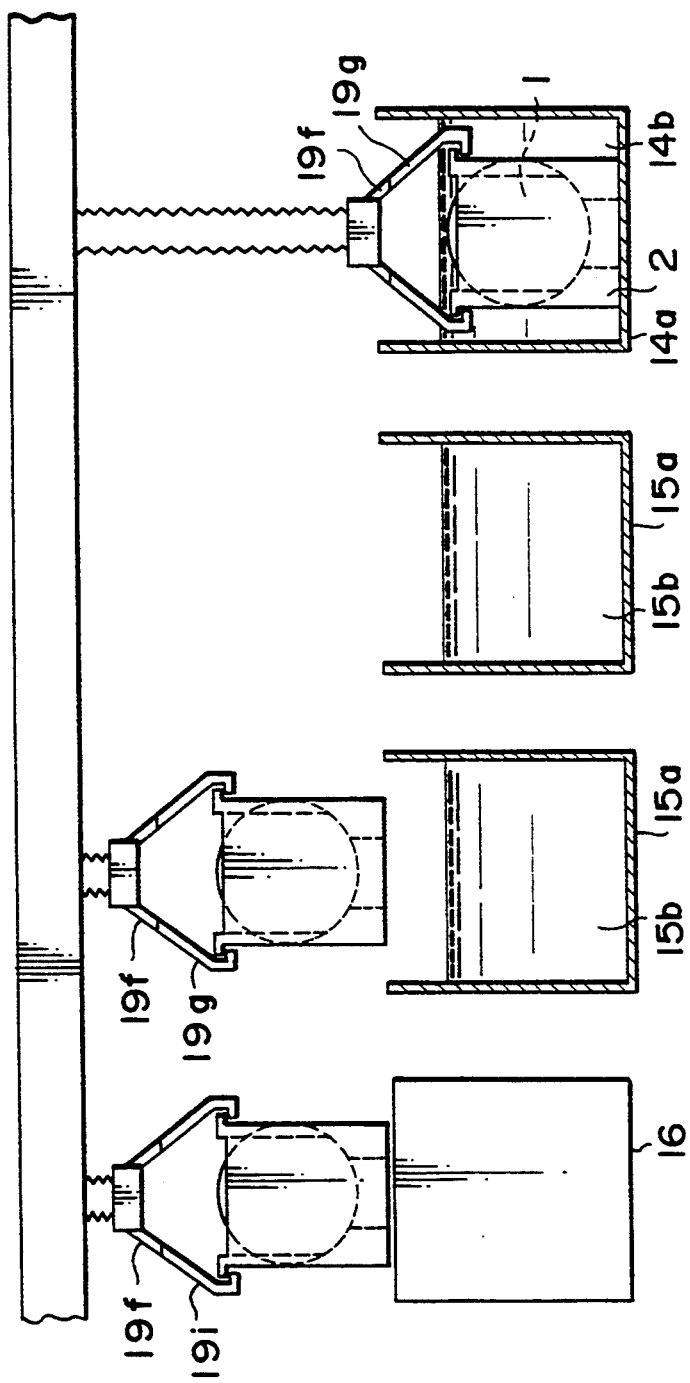
FIG. 56 illustrates a cleaning process to be performed in a case where the cassette hand according to a twenty-third embodiment is used.

As shown in FIG. 56, the first changeable chuck 19g is fastened to the connection jig 19f, and the first changeable chuck 19g is used to set the wafer cassette 2 in the cleaning chamber 14a in such a manner that the wafer 1 is completely immersed in the cleaning solution 14b. At this time, a portion of the changeable chuck 19g is immersed in the cleaning solution 14b. Similarly, the first changeable chuck 19g is used to set the wafer cassette 2 into cleaning water 15b in the water cleaning chamber 15a. Also at this time, a portion of the changeable chuck 19g is immersed in cleaning water 15b. After the water cleaning process has been completed, the first changeable chuck 19g is used to set the wafer cassette 2 into the drying portion 16 to perform the drying process. After the drying process has been completed, the first changeable chuck 19g wetted with the cleaning solution 14b and cleaning water 15b is removed and the dry second changeable chuck 19i is fastened to the connection jig 19f. By using the changeable chuck 19i to take out the dried wafer cassette 2 from the drying portion 16, an exclusive hand cleaning portion for cleaning and drying the cassette hand can be omitted from the structure.

Twenty-Forth Embodiment

Figure 57:
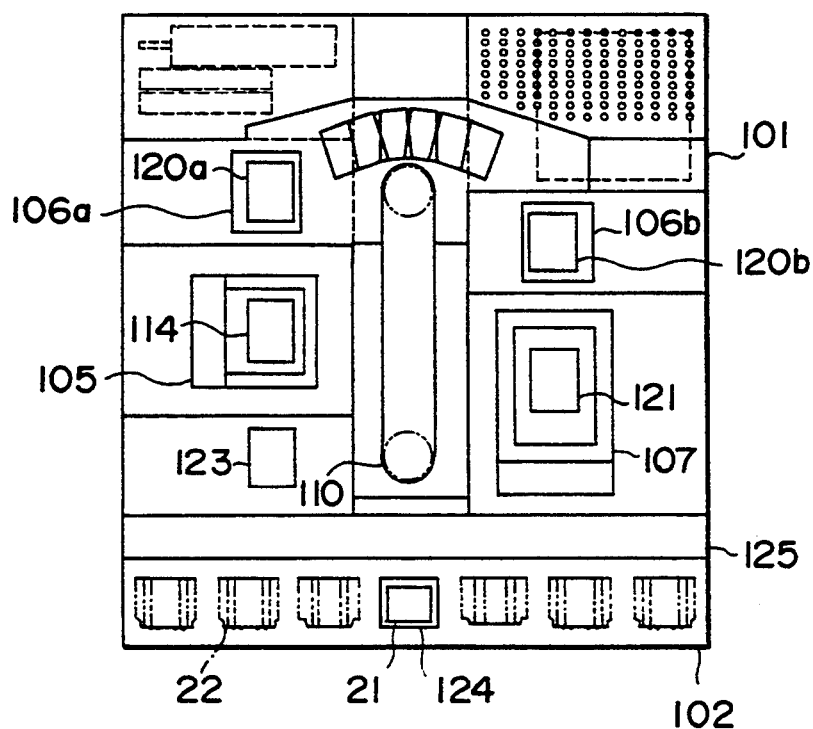
FIGS. 57 to 59 respectively are a plan view, a front elevational view and a side elevational view which illustrate a semiconductor cleaning apparatus according to a twenty-fourth embodiment.

FIG. 57 is an overall structural view which illustrates a semiconductor cleaning apparatus according to a twenty-fourth embodiment. The semiconductor cleaning apparatus has a cleaning apparatus body 101 for performing each step of the cleaning process and a loader/unloader portion 102. The cleaning apparatus body 101 has, at the central portion thereof, a product conveyance portion 110 disposed along the longitudinal direction of the cleaning apparatus. The product conveyance portion 110 has a conveyance robot having a movement shaft in the longitudinal direction of the cleaning apparatus and a rotational shaft for rotating a cassette hand 110h. On the two sides of the product conveyance portion 110, a cleaning wafer cassette retaining frame 123, a cleaning chamber 114 of a cleaning portion 105, water cleaning chambers 120a and 120b of water cleaning portions 106a and 106b and a drying chamber 121 of a drying portion 107 are disposed to form two lines extending in the longitudinal direction of the cleaning apparatus. The loader/unloader portion 102 is disposed at an end portion of the product conveyance portion 110 in the direction of the width of the cleaning apparatus to have a long length, the loader/unloader portion 102 having six product cassette retaining frames and one cleaning cassette retaining frame 124. As a result, six product cassettes 22 and one cleaning cassette 21 can be placed simultaneously. Further, a shifting robot for shifting the wafer between the product cassette 22 placed in the loader/unloader portion 102 and the cleaning cassette 21 is disposed adjacent to the loader/unloader portion 102.

Figure 58:
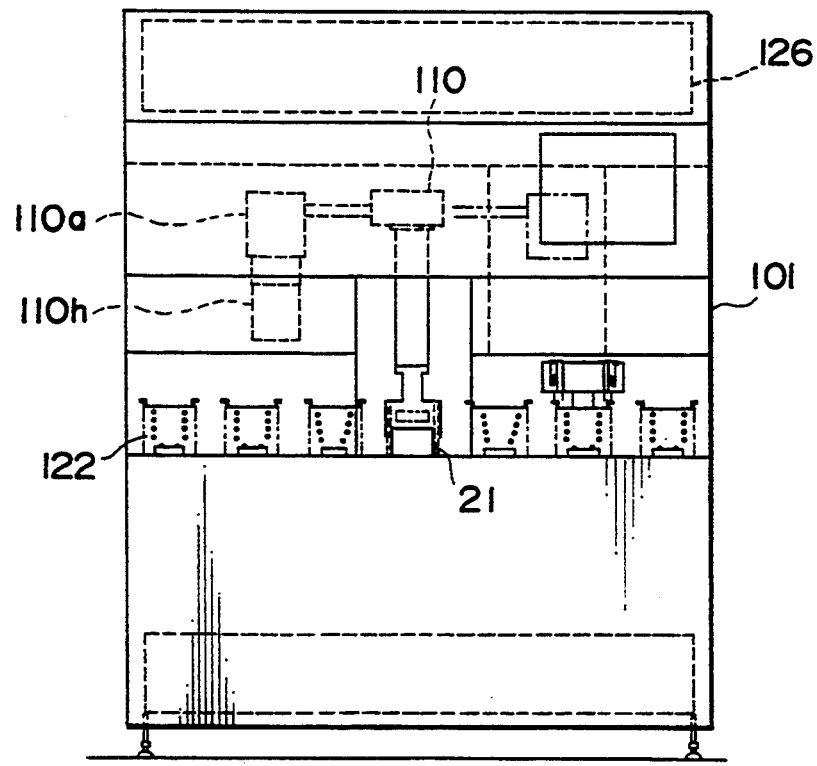

FIG. 58 is a front elevational view which illustrates the semiconductor cleaning apparatus shown in FIG. 57. Reference numeral 126 represents an air conditioning filter disposed on a cleaning portion 105, water cleaning portions 106a and 106b and a drying portion 107 of the semiconductor cleaning apparatus, the air conditioning filter 126 being arranged to supply clean air.

Figure 59:
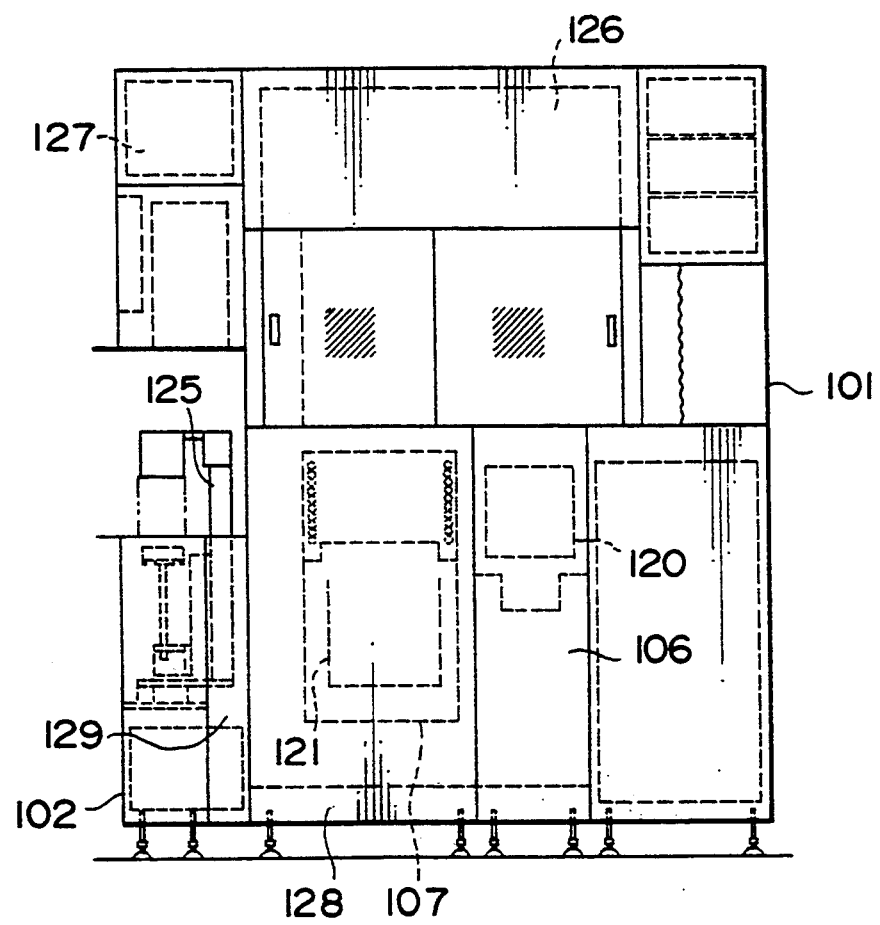

FIG. 59 is a side elevational view which illustrates the semiconductor cleaning apparatus shown in FIG. 57. Reference numeral 127 represents an air conditioning filter for supplying clean air to the loader/unloader portion 102, 128 represents a discharge portion for discharging air from the cleaning portion 105, the water cleaning portions 106a and 106b and the drying portion 107 of the semiconductor cleaning apparatus, and 129 represents a discharge portion for discharging air from the loader/unloader portion 102.

The operation will now be described. The product cassette 22 accommodating the wafer is placed on the product cassette retaining frame of the loader/unloader portion 102. The shifting robot 125 takes out the wafer from the product cassette 22 to shift the wafer to the cleaning cassette 21 placed on the cleaning wafer cassette retaining frame 124. The cleaning cassette 21 thus accommodating the wafer is held by the cassette hand 110h of the product conveyance portion 110 to be shifted to the cleaning wafer cassette retaining frame 123 in which the cleaning cassette 21 is then on standby. Then, the product conveyance portion 110 sets the cleaning cassette 21 into the cleaning chamber 114 of the cleaning portion 105. After the wafer in the cleaning cassette 21 has been cleaned in a predetermined manner, the product conveyance portion 110 sets the cleaning cassette 21 into the water cleaning chamber 120a of the first water cleaning portion 106a. After the wafer has been cleaned with water in a predetermined manner, the product conveyance portion 110 sets the cleaning cassette 21 into the water cleaning chamber 120b of the second water cleaning portion 106b so as to be cleaned with water. By sequentially cleaning the wafer in the two water cleaning chambers 120a and 120b, the time required to complete the water cleaning process can be shortened and an assured water cleaning process can be expected.

The product conveyance portion 110 sets the cleaning cassette 21, which has been cleaned with water, into the drying chamber 121 of the drying portion 107. After drying has been completed, the product conveyance portion 110 takes out the cleaning cassette 21 from the drying chamber 121 to shift the cleaning cassette 21 onto the cleaning wafer cassette retaining frame 124. The shifting robot 125 takes out the wafer from the cleaning cassette 21 placed on the cleaning wafer cassette retaining frame 124 to shift the wafer to an empty product cassette placed on the product cassette retaining frame.

Clean air blown out of the air conditioning filter 126 passes through the semiconductor cleaning apparatus body 101 and is discharged through the discharge portion 128. On the other hand, clean air blown out of the air conditioning filter 127 passes through the loader/unloader portion 102 and is discharged through the discharge portion 129.

Figure 60:
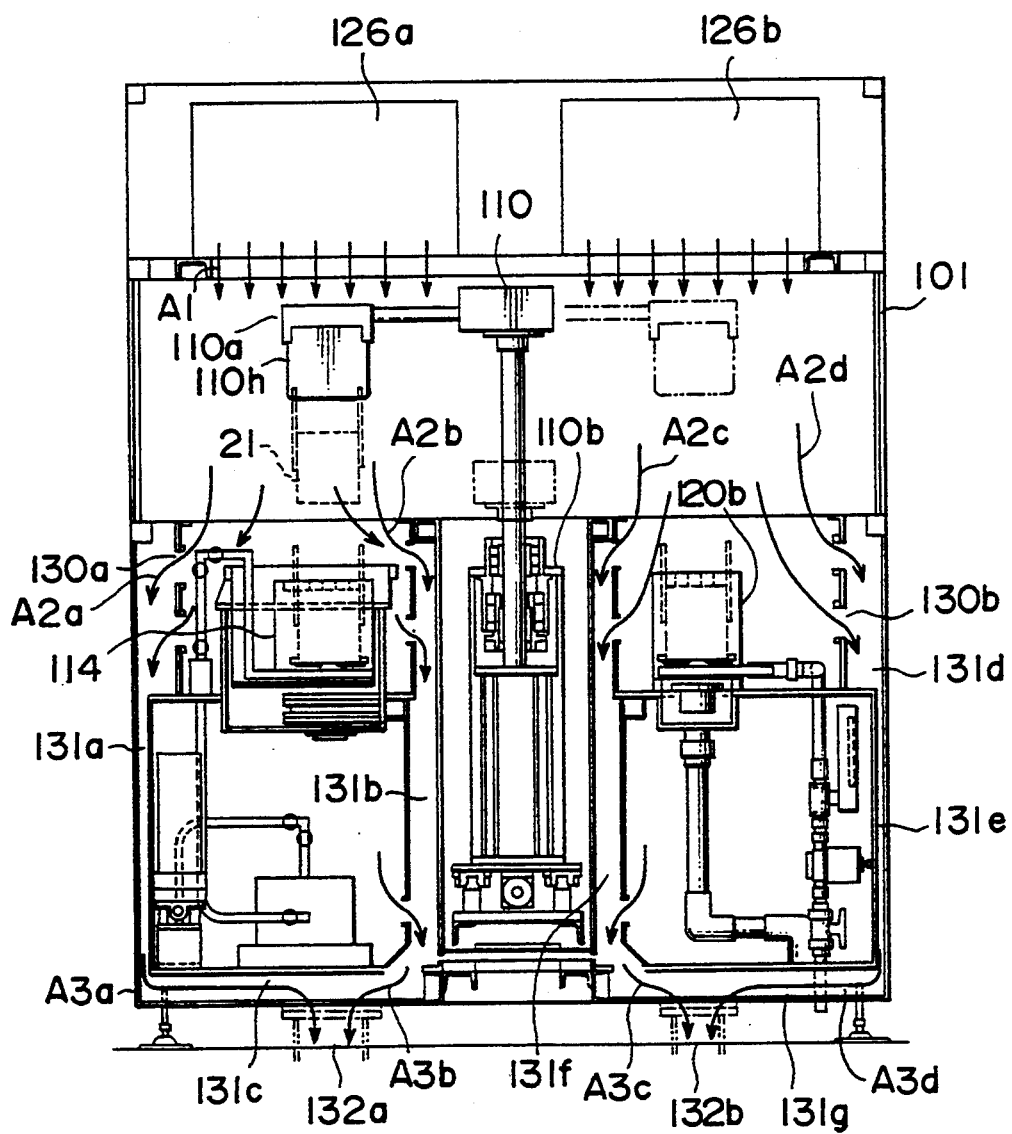
FIG. 60 is a cross sectional view which illustrates the detailed internal structure of the cleaning apparatus according to the twenty-fourth embodiment.

The air flow in the semiconductor cleaning apparatus 101 will now be described. FIG. 60 is a front elevational and cross sectional view which illustrates the detailed structure of the inside of the semiconductor cleaning apparatus shown in FIG. 57. Reference numerals 126a and 126b represent air conditioning filters disposed above the cleaning chamber 114 of the cleaning portion 105 and water cleaning chambers 120a and 120b of the water cleaning portions 106a and 106b, the air conditioning filters 126a and 126b being arranged to supply clean air. Reference numerals 130a and 130b represent discharge ports for sucking and discharging air around the cleaning chamber 114 and the water cleaning chambers 120a and 120b. Reference numerals 131a to 131g represent discharge ducts connected to the discharge ports 130a and 130b. Reference numerals 132a and 132b represent discharge pipes connected to the discharge ducts 131a to 131g and arranged to finally discharge air to the outside of the semiconductor cleaning apparatus 1. Reference numeral A1 represents downflows sent from the air conditioning filters 126a and 126b, A2a to A2d represent sucked air flows sucked into the discharge ports 127a and 127b and A3a to A3d represent discharge flows to be discharged into the discharge pipes 132a and 132b by way of the discharge ducts 128a to 128g.

The downflows A1 blown out of the air conditioning filters 26a and 126b pass through the product conveyance portions 110 and 110a, the cassette hand 110h and the cleaning cassette 21 to be sucked, as designated by A2a to A2d, through the discharge port 130a formed around the cleaning chamber 114 of the cleaning portion 105 and the discharge port 130b formed around the water cleaning chamber 120b of the water cleaning portion 106b. Then, the sucked air is discharged from the discharge ducts 131a to 131f to the discharge pipes 132a and 132b as designated by discharge flows A3a to A3d. As a result, the downflows A1 in the upper portions of the cleaning chamber 114 and the water cleaning chamber 120 trap chemical mist generated in the cleaning chamber 114, and then the downflows A1 are equal to sucked air flows A2a to A2d which are sucked into the discharge ports 130a and 130b. Therefore, diffusion of the chemical mist above the cleaning chamber 114 can be prevented. Further, chemical mist can be trapped by the downflows A1, the chemical mist being generated in the cassette hand 110h and the cleaning cassette 21 at the time of, by the product conveyance portion 110a, upwardly taking out the cassette hand 110h and the cleaning cassette 21 immersed in the cleaning solution in the cleaning chamber 114. Therefore, the chemical mist is, together with the sucked air flows A2a to A2d, discharged to the discharge pipes 132a and 132b. As a result, diffusion of the chemical mist generating during the conveyance can be prevented.

Although the cleaning apparatus according to this embodiment is a cassette-type apparatus using a cleaning cassette, this embodiment may, of course, be adapted to a cassette-less cleaning apparatus which does not use a cleaning cassette but directly handles the wafer.

Twenty-Fifth Embodiment

Figure 61:
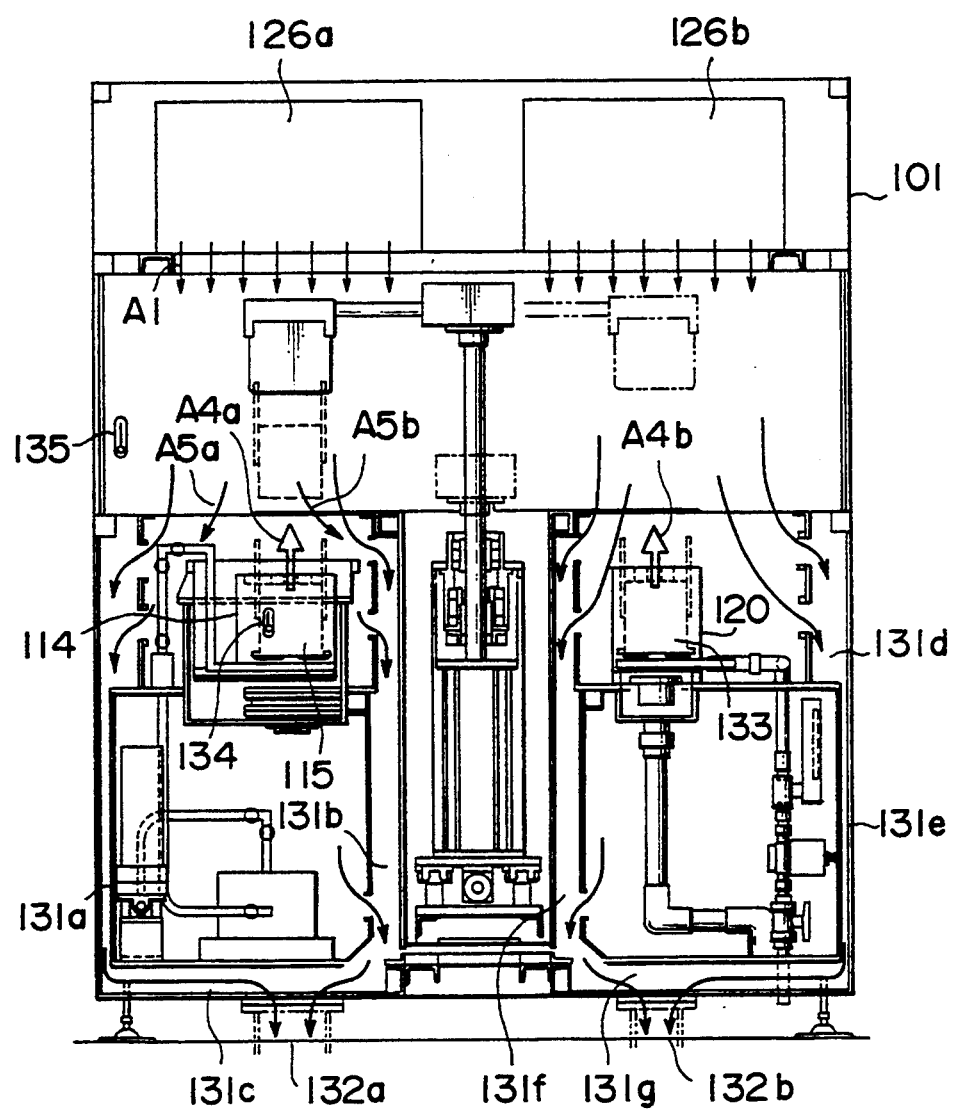
FIG. 61 is a cross sectional view which illustrates a cleaning apparatus according to a twenty-fifth embodiment.
Figure 62:
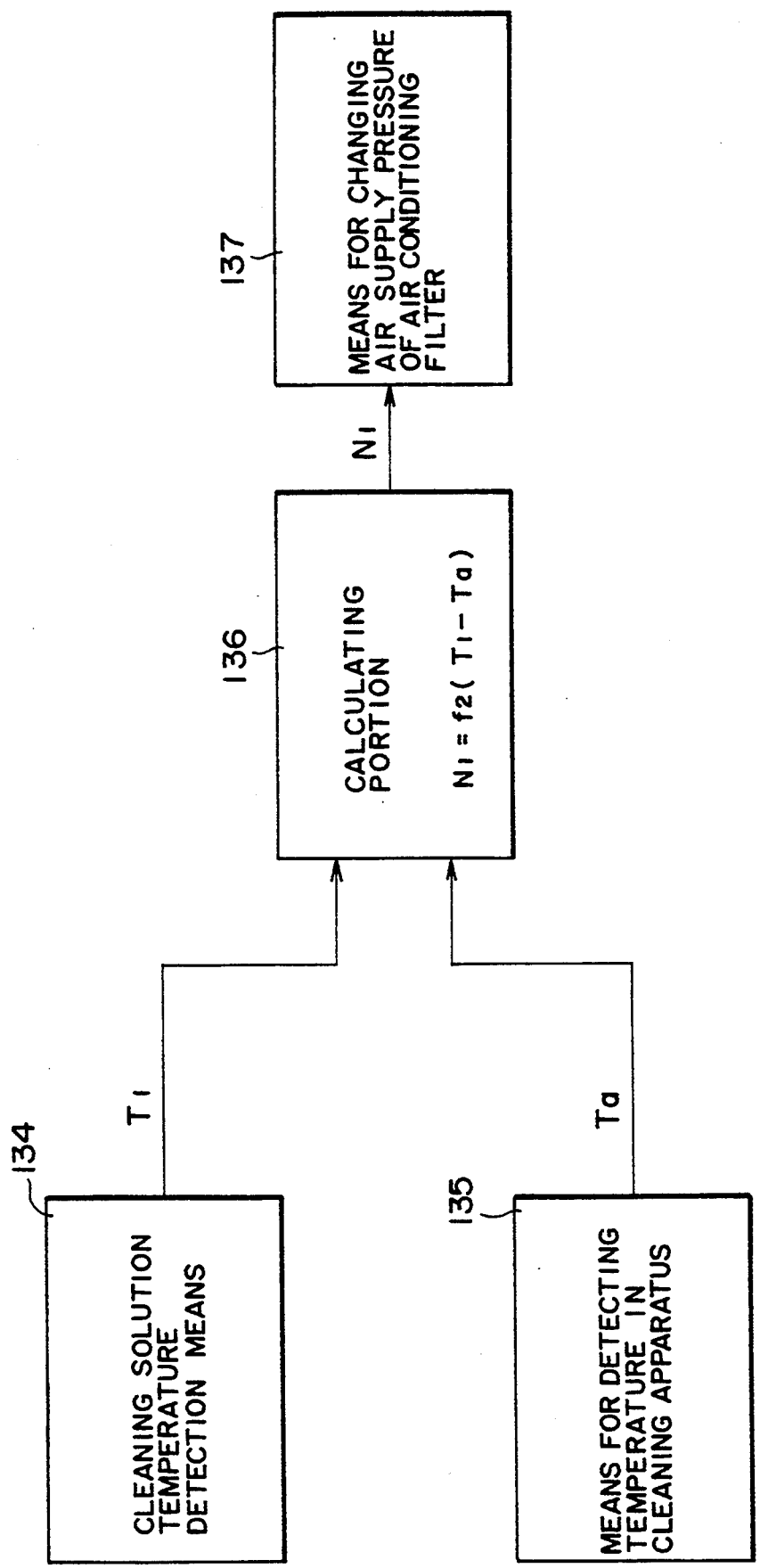
FIG. 62 illustrates a control sequence for controlling the cleaning apparatus according to the twenty-fifth embodiment.

FIG. 61 is a front elevational and cross sectional view which illustrates the inside portion of a semiconductor cleaning apparatus body according to a twenty-fifth embodiment. FIG. 62 illustrates a control sequence employed in the semiconductor cleaning apparatus shown in FIG. 61.

Referring to the drawings, reference numeral 133 represents pure water enclosed in the water cleaning chamber 120, A4a and A4b represent upflows of natural convections, and A5a and A5b represent downflows immediately above the cleaning chamber 114 and the water cleaning chamber 120. Reference numeral 134 represents means for detecting the temperature of the cleaning solution for detecting temperature T1 of the cleaning solution enclosed in the cleaning chamber 114. Reference numeral 135 represents temperature detection means for detecting temperature Ta in the cleaning apparatus, and 136 represents a calculation portion for calculating control output N1 from means 137 for changing the pressure of air to be supplied from the air conditioning filter in accordance with output T1 from the means 34 for detecting the temperature of the cleaning solution and output Ta from the temperature detection means.

The cleaning solution 115 in the cleaning chamber 114 and dried vapor in the drying chamber 121 are set to different temperatures if the process, such as the light etching and the resist removal, is different. It has been known that the rises of the temperatures of the upflows A4a and A4b of the natural convections generated above the cleaning chamber 114 and the drying chamber 121 are in proportion to the difference between the temperature T1 of the cleaning solution, the temperature T2 of dried vapor and the temperature Ta in the cleaning apparatus, the rises of the temperature being expressed by Equation 1:

$$V1 = f1(T1 - Ta) \tag{1}$$

where V1 is the speed of the upward movement of the upflow of the natural convection and f1 is a function of the temperature difference.

Since the speed V1, at which the chemical mist 118 and dried vapor are moved upwards while wafting on the natural convections A4a and A4b, is raised in proportion to the rise in the temperature T1 of the cleaning solution and the temperature of dried vapor, the pressure for supplying air from the air conditioning filter must be changed in accordance with the temperature T1 of the cleaning solution and the temperature T2 of dried vapor in order to restrict the speed V1. The air supply velocity (supply pressure) V2 of the air blower and the rotational speed N1 of the air supply motor usually hold a proportional relationship. Therefore, the rotational speed N1 of the air supply motor must be control to meet Equation 2:

$$N1 = f2(T1 - Ta) \tag{2}$$

where f2 is a function of the temperature difference.

In order to achieve the foregoing control sequence, the means 134 for detecting the temperature of the cleaning solution and the temperature detection means 135 are used to detect the temperature T1 of the cleaning solution and the temperature Ta in the cleaning apparatus. Further, signals denoting the results of detections are, as input signals, supplied to the calculation portion 36 to perform calculations in accordance with Equation 3. Then, the rotational speed N1 of the air supply motor is transmitted. The rotational speed N1 of the air supply motor is, as an input signal, supplied to the means 137 for changing the pressure of air to be supplied from the air conditioning filter to change the rotational speed of the air supply motor.

Figure 63:
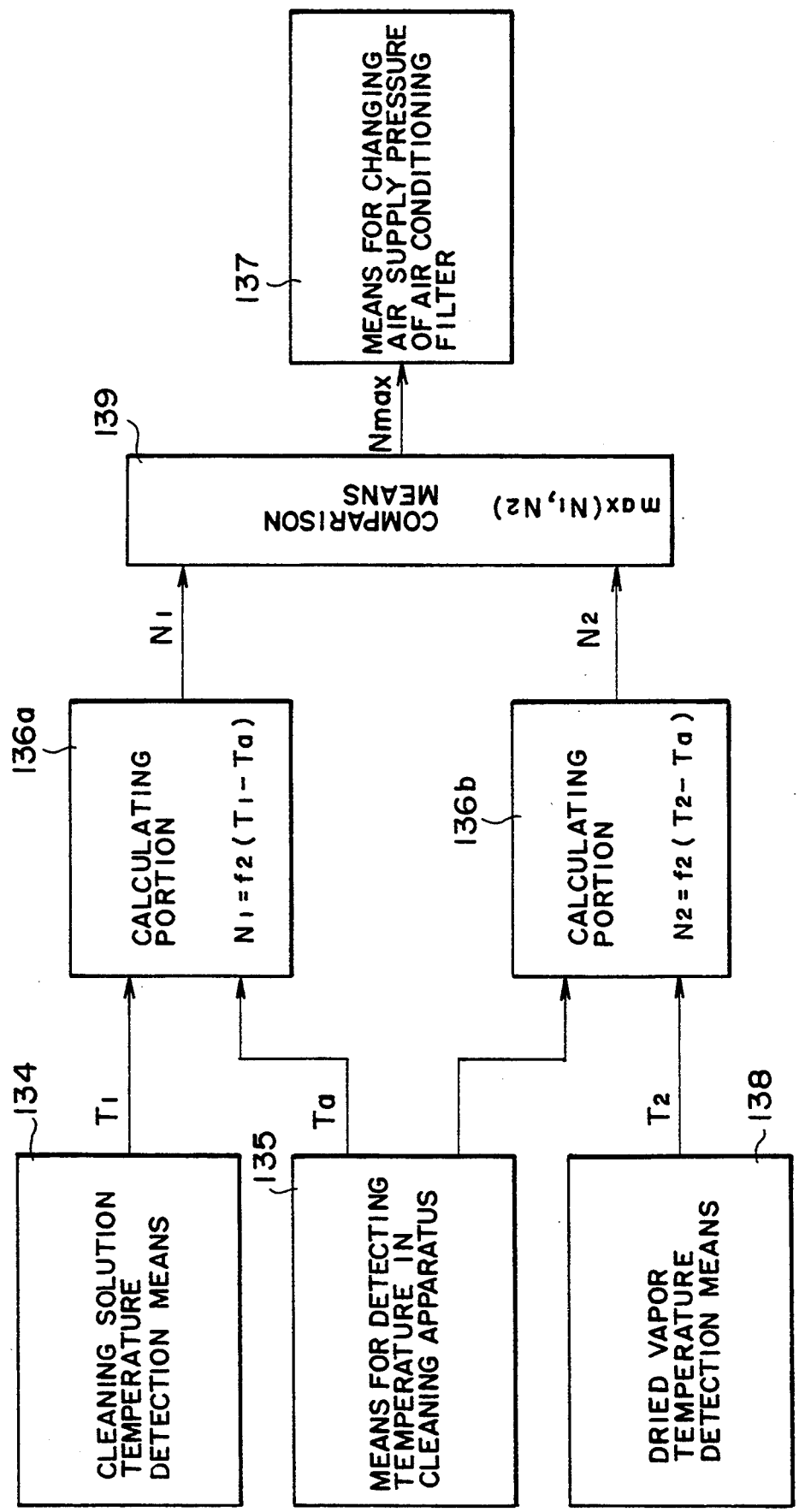
FIG. 63 illustrates a control sequence according to a modification of the twenty-fifth embodiment.

If plural temperatures are set in the cleaning apparatus, the air supply pressure must be controlled to be adaptable to the highest temperature among the plural temperatures. FIG. 63 illustrates a control sequence for a semiconductor cleaning apparatus to be employed when plural temperatures are present. Referring to FIG. 63, reference numerals 136a and 136b represent calculation portions, 138 represents means for detecting the temperature of dried vapor for detecting temperature T2 of dried vapor, and 139 represents comparison means.

The calculation means 136a calculates the rotational speed N1 of the air supply motor corresponding to the temperature T1 of the cleaning solution, while the calculation portion 136b calculates the rotational speed N2 of the air supply motor corresponding to the temperature T2 of the dried vapor. The comparison means 139 subjects the two rotational speeds N1 and N2 to a comparison to transmit the larger rotational speed Nmax. The rotational speed Nmax is, as an input signal, supplied to the means 137 for changing the pressure of air to be supplied from the air conditioning filter to change the rotational speed of the air supply motor.

The means 137 for changing the pressure of air to be supplied from the air conditioning filter may be means for controlling the frequency of the power source for the air supply motor. Means for controlling the power supply voltage of the air supply motor may, of course, be employed to obtain a similar effect.

If the discharge flow is so changed that the pressure of the semiconductor cleaning apparatus body 101 and the pressure on the outside of the apparatus are balanced with each other or the same is made lower than the pressure on the outside of the apparatus when the air supply pressure from the air conditioning filter is changed, diffusion of the chemical mist to the outside of the semiconductor cleaning apparatus body 101 can be prevented.

Since this embodiment is so arranged that the air supply pressures from the air conditioning filters 126a and 126b are changed to correspond to the temperature of the cleaning solution in the cleaning portion 105 and the temperature of vapor in the drying portion 107 as described above, the air supply pressure can be raised if the temperature of the cleaning solution in the cleaning portion 105 or the temperature of vapor in the drying portion 107 is too high. Therefore, an effect of restricting downflows can be obtained to correspond to the rising force of the natural convections generated in the cleaning portion 105 and the drying portion 107. As a result, adhesion of chemical mist generated in the cleaning portion 105 and that of vapor in the drying portion 107 to the component units of the cleaning apparatus, which causes the component units to be corroded, can be prevented. Adhesion to the wafer, which causes a defect, and outward diffusion causing similar corrosion and defects can be prevented.

This embodiment may be adapted to a cassette-type cleaning apparatus using a cleaning cassette or a cassette-less type cleaning apparatus for directly handling the wafer.

Twenty-Sixth Embodiment

Figure 64:
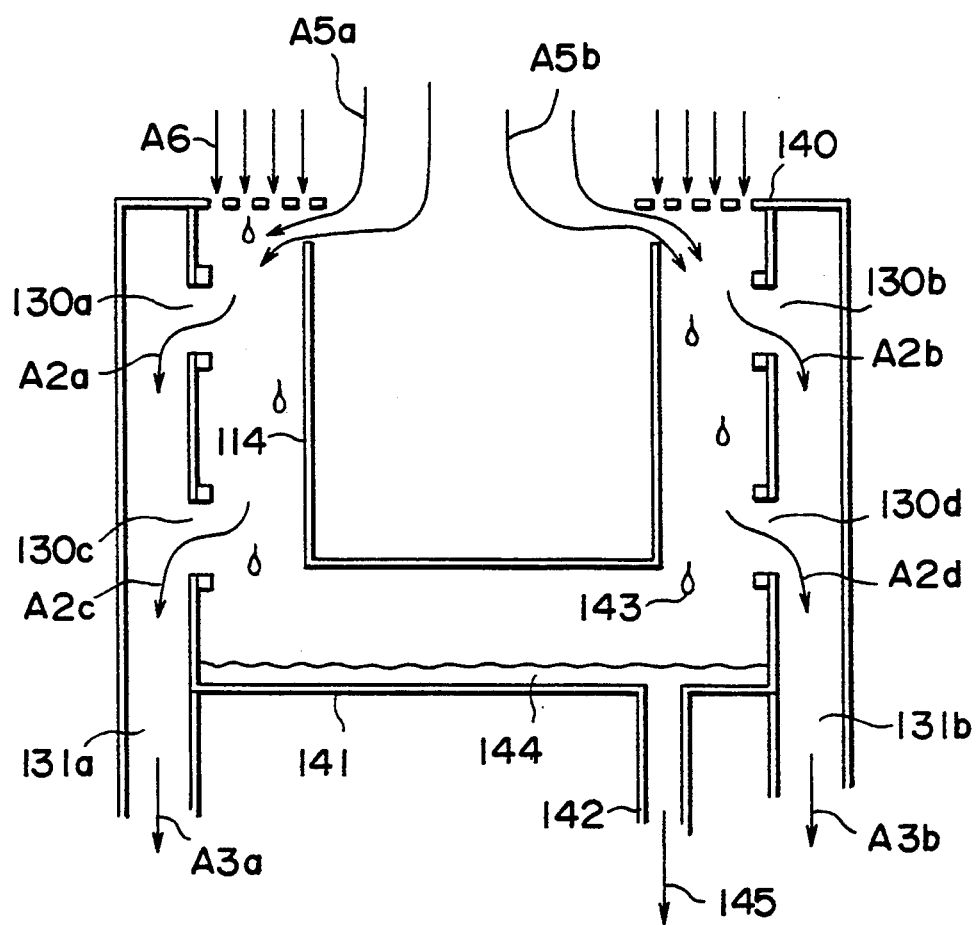
FIG. 64 is a cross sectional view which illustrates a portion including a cleaning chamber according to a twenty-sixth embodiment.

FIG. 64 is a front cross sectional view which illustrates the detailed peripheral structure in the vicinity of a cleaning chamber of a semiconductor cleaning apparatus according to a twenty-sixth embodiment. Referring to FIG. 64, reference numerals 130a to 130d represent discharge ports for discharging air around the cleaning chamber 114, and 140 represents a panel above the cleaning chamber 114, the panel 140 being arranged to be opened above the cleaning chamber 114 and having a multiplicity of small apertures formed in a portion covering the residual regions. Reference numeral 141 represents a drain panel for receiving cleaning droplets 143 received by the panel 140 above the cleaning chamber 114 and dropped through the multiple-aperture portion. Reference numeral 142 represents a drain discharge port for discharging drainage 144 received by the drain panel 141. Reference numeral 145 represents a discharge solution flow discharged through the drain discharge port 142. Reference numerals A2a to A2d represent suction flows to be sucked into the discharge ports 130a to 130d, A3a to A3b represent discharge flows to be discharged through the discharge ducts 131a to 130b, A5a and A5B represent downflows above the cleaning chamber 114 which has reached the positions above the cleaning chamber 114, and A6 represents a downflow above the panel 140 above the cleaning chamber 114 which has reached the panel 140 above the cleaning chamber 114.

After the wafer in the cleaning cassette 21 set in the cleaning chamber 114 has been cleaned in a predetermined manner, the cleaning cassette 21 is raised by the product conveyance portion 110 to be shifted to a water cleaning chamber 120a. At this time, the corrosion of the apparatus due to drops of the cleaning solution 115 adhered to the cleaning cassette 21 into the portions except for the cleaning chamber 114 is prevented by covering, with the drain-receiving panel 140 above the cleaning chamber 114, the cleaning chamber 114, the water cleaning chambers 120a and 120b and the drying chamber 121, the panel 140 being opened above the chambers. Droplets of the cleaning solution received by the panel 140 pass through the multiple aperture portion of the panel 140 to become cleaning droplets 143 which are gathered by the drain panel 141 as drainage 144. Then, the drainage 144 is the discharge flow 145 discharged to the outside of the apparatus through the drain discharge port 142.

Since the panel 140 above the chamber is a multiple-aperture plate except for the opening above the chamber, the downflows A1 can be uniformly formed on entire surface of the semiconductor cleaning apparatus body 101 without becoming stagnant. Further, the downflows A5a and A5b above the chamber are formed above the cleaning chamber 114, and the downflows A6 on the chamber passing through the aperture portion of the panel 140 above the chamber are formed. The downflows A5a and A5b above the chamber and the downflow A6 on the panel above the chamber are sucked into the discharge ports 130a to 130d to be discharged through the discharge ducts 131a and 131b.

By changing the diameter of the small aperture formed in the panel 140 above the chamber and the aperture ratio, the proportion of the downflows A5a and A5b above the chamber and the downflow A6 on the panel above the chamber can be changed.

This embodiment is arranged in such a manner that the panel 140 above the chamber is opened only above the chamber and the residual portion of the panel covering the other portions is a multiple aperture plate, the apertures being connected to the discharge pipe. Therefore, stagnant air due to the inhibition of the downflows by the panel 140 above the chamber can be prevented and all air flows can be made downflows. Further, the lower portion of the multiple aperture plate is made to be the drain receiver so that chemical droplets which drop from the wafer, which is being conveyed, can be received.

Although the description has been about the cassette-type cleaning apparatus using the cleaning cassette, this embodiment may, of course, be adapted to a cassette-less cleaning apparatus which directly handles the wafers.

Twenty-Seventh Embodiment

Figure 65:
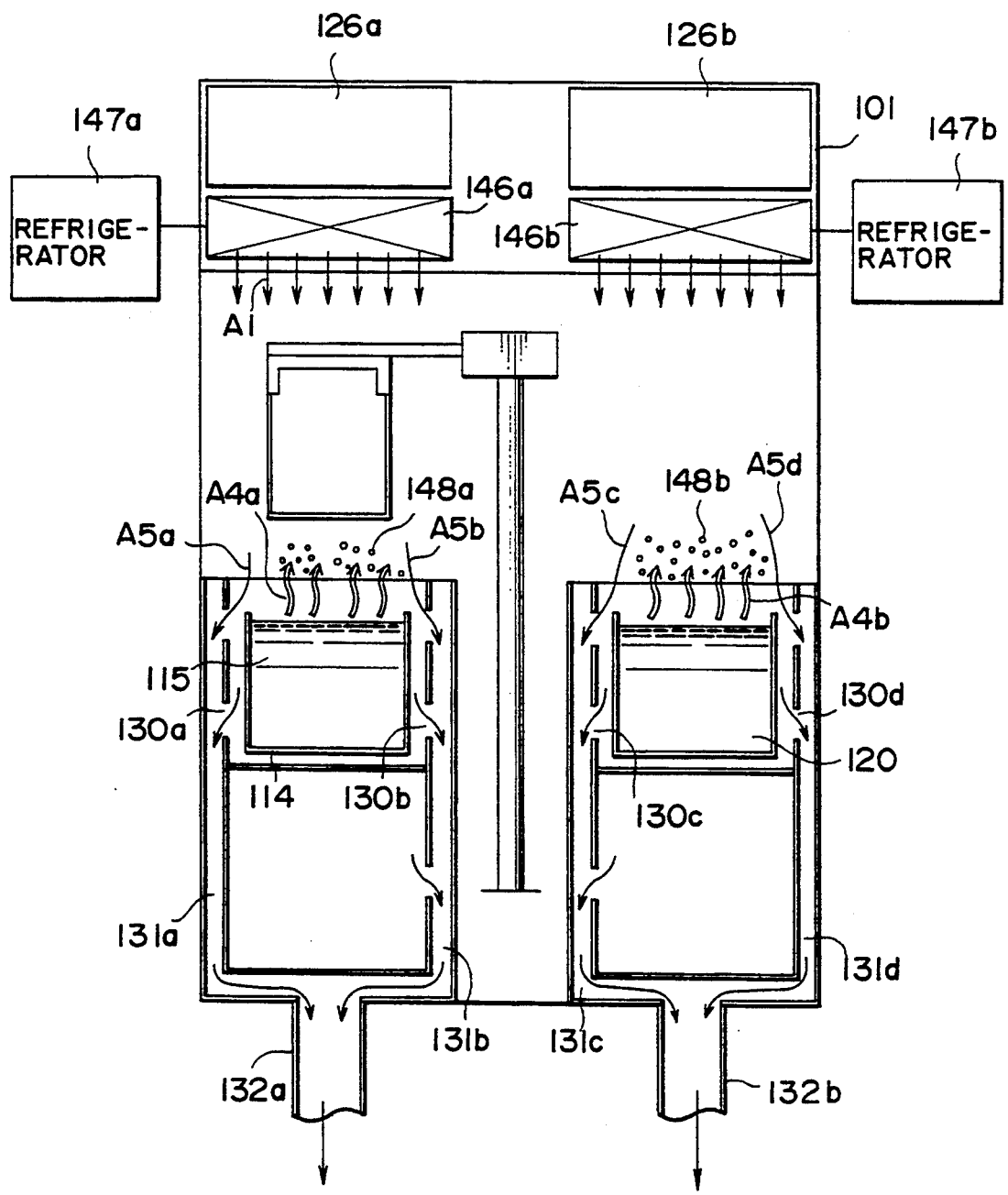
FIG. 65 is a cross sectional view which illustrates a portion including a cleaning chamber according to a twenty-seventh embodiment.
Figure 66:
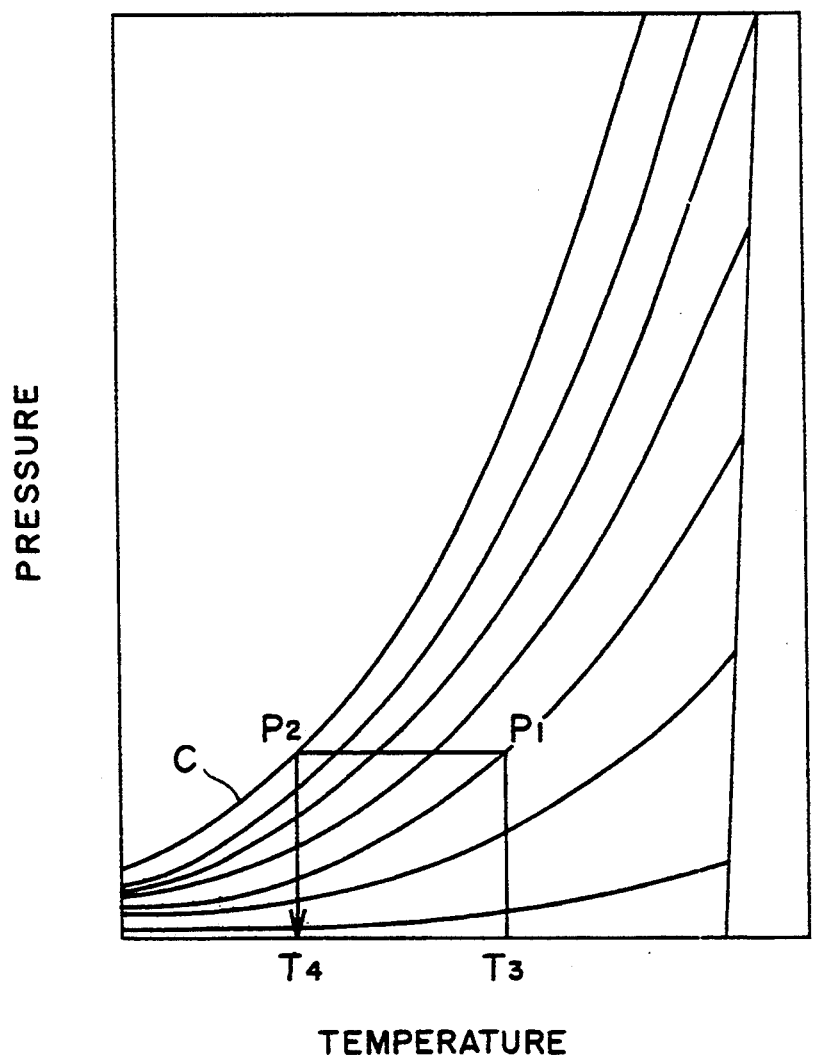
FIG. 66 is a graph which illustrates the relationship between the temperature and pressure of wet air and humidity.
Figure 67:
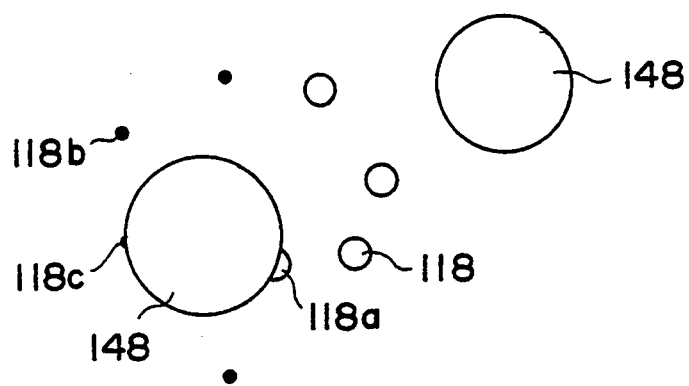
FIG. 67 is a schematic view which illustrates a state where chemical mist is trapped by water mist in a twenty-seventh embodiment.

FIG. 65 is a front cross sectional view which illustrates the detailed structure of a portion including a cleaning chamber of a semiconductor cleaning apparatus according to a twenty-seventh embodiment. FIG. 66 is a graph of the relationship between the temperature and pressure of air as a function of humidity. FIG. 67 is a schematic view which illustrates a state where chemical mist is trapped by water mist.

Referring to FIG. 65, reference numerals 146a and 146b represent cooling heat-exchangers respectively disposed in the rear of air conditioning filters 126a and 126b and arranged to cool the downflows A1. Reference numerals 147a and 147b represent refrigerators for supplying a cooling medium to the cooling heat-exchangers 146a and 146b, and 148a and 148b represent water mist condensed at the intersection of the cooled downflows A1 and hot upflows A4a and A4b. Referring to FIG. 66, symbol C represents saturated vapor lines, P1 represents a state in the cleaning apparatus, P2 represents a state of the position at which the downflows and the upflows of the natural convection intersect, Ta represents the temperature in the state P1, and T3 represents the temperature in the state P2. Referring to FIG. 67, reference numeral 118 represents chemical mist, 148 represents water mist, 118a represents chemical mist dissolved in water mist, 118b represents vapor of the chemical solution, and 118c represents vapor of the chemical solution dissolved in water mist.

Chemical mist 118 moving while wafting on the upflows A4a and A4b of the natural convections behave as finite size particles having inertia, while chemical vapor 118b shows a diffusive behavior. Therefore, when the chemical mist 118 and the chemical vapor 118b are trapped by the downflows A5a to A5d on the chamber, the chemical mist 118 is sometimes deviated from the lines of the downflows A5a to A5d on the chamber because the chemical mist 118 has the inertia force. On the other hand, the chemical vapor 118b diffuses widely with respect to a chemical species as compared with the diffusion of the air flows. Therefore, it is difficult to completely insulate the chemical mist 118 and the chemical vapor 118b by only the downflows of the air flows. Accordingly, the temperature of the downflow A1 is made to be lower than those of the cooling heat-exchangers 146a and 146b to form low temperature downflows A5a to A5d in the chamber intersecting the hot upflows A4a and A4b of the natural convections generated in the cleaning chamber 114.

Change in the humidity in the air flow will now be described with reference to a graph about the wet air flows shown in FIG. 66. Assuming that the states of the upflows A4a and A4b of the natural convections at temperature T3 which is higher than the ambient temperature are P1, the conflict between the upflows A4a and A4b of the natural convections with the downflows A5a to A5d in the chamber causes the downflows A5a to A5d to lower the temperatures of the upflows A4a and A4b of the natural convections, resulting in state P2 to be shifted to the left parallel to the abscissa of the graph until it reaches saturated vapor line C at which condensation of water contained in the air flows is commenced. As a result, water mists 148a and 148b are generated. Assuming that the temperature at this time is T4, the temperature of the downflows A5a to A5b in the chamber must be so determined that the temperatures of the upflows A4a and A4b of the natural convections are lower than T4 after the intersection generate water mists 148a and 148b.

The chemical mist 118 and the chemical vapor 118b are dissolved into the generated water mist 148 and trapped by the water mist as the chemical mist 118a to be dissolved in the water mist and the chemical vapor 118c to be dissolved in the water mist. The water mist is, together with the suction flows, allowed to pass through the discharge ports 130a to 130d and the discharge ducts 131a to 131d and discharged through the discharge pipes 132a and 132b.

Since this embodiment is, as described above, arranged in such a manner that the heat exchangers 146a and 146b for cooling the supplied air and refrigerators 147a and 147b for supplying a cooling medium to the heat exchangers 146a and 146b are disposed in front of or in the rear of the first and second air conditioning filters 126a and 126b for supplying cleaned air to the cleaning portion, the water cleaning portion and the drying portion. As a result, the cooled air supplied from the air conditioning filters 126a and 126b and the upflows of the natural convections of vapor generated in the cleaning chamber in the cleaning portion or the upflows of the natural convections of vapor generated in the vapor chamber of the drying portion intersect at a position adjacent to the top end of the cleaning chamber or the vapor chamber to condense steam in the cooling air to generate water mist. The water mist traps the chemical mist or the drying vapor so that the diffusion of the chemical mist or the vapor into the cleaning apparatus or to the outside of the apparatus causing the corrosion of the apparatus or defects of the wafer is prevented.

Although the description has been about the cassette-type cleaning apparatus using the cleaning cassette, this embodiment may, of course, be adapted to a cassette-less cleaning apparatus that does not use the cleaning cassette and that directly handles the wafer.

Twenty-Eighth Embodiment

Figure 68:
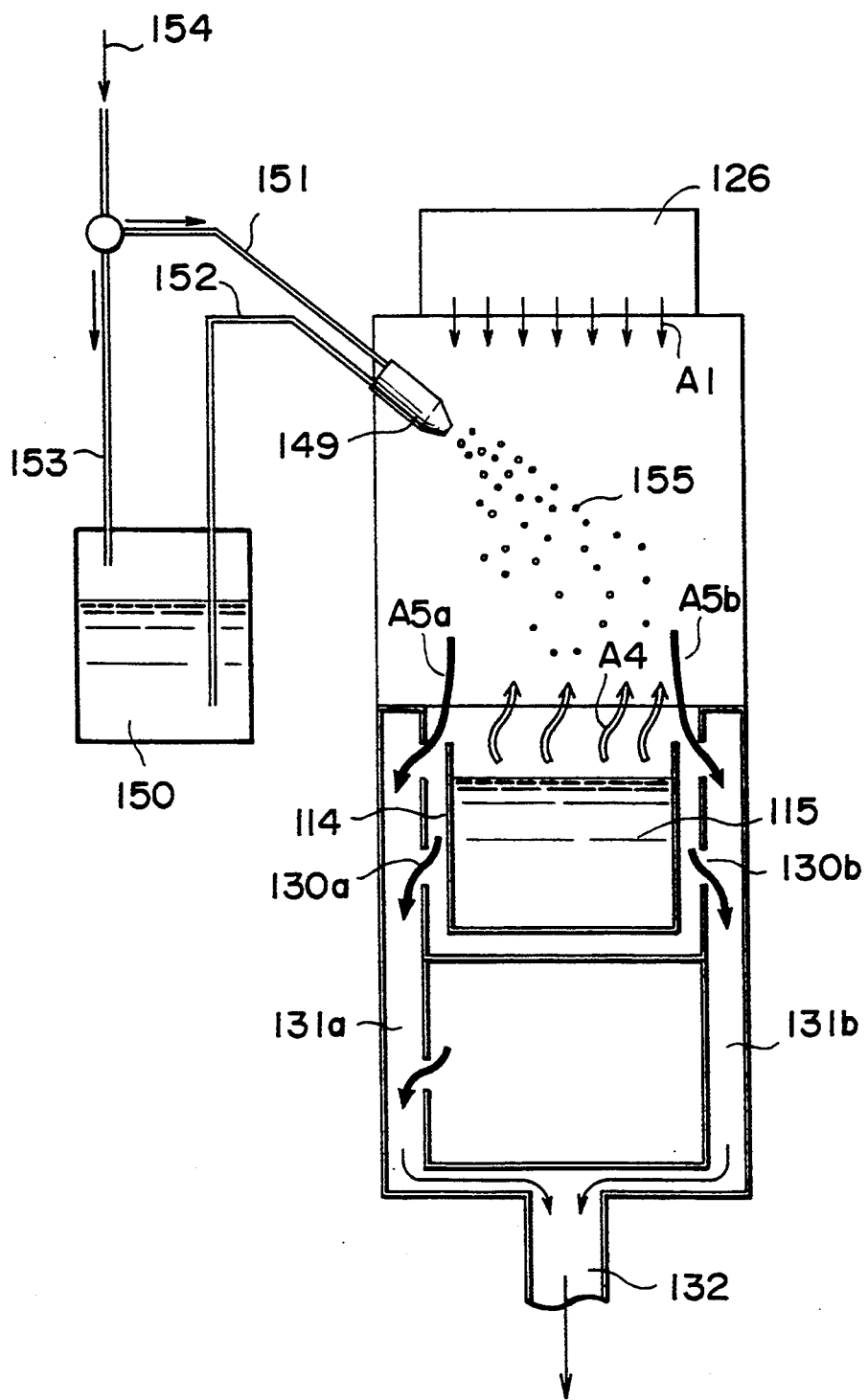
FIGS. 68 to 73 respectively are cross sectional views which illustrate the structure of a portion including a cleaning chamber according to twenty-eighth embodiment to thirty-third embodiments.

FIG. 68 is a front elevational and cross sectional view which illustrates the detailed structure of a portion including a cleaning chamber of a semiconductor cleaning apparatus according to a twenty-eighth embodiment. Referring to FIG. 68, reference numeral 149 represents a double-fluid nozzle, 150 represents a pure-water nozzle, 151 represents a gas pipe, 152 represents a solution pipe, 153 represents a gas pipe for supplying the solution under pressure, 154 represents inactive gas or clean air and 155 represents fine grain pure-water mist.

The inactive gas or clean air 154 is distributed into the gas pipe 151 and the gas pipe 153 for supplying the solution under pressure. These pipes are connected to the double-fluid nozzle 149. Pure water accumulated in the pure-water tank 150 is sent to the solution pipe 152 under the pressure of the inactive gas supplied from the gas pipe 153 for supplying the solution under pressure or the pressure of pure air 154. The inactive gas or clean air 154 is supplied to the double-fluid nozzle 149 through the gas pipe 151 and pure water is supplied to the same from the solution pipe 152. As a result, the fine-grain pure water mist 155 is generated. The fine-grain pure water mist 155, together with the downflow A1 and the downflows A5a and A5b on the chamber, reaches the position above the cleaning chamber 114 and traps the chemical mist 118 and the chemical vapor 118b by dissolving them as shown in FIG. 67. The pure-water mist 155, together with suction flows, passes through the discharge ports 130a and 130b and the discharge ducts 131a and 131b and then it is discharged through the discharge pipe 132.

Although this embodiment is so arranged that the fine grained pure water is made using the double-fluid nozzle 149, a supersonic or a rotative disc or a transparent wet film or a heating method made be used to obtain a similar effect.

This embodiment is, as described above, arranged in such a manner that a blow-out port of the double-fluid nozzle 149 for spraying clean air or the active gas 154 as the secondary fluid is formed in the rear of the first air conditioning filter 126 for supplying clean air to the cleaning portion, the water cleaning portion and the drying portion to mix the pure-water mist 155 into the downflows. Therefore, the water mist 155 traps the chemical mist generated in the cleaning chamber 114 of the cleaning portion or vapor generated from the steam chamber of the drying portion so that the diffusion of the chemical mist or the vapor into the cleaning apparatus or to the outside of the apparatus causing the corrosion of the apparatus or defects of the wafer is prevented.

This embodiment can be adapted to a cassette-type cleaning apparatus using the cleaning cassette and a cassette-less cleaning apparatus that does not use the cleaning cassette and that directly handles the wafer.

Twenty-Ninth Embodiment

Figure 69:
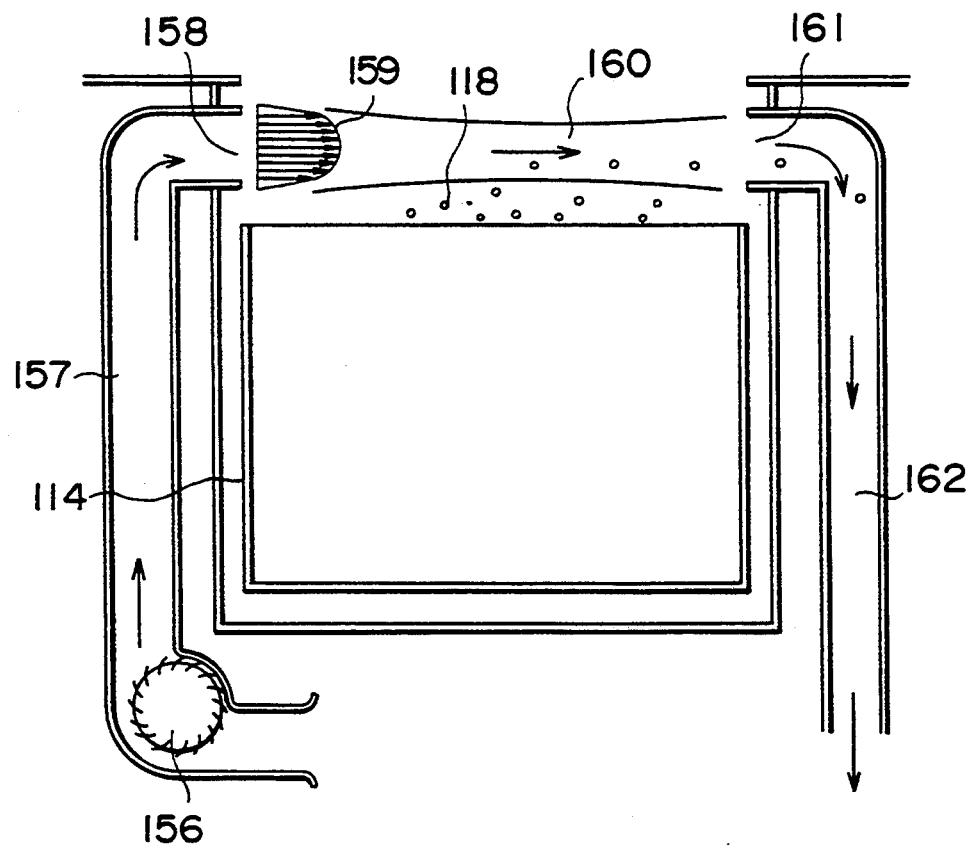

FIG. 69 is a front elevational and cross sectional view which illustrates the detailed structure of a portion including a cleaning chamber of a semiconductor cleaning apparatus according to a twenty-ninth embodiment. Referring to FIG. 69, reference numeral 156 represents an air-curtain blower, 158 represents an air-curtain blow-out port disposed on one side of the cleaning chamber 114 and having a uniform width, 157 represents an air-curtain air supply duct for establishing the connection between the air-curtain blower 156 and the air-curtain blow-out port 158, 159 represents distribution of the air-curtain blow-out velocity, 160 represents an air curtain formed above the cleaning chamber 114, 161 represents an air-curtain suction port formed on one side of the cleaning chamber 114 to face the air-curtain blow-out port 158, and 162 represents an air-curtain discharge duct for establishing the connection between the air-curtain suction port 161 and the discharge pipe.

The air curtain 160 supplied from the air-curtain blower 156 and blown out through the air-curtain blow-out port 158 via the air-curtain air supply duct 157 is formed to cover the portion above the cleaning chamber 114, and then it is sucked through the air-curtain suction port 161. Then, it is discharged into the discharge pipe via the air-curtain discharge duct 162. As a result, the portion above the cleaning chamber 114 is shielded by the air curtain 160 and, accordingly, the chemical mist generated in the cleaning chamber 114 is trapped by the air curtain 160 and sucked into the air-curtain discharge port 161. Therefore, diffusion of the chemical mist to the portion above the cleaning chamber 114 can be prevented.

This embodiment is so arranged that the air curtain 160 formed on the one side of the chamber and having an equal thickness in the widthwise direction of the chamber is blown out horizontally through the opening above the cleaning chamber of the cleaning portion and the vapor chamber of the drying portion, and the air-curtain suction port 161, uniform in the widthwise direction, is formed on the opposing side. Therefore, the rise of chemical mist generated from the cleaning chamber 114 of the cleaning portion and that of the vapor generated in the vapor chamber of the drying portion due to the natural convection is shielded by the air curtain 160 and recovered into the discharge duct 162. Therefore, the diffusion of the chemical mist or the vapor mist into the cleaning chamber or to the outside can be prevented.

This embodiment can be adapted to a cassette-type cleaning apparatus using the cleaning cassette and a cassette-less cleaning apparatus that does not use the cleaning cassette and that directly handles the wafer.

Thirtieth Embodiment

Figure 70:
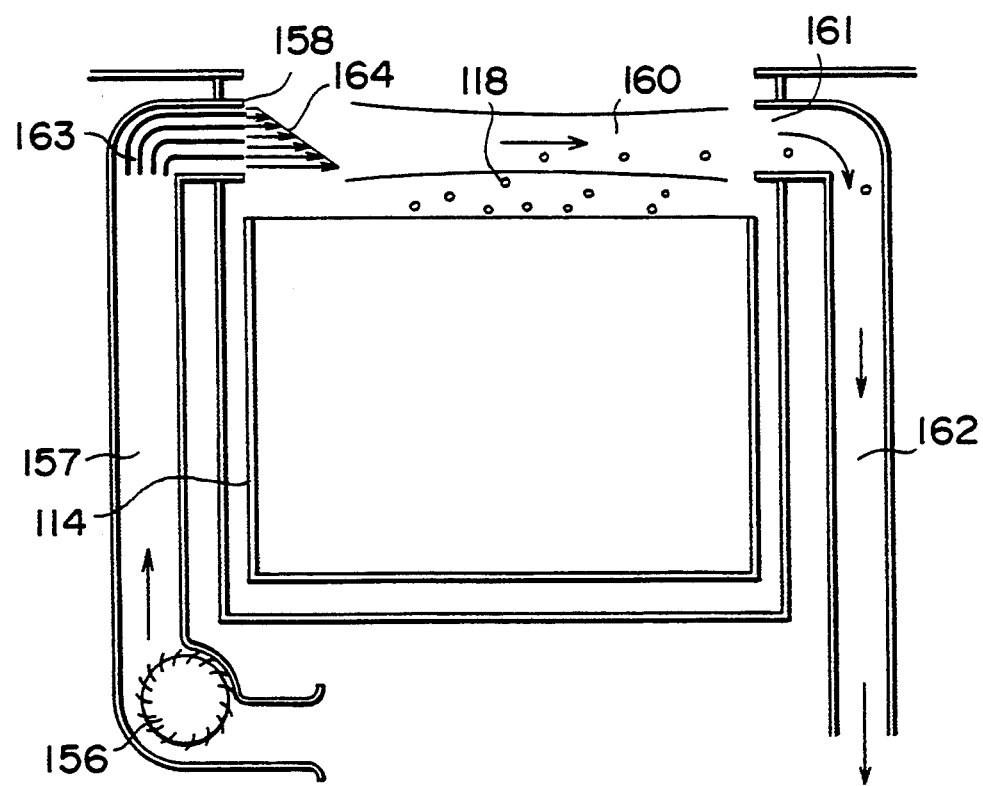

FIG. 70 is a front elevational and cross sectional view which illustrates the detailed structure of a portion including a cleaning chamber of a semiconductor cleaning apparatus according to a thirtieth embodiment. Referring to FIG. 70, reference numeral 156 represents an air-curtain blower, 158 represents an air-curtain blow-out port disposed on one side of the cleaning chamber 114 and having a uniform width, 157 represents an air-curtain air supply duct for establishing the connection between the air-curtain blower 156 and the air-curtain blow-out port 158, 160 represents an air curtain formed above the cleaning chamber 114, 161 represents an air-curtain suction port formed on one side of the cleaning chamber 114 to face the air-curtain blow-out port 158, 162 represents an air-curtain discharge duct for establishing the connection between the air-curtain suction port 161 and the discharge pipe, and 163 represents a current plate disposed immediately before the air-curtain blow-out port 158 and along the direction of the path of the air-curtain air supply duct 157, the length of the current plate 163 in the direction of the path being shortened in proportion to the distance from the cleaning chamber 114. Reference numeral 164 represents the distribution of the blowing velocity of the air curtain 160.

The air curtain 160 supplied from the air curtain blower 156 and blown out through the air-curtain blow-out port 158 via the air-curtain air supply duct 157 is formed to cover the portion above the cleaning chamber 114, and sucked through the air-curtain suction port 161. Then, the sucked air is discharged into the discharge pipe via the air-curtain discharge duct 162. At this time, the velocity gradient in the shear layer of the air curtain is reduced at the top end of the air curtain 160 and, accordingly, air induction from the space above the cleaning chamber 114 is reduced. Since the velocity gradient in the shear layer of the air curtain is enlarged at the lower end of the air curtain 160, the chemical mist generated from the cleaning chamber 114 is efficiently induced and trapped by the air curtain 160. As a result, the portion above the cleaning chamber 114 is effectively insulated by the air curtain so that the chemical mist generated from the cleaning chamber 114 is trapped by the air curtain 160 and then sucked into the air-curtain discharge port 161. Therefore, the diffusion of the chemical mist in the portion above the cleaning chamber 114 can be prevented.

This embodiment is, as described above, arranged in such a manner that a current grid or the current plate 163 having a length in the direction of the path which is shortened in proportion to the distance from the cleaning chamber 114 or the vapor chamber is disposed at the air-curtain blow-out port 158 to blow out the air curtain to form a layer-flow and the velocity distribution is so made that the velocity is gradually raised in inverse proportion to the chamber. Therefore, the velocity gradient in the shear layer of the air curtain adjacent to the generation source for the chemical mist and the vapor is enlarged. As a result, the chemical mist and the vapor are induced so that the insulating effect is improved and, accordingly, diffusion of the chemical mist and the vapor mist into the cleaning chamber 114 or to the outside can be prevented.

This embodiment can be adapted to a cassette-type cleaning apparatus using the cleaning cassette and a cassette-less cleaning apparatus that does not use the cleaning cassette and that directly handles the wafer.

Thirty-First Embodiment

Figure 71:
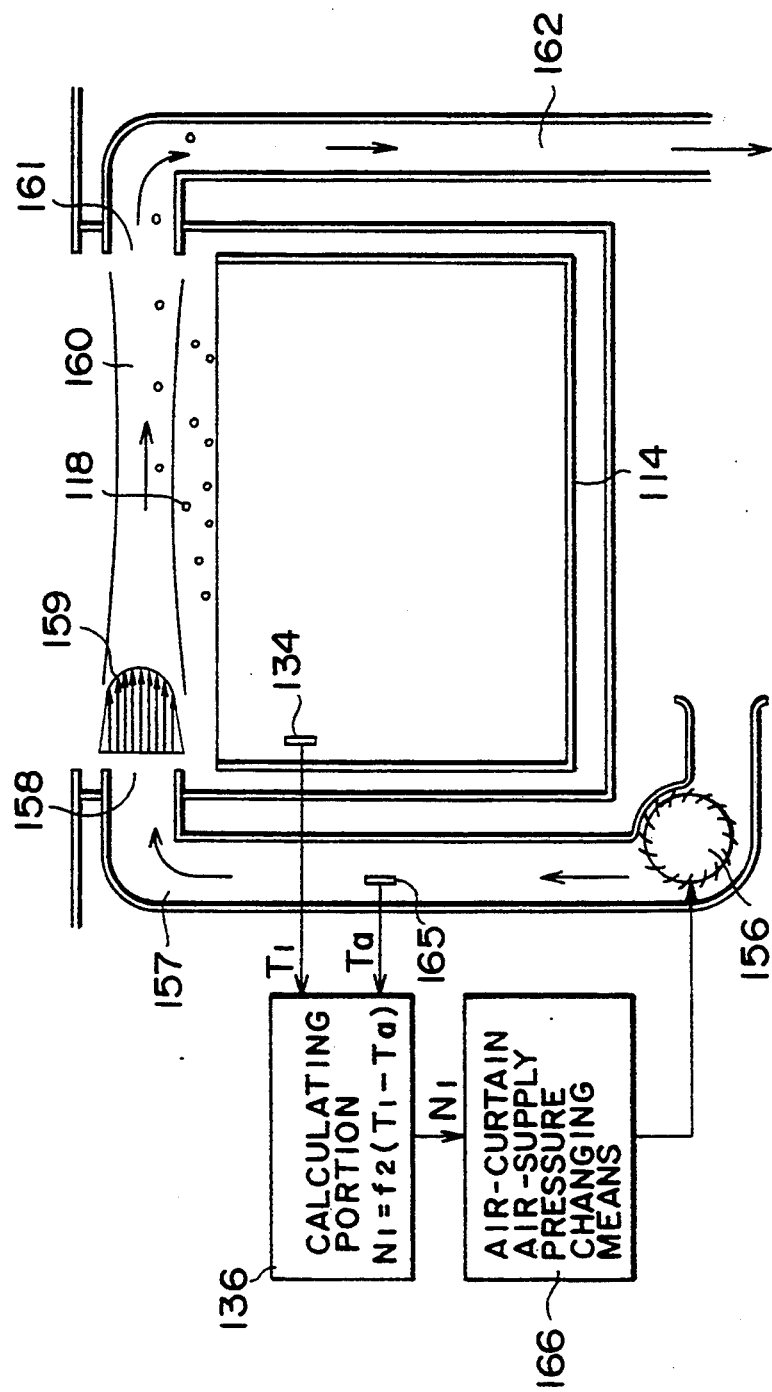

FIG. 71 is a front elevational and cross sectional view which illustrates a portion including a cleaning chamber of a semiconductor cleaning apparatus according to the thirty-first embodiment. Referring to FIG. 71, reference numeral 134 represents a cleaning-solution temperature detection means for detecting temperature T1 of a cleaning solution enclosed in a cleaning chamber 114, 156 represents a air curtain blower, 158 represents an air-curtain blow-out port formed along one side of the cleaning chamber 114 and having a uniform width, 157 represents an air-curtain air supply duct for establishing the connection between the air curtain blower 156 and the air-curtain blow-out port 158, 159 represents distribution of blowing out velocity of the air curtain 160, 160 represents an air curtain formed above the cleaning chamber 114, 161 represents an air-curtain suction port formed along one side of the cleaning chamber 114 to face the air-curtain blow-out port 158, 162 represents an air-curtain discharge duct for establishing the connection between the air-curtain suction port 161 and the discharge pipe, 165 represents an air-curtain flow temperature detection means for detecting air flow temperature Ta of the air curtain, and 136 represents a calculation portion for calculating control output N1 of an air-curtain air-supply pressure changing means 166 by receiving output T1 from a cleaning solution temperature detection means 134 and output Ta from the air curtain air flow temperature detection means 165.

Since velocity V1 of the rise of the chemical mist 118 and dried vapor wafting on the natural convection A4 is raised in proportion to the rise of the cleaning solution temperature T1 and the dried vapor temperature, the pressure for blowing out the air curtain 160 must be changed to correspond to the cleaning solution temperature T1 and the dried vapor temperature T2. The cleaning solution temperature detection means 134 and the air curtain air flow temperature detection means 165 are used to detect the cleaning solution temperature T1 and the air curtain air flow temperature Ta to supply signals denoting the results to the calculation portion 136 as input signals. By using the input signals, the calculations according to Equation 2 described in the twenty-fifth embodiment are performed, and then the rotational speed N1 of the air curtain blower is transmitted. The air-curtain air supply pressure changing means 166 changes the rotational speed of the air curtain blower 156 in accordance with the rotational speed N1 calculated in the calculation portion 136.

The air-curtain air supply pressure changing means 166 may be means for controlling the frequency of the power source for the air curtain blower 156 or means for controlling the power supply voltage to be applied to the air curtain blower 156.

Since this embodiment is, as described above, arranged so that the pressure for supplying the air curtain is changed in accordance with the cleaning solution temperature in the cleaning portion and the vapor temperature in the drying portion, the air supply pressure can be raised if the cleaning solution temperature in the cleaning portion or the vapor temperature in the drying portion is too high. As a result, the insulation effect of the air curtain can correspond to the force of the up-flows of the natural convections generated in the cleaning portion and the drying portion. Therefore, adhesion of chemical mist generated in the cleaning portion and that of vapor in the drying portion to the component units of the cleaning apparatus, which causes the component units to be corroded, can be prevented. Adhesion to the wafer, which causes a defect, and outward diffusion causing similar corrosion and defects can be prevented.

This embodiment can be adapted to a cassette-type cleaning apparatus using the cleaning cassette and a cassette-less cleaning apparatus that does not use the cleaning cassette and that directly handles the wafer.

Thirty-Second Embodiment

Figure 72:
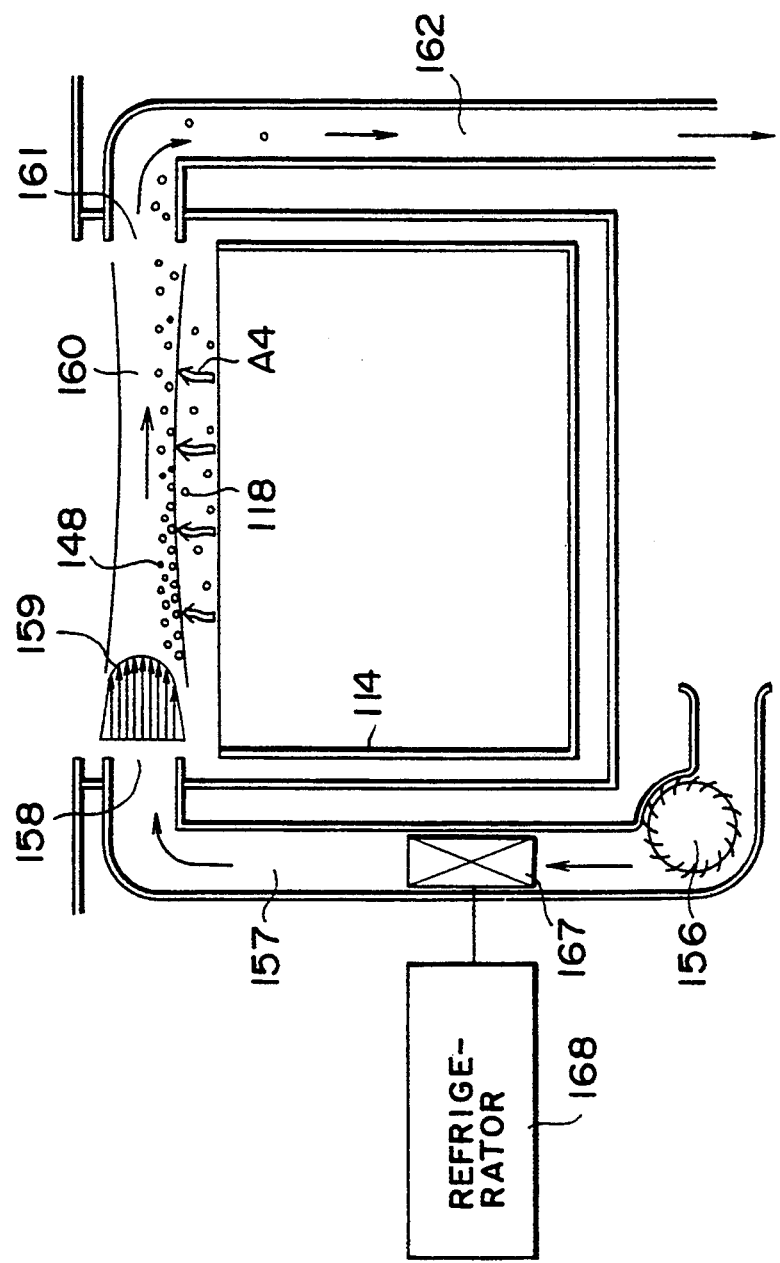

FIG. 72 is a front cross sectional view which illustrates the detailed structure of a portion including the cleaning chamber of a semiconductor cleaning apparatus according to a thirty-second embodiment. Referring to FIG. 72, reference numeral 118 represents chemical mist, 156 represents an air curtain blower, 158 represents an air curtain blow-out port formed on one side of the cleaning chamber 114 and having a uniform width, 157 represents an air curtain air-supply duct for establishing the connection between the air curtain blower 156 and the air-curtain blow-out port 158, 159 represents distribution of air curtain blowing out velocities, 160 represents an air curtain formed above the cleaning chamber 114, 161 represents an air-curtain suction port formed along one side of the cleaning chamber 114 to face the air-curtain blow-out port 158, 162 represents an air curtain discharge duct for establishing the connection between the air-curtain suction port 161 and the discharge pipe, 167 represents a cooling heat-exchanger disposed in the air-curtain air supply duct 157 and arranged to cool the air curtain flow, 168 represents a refrigerator for supplying cooling medium to the cooling heat-exchanger 167, and 148 represents water mist condensed at a boundary between the cooled air-curtain flow and the hot upflows A4 of the natural convection.

The temperature of the blown-out air curtain is lowered by the cooling heat exchanger 167 so that the low-temperature air curtain 160 is formed which intersects the hot upflows A4 of the natural convections generated in the cleaning chamber 114. The change in the humidity in the air flow will now be described with reference to the wet air graph shown in FIG. 66. Assuming that the state of the upflows A4 of the natural convections at temperature T3 which is higher than the ambient temperature is P1, the intersection between the upflows A4 of the natural convections with the low-temperature air curtain 160 on the cleaning chamber 114 causes the air curtain 160 to lower the temperature T3 of the upflows A4 of the natural convections, resulting in state P2 being shifted to the left parallel to the abscissa of FIG. 66 until it reaches saturated vapor line C at which condensation of water contained in the air flows is commenced. As a result, water mist 148 is generated. Assuming that the temperature at this time is T4, the temperature of the upflows A4 of the natural convections after the intersection is made lower than T4 by determining the temperature of the air curtain. As a result, the water mist 148 can be generated. The chemical mist 118 and the chemical vapor 118b are dissolved into the generated water mist 148 and trapped by the water mist as the chemical mist 118a to be dissolved into the water mist and the chemical vapor 118c to be dissolved into the water mist. The water mist is, together with the suction flows, allowed to pass through the air curtain discharge port 161 and the air curtain discharge duct 162 and discharged through the discharge pipe.

This embodiment is, as described above, arranged in such a manner that the heat exchangers 167 for cooling air to be supplied and the refrigerator 168 for supplying the cooling medium to the heat exchanger 167 are disposed in front of or in the rear of the air curtain blower 156 to cause the cooling air supplied from the air curtain blower 156 and the upflows of the natural convections of the vapor generated in the cleaning chamber 114 of the cleaning portion or the upflows of the natural convections of the vapor generated in the vapor chamber of the drying portion to intersect one another in the vicinity of the top end of the cleaning chamber or the vapor chamber. As a result, steam in the cooling air is condensed so that water mist is generated. The water mist traps the chemical mist or the drying vapor so that the diffusion of the chemical mist or the vapor into the cleaning apparatus or to the outside of the apparatus causing the corrosion of the apparatus or defects of the wafer is prevented.

This embodiment can be adapted to a cassette-type cleaning apparatus using the cleaning cassette and a cassette-less cleaning apparatus that does not use the cleaning cassette and that directly handles the wafer.

Thirty-Third Embodiment

Figure 73:
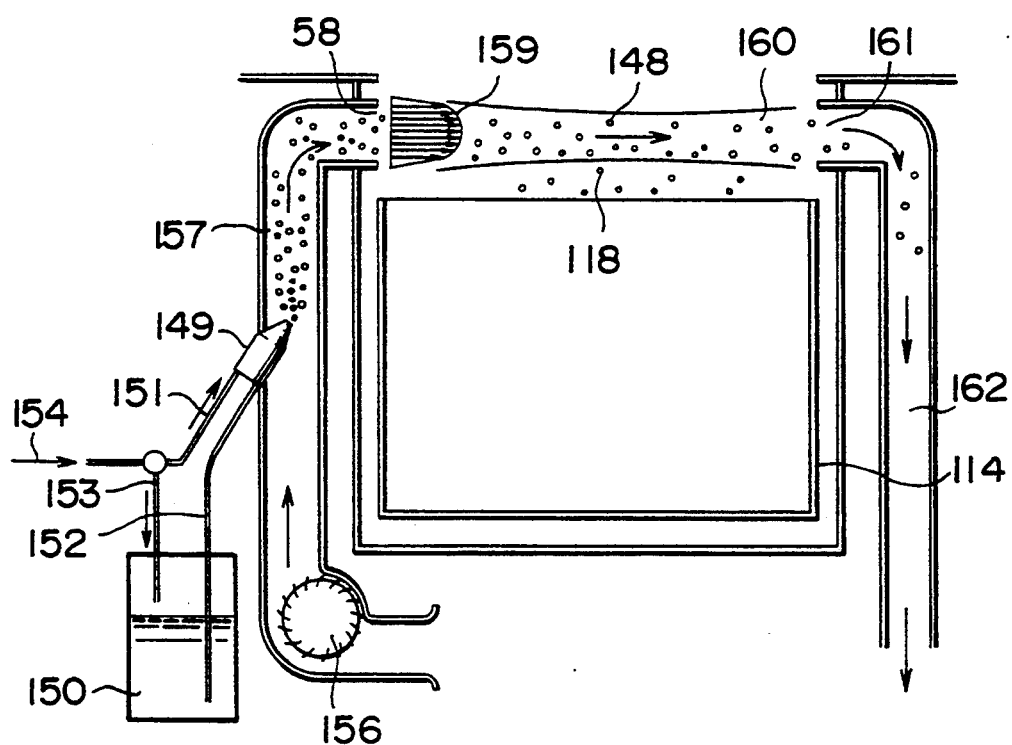

FIG. 73 is a front elevational and cross sectional view which illustrates the detailed structure of a portion including the cleaning chamber of a semiconductor cleaning apparatus according to a thirty-third embodiment. Referring to FIG. 73, reference numeral 149 represents a double-fluid nozzle, 150 represents a pure-water tank, 151 represents a gas pipe, 152 represents a fluid pipe, 153 represents a gas pipe for sending a solution under pressure, 154 represents inactive gas or clean air, 155 represents fine-grain pure-water mist, 156 represents an air curtain blower, 158 represents an air-curtain blow-out port formed along one side of the cleaning chamber 114 and having a uniform width, 157 represents an air curtain air supply duct for establishing the connection between the air curtain blower 156 and the air-curtain blow-out port 158, 159 represents distribution of the blowing velocities of the air curtain, 160 represents an air curtain formed above the cleaning chamber 114, 161 represents an air-curtain suction port formed along one side of the cleaning chamber 114 to face the air-curtain blow-out port 158, and 162 represents an air-curtain discharge duct for establishing the connection between the air-curtain suction port 161 and the discharge pipe.

The inactive gas or clean air 154 is distributed into the gas pipe 151 and the gas pipe 153 for supplying the solution under pressure to the double-fluid nozzle 149. Pure water accumulated in the pure-water tank 150 is sent to the solution pipe 152 under the pressure of the inactive gas supplied from the gas pipe 153 for supplying the solution under pressure or the pressure of pure air 154. The inactive gas or clean air 154 is supplied to the double-fluid nozzle 149 through the gas pipe 151 and pure water is supplied to the same from the solution pipe 152. As a result, the fine-grain pure water mist 155 is generated. The fine-grain pure water mist 155 is mixed with the air flow in the air-curtain air supply duct 157 and is, together with the air curtain 160, blown out through the air-curtain blow-out port 158 to reach a position above the cleaning chamber 144 and traps the chemical mist 118 and the chemical vapor 118b by dissolving them as shown in FIG. 67. The pure-water mist 155, together with suction flows into the air curtain, passes through the discharge ports 161 of the air curtain and discharge duct 162 of the air curtain and is then discharged through the discharge pipe.

Although this embodiment is so arranged that the pure water converted to a fine mist using the double-fluid nozzle 149, the pure water mist may be generated by employing a supersonic or a rotative disc or a transparent wet film or a heating method to obtain a similar effect.

This embodiment is, as described above, arranged in such a manner that a blow-out port of the double-fluid nozzle 149 for spraying clean air or the active gas 154 as the secondary fluid is formed adjacent to the air-curtain blow-out port 158 to mix the pure-water mist 155 into the air curtain 160. Therefore, the water mist 155 traps the chemical mist generated in the cleaning chamber 114 of the cleaning portion or vapor generated from the steam chamber of the drying portion so that the diffusion of the chemical mist or the vapor into the cleaning apparatus or to the outside of the apparatus causing the corrosion of the apparatus or defects of the wafer is prevented.

This embodiment can be adapted to a cassette-type cleaning apparatus using the cleaning cassette and a cassette-less cleaning apparatus that does not use the cleaning cassette and that directly handles the wafer.

Thirty-Fourth Embodiment

Figure 74:
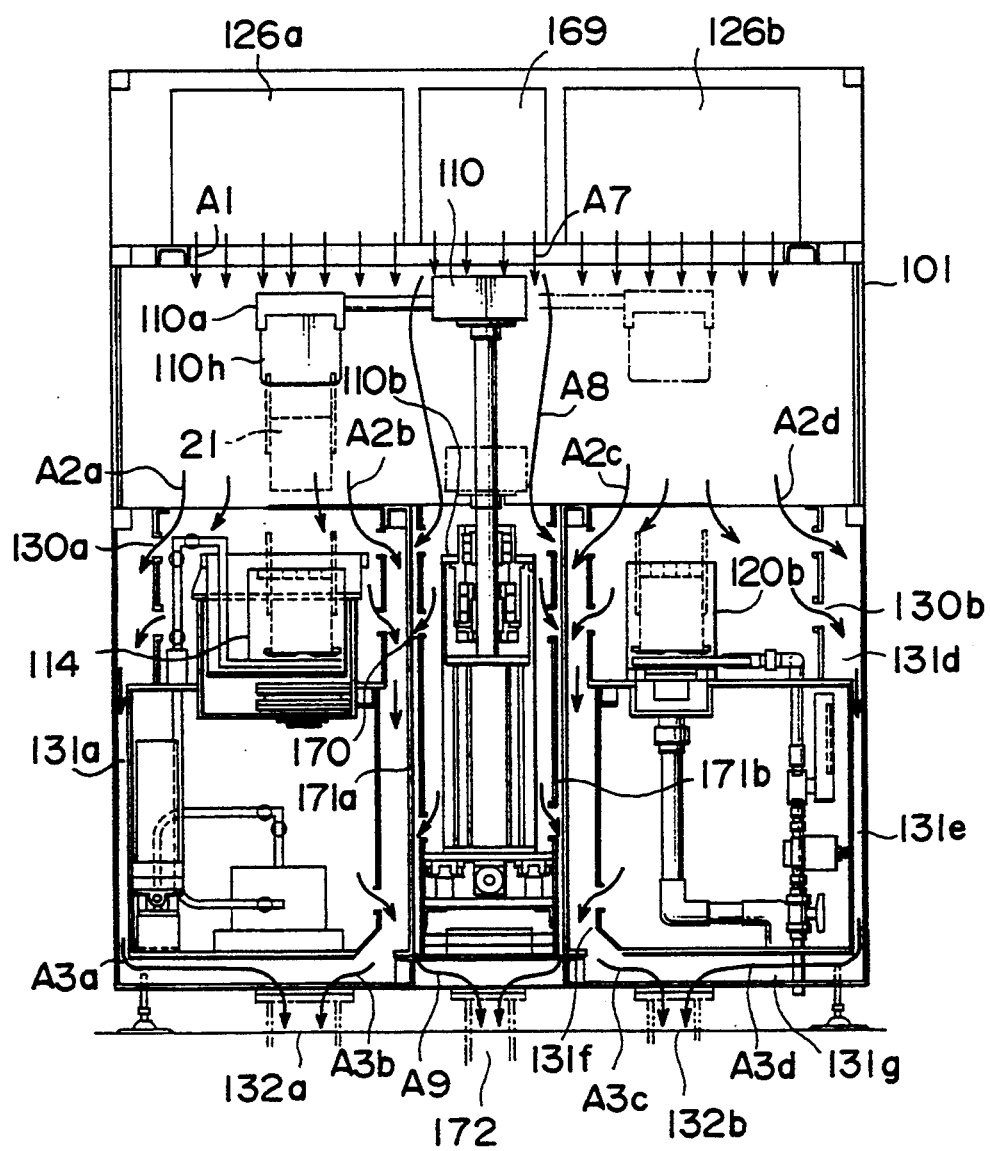
FIGS. 74 to 76 respectively are cross sectional views which illustrate the inside portion of a cleaning apparatus according to thirty-fourth to thirty-sixth embodiment.

FIG. 74 is a front cross sectional view which illustrates the detailed structure of a portion in a semiconductor cleaning apparatus according to a thirty-fourth embodiment. Referring to FIG. 74, reference numerals 126a and 126b represent first air conditioning filters disposed above the cleaning chamber 114 of the cleaning portion 105 and water cleaning chambers 120a and 120b of the water cleaning portions 106a and 106b to supply clean air. Reference numerals 130a and 130b represent first discharge ports formed to suck and discharge air around the cleaning chamber 114 and the water cleaning chambers 120a and 120b. Reference numerals 131a to 131g represent fist discharge ducts connected to the fist discharge ports 130a and 130b. Reference numerals 132a and 132b represent first discharge pipes connected to the first discharge ducts 131a to 131g to discharge air to the outside of the semiconductor cleaning apparatus 101. Reference numeral 169 represents a second air conditioning filter disposed above the conveyance portion 110 and arranged to supply clean air. Reference numeral 170 represents a second discharge port disposed to suck and discharge air around the conveyance portion 110b. Reference numerals 171a and 171b represent second discharge ducts connected to the second discharge port 170, and 172 represents a second discharge pipe connected to the second discharge ducts 171a and 171b to discharge air to the outside of the semiconductor cleaning apparatus 101.

Reference numeral A1 represents a first downflow to be sent from the first air conditioning filters 126a and 126b, A2a to A2d represent first suction flows to be sucked through the first discharge ports 127a and 127b, A3a to A3d represent first discharge flows to be discharged into the first discharge pipes 132a and 132b by way of the first discharge ducts 128a to 128g, A7 represents a second downflow to be sent from the second air conditioning filter 169, A8 represents a second suction flow to be sucked into the second discharge port 170, and A9 represents a second discharge flow to be discharged into the second discharge pipes 172 by way of the second discharge ducts 171a and 171b.

The downflows A1 blown out of the first air conditioning filters 126a and 126b pass through the product conveyance portion 110a, the cassette hand 110h and the cleaning cassette 1 to be sucked as A2a to A2d through the first discharge port 130a formed around the cleaning chamber 114 of the cleaning portion 105 and the first discharge port 130b formed around the water cleaning chamber 120b of the water cleaning portion 106b. Then, the downflows A1 are, as the first discharge flows A3a to A3d, discharged from the first discharge ducts 131a to 131f into the first discharge pipes 132a and 132b. The second downflows A6 blown out from the air conditioning filter 169 pass through the product conveyance portion 110, are sucked through the second discharge port 170 formed around the product conveyance portion 110b as A8, and then the second downflow A7 is discharged from the second discharge ducts 171a and 171b into the second discharge pipe 172 as the second discharge flow A9.

As a result, the first downflows A1 intersect above the cleaning chamber 114 and the water cleaning chamber 120 to trap the chemical mist generated in the cleaning chamber 114, and then becomes equal suction flows A2a to A2d sucked into the first discharge ports 130a and 130b. Further, the second downflows A7 are equally formed around the conveyance portion 110 so that the first downflows A1 and the second downflows A8 can be separated from each other. The upward movement and diffusion of the chemical mist generated in the cleaning portion and the vapor in the drying portion while wafting on the natural convections can be inhibited and insulated by the first downflows A1. As a result, generation of defects in the wafer can be prevented. Further, the inhibition of the second downflows A2 insulates the same to prevent the adhesion of the chemical mist from the cleaning chamber and vapor of the drying portion to the conveyance device causing the conveyance device to be corroded. In addition, adhesion of mechanical dust generated in the conveyance portion to the wafer, which is being cleaned, can be prevented.

Further, chemical mist generated from the cassette hand 110h and the cleaning cassette 21 when the cassette hand 110h immersed in the cleaning solution in the cleaning chamber 114 and the cleaning cassette 21 are raised by the product conveyance portion 110a is trapped by the first downflows A1 and discharged into the first discharge pipes 132a and 132b together with the first suction flows A2a to A2d. Therefore, the diffusion of the chemical mist generating during the conveyance can also be prevented.

Since this embodiment comprises the first air conditioning filters 126a and 126b for supplying clean air to the cleaning portion, the water cleaning portion and the drying portion and the first discharge pipes 132a and 132b disposed in the vicinity of the chambers of the cleaning portion, the water cleaning portion and the drying portion so that downflows are formed above the cleaning portion, the water cleaning portion and the drying portion. Further, the second air conditioning filter 169 for supplying clean air to the conveyance portion and the second discharge pipe for discharging air from the conveyance portion are provided. Therefore, the upward movement and diffusion of the chemical mist generated in the cleaning portion and vapor in the drying portion wafting on the natural convections are restricted and insulated by the downflows. As a result, generation of defects in the wafer is prevented. In addition, adhesion of the chemical mist generated in the cleaning chamber and vapor in the drying portion to the conveyance portion causing it to be corroded can be prevented. Moreover, adhesion of mechanical dust generated in the conveyance portion to the wafer, which is being cleaned, can be prevented.

Although the description has been about the cassette-type cleaning apparatus using the cleaning cassette, this embodiment can be adapted to a cassette-less type cleaning apparatus using no cleaning cassette but directly handling the wafer.

Thirty-Fifth Embodiment

Figure 75:
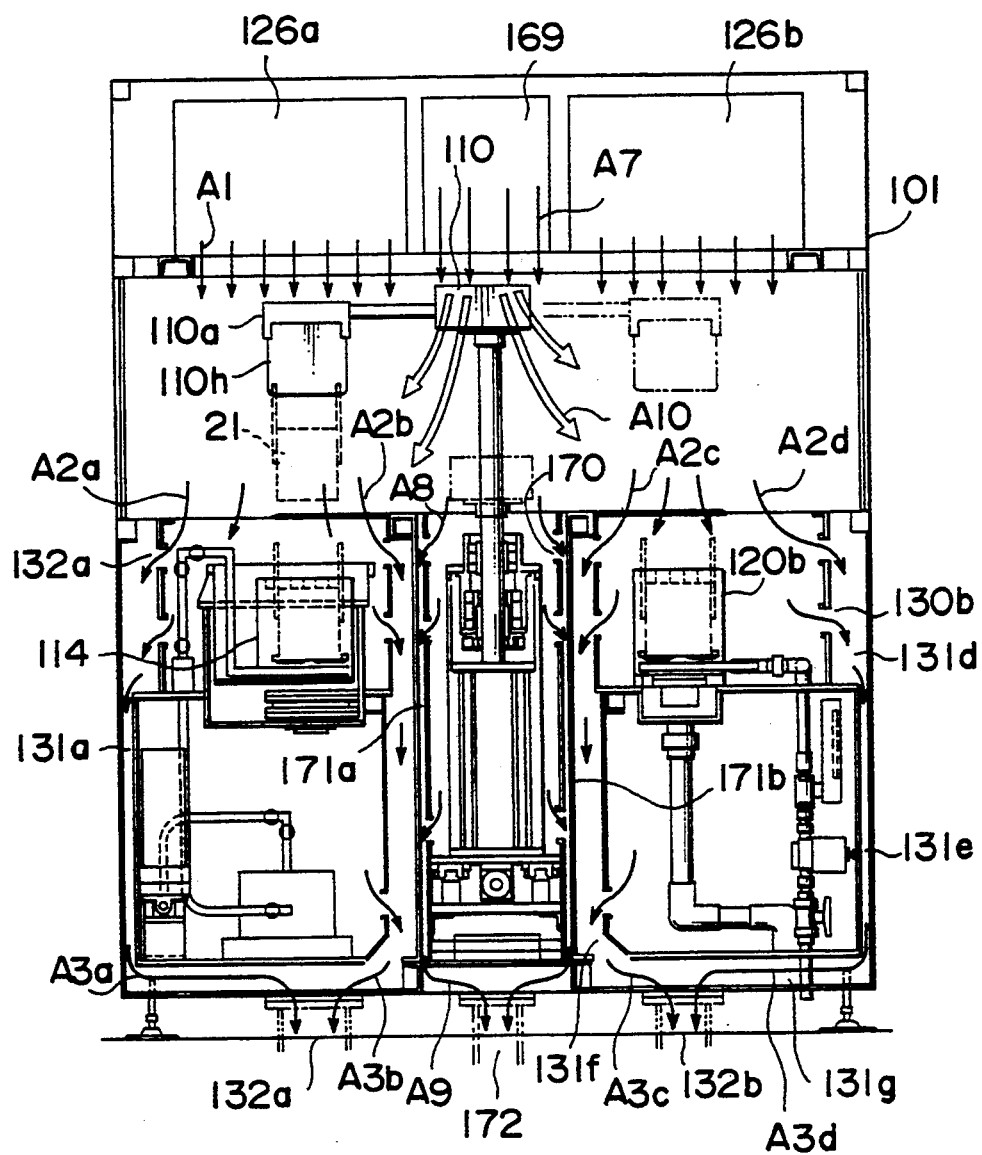

FIG. 75 is a front cross sectional view which illustrates the detailed structure of the portion in the semiconductor cleaning apparatus according to a thirty-fifth embodiment. Referring to FIG. 75, A1 represents first downflows blown out from the first air conditioning filters 126a and 126b, A7 represent second downflows blown out from the second air conditioning filter 169, and A10 represents downflows flowing from the conveyance portion 110 to the cleaning portion 105, the water cleaning portion 106 and the drying portion 107.

Letting the velocity (air supply pressure) of the first downflows A1 blown out from the first air conditioning filters 126a and 126b be V2, and the velocity (air supply pressure) of the second downflows A7 blown out from the second air conditioning filter 169 be V3 and controlling such that V3 is always faster than V2 causes the second downflows A7 to be divided into the air flow A10 flowing from the conveyance portion 110 toward the cleaning portion 105, the water cleaning portion 106 and the drying portion 107 and the second suction flow A8 to be sucked into the second discharge port 170 because the air supply pressure of the second downflows A7 is larger than that of the first downflow A1. Therefore, invasion of the chemical mist from the cleaning chamber 114 and vapor of the drying portion into the conveyance portion can further completely be prevented.

Since this embodiment is arranged in such a manner that the air supply pressure of the second air conditioning filter 169 is made higher than that of the first air conditioning filters 126a and 126b for supplying clean air to the cleaning portion, the water cleaning portion and the drying portion as described above, invasion of the chemical mist from the cleaning chamber 114 and vapor of the drying portion into the conveyance portion can further completely be prevented.

Although the description has been about the cassette-type cleaning apparatus using the cleaning cassette, this embodiment may, of course, be adapted to a cassette-less cleaning apparatus which does not use the cleaning cassette and which directly handles the wafer.

Thirty-Sixth Embodiment

Figure 76:
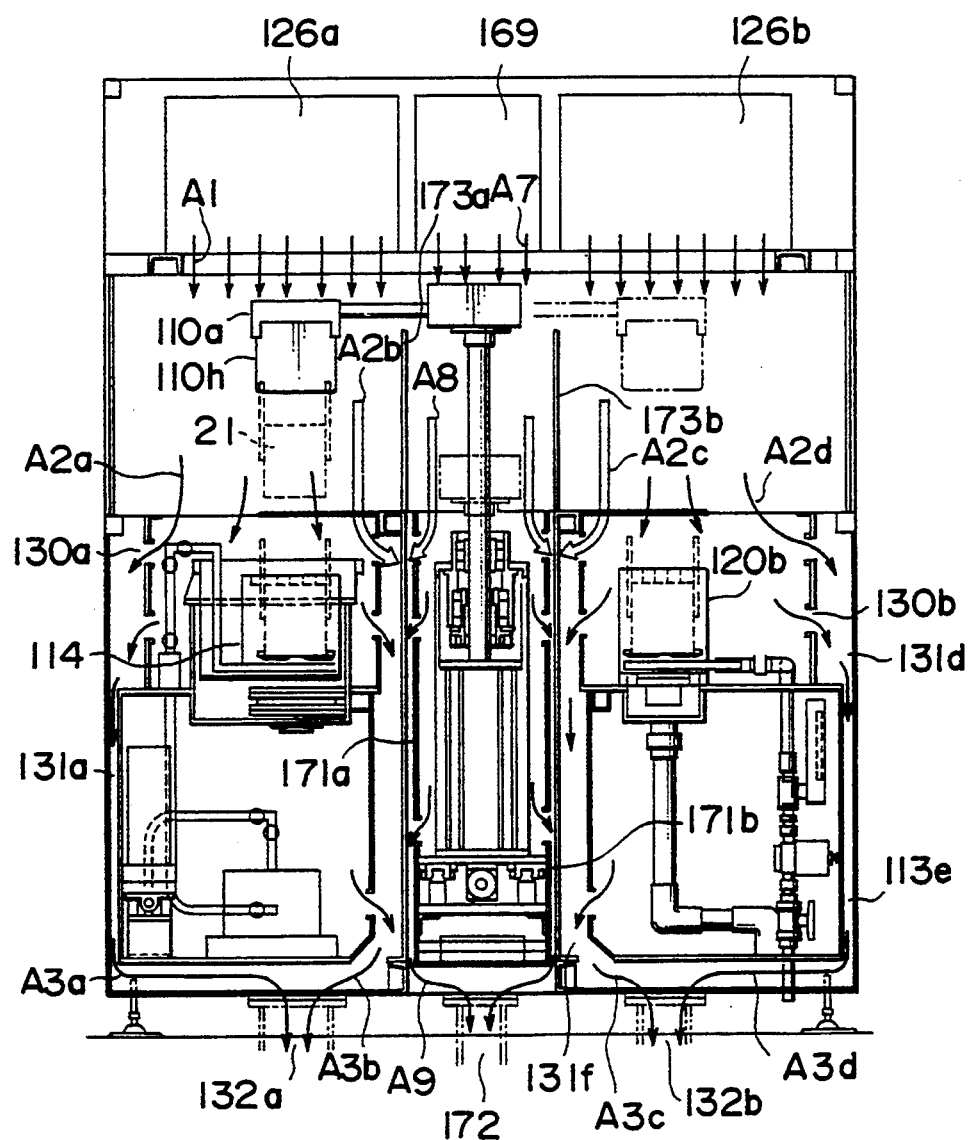
Figure 77:
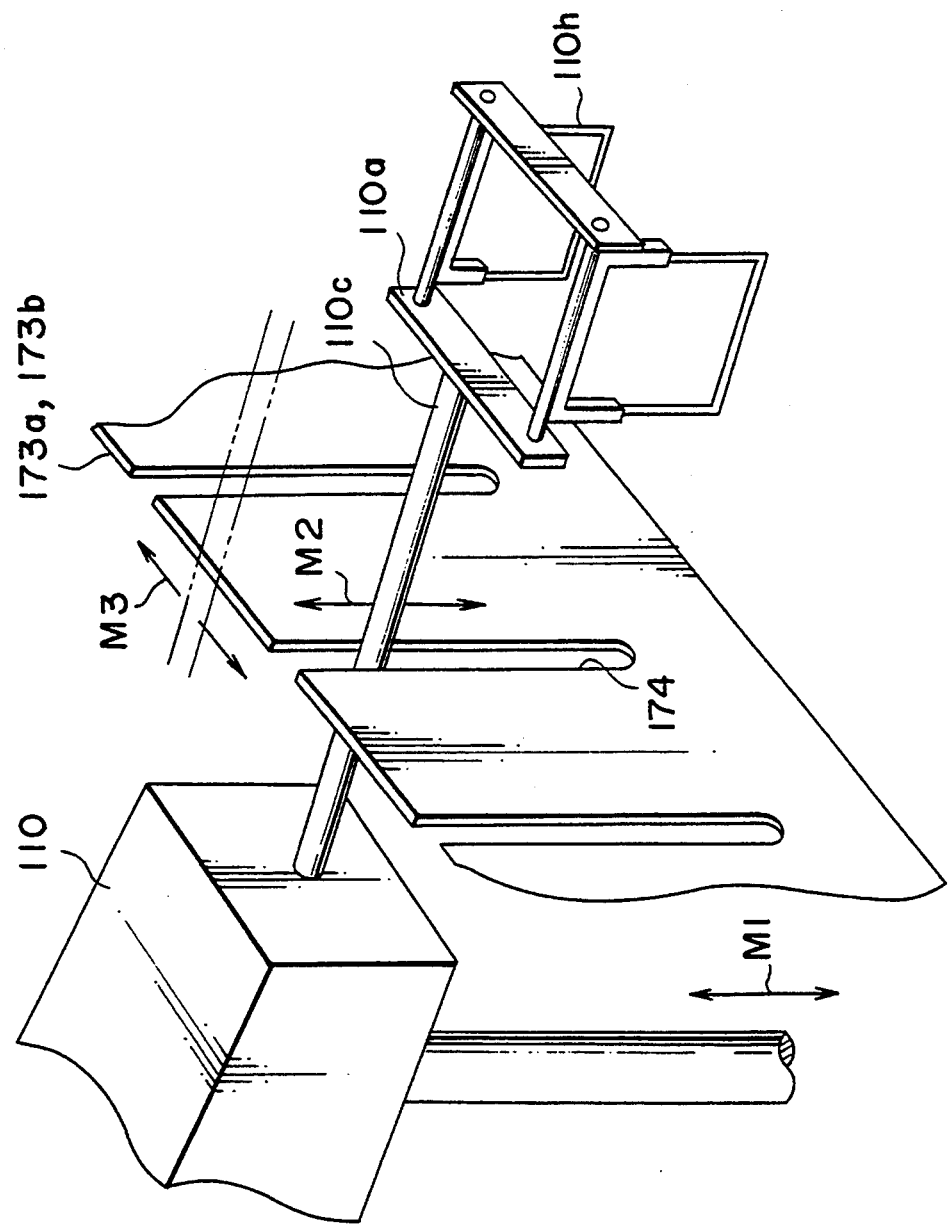
FIG. 77 is a perspective view which illustrates a portion including an insulating wall of the cleaning apparatus according to the thirty-sixth embodiment.

FIG. 76 is a front cross sectional view which illustrates the detailed structure in the semiconductor cleaning apparatus according to a thirty-sixth embodiment. FIG. 77 is a perspective view which illustrates insulating walls of the semiconductor cleaning apparatus according to this embodiment. Referring to FIGS. 76 and 77, reference numeral 110c represents a conveyance arm, 173a and 173b represent insulating walls for insulating the conveyance portion from the cleaning portion, the water cleaning portion and the drying portion, 174 represents a cut portion through which the conveyance arm 110c passes at the time of the vertical movement of the conveyance arm 110c, A2b and A2c represent first suction flows formed by separating the first downflows A1 blown out from the first air conditioning filters 126a and 126b by the insulating walls 173a and 173b, the first suction flows A2b and A2c being sucked into the first discharge ports 130a and 130b. Symbol A8 represents second suction flows formed by separating the second downflows A7 blown out from the second air conditioning filter 169 by the insulating walls 173a and 173b, the second suction flows A8 being sucked into the second discharge port 170. Symbol M1 represents the vertical movement of the conveyance portion 110, M2 represents the vertical movement of the conveyance portion 110c and M3 represents the horizontal movement of the conveyance arm 110c.

The first downflows A1 and the second downflows A2 can be completely separated by physical means. In this embodiment, the space of the conveyance portion 110 and the spaces above the cleaning chamber 114 and the drying chamber 121 are insulated from one another by the insulating walls 173a and 173b. At this time, the cleaning cassette 21 is held by the cassette hand 110h of the conveyance portion 110 to shift it to the cleaning chamber 114, the water cleaning chamber 120 and the drying chamber 121 so that the process is performed. In order to achieve this, the arm 110c of the conveyance portion is able to perform the vertical movement M2 while passing through the cut portion 174 of the insulating walls 173a and 173b when the conveyance portion 110 performs the vertical movement M1. The horizontal movement M3 of the arm 110c of the conveyance portion is performed in a space above the top end of the insulating wall 73.

This embodiment is, as described above, so arranged that the insulating wall 173 for insulating the conveyance portion from the cleaning portion, the water cleaning portion and the drying portion is provided. Further, the downflows sent from the second air conditioning filter 169 for supplying clean air to the conveyance portion are sent to the second discharge pipe 172 in the lower portion of the conveyance portion, while the downflows sent from the first air conditioning filers 126a and 126b for supplying clean air to the cleaning portion, the water cleaning portion and the drying portion are set to the first discharge ports 130a and 130b disposed around the chambers in the cleaning portion, the water cleaning portion and the drying portion. Since the downflows are completely divided into individual downflows, the corrosion of the conveyance portion due to the adhesion of the chemical mist and the contamination of the wafer due to the mechanical dust generated in the conveyance portion can be completely prevented.

Although the description has been about the cassette-type cleaning apparatus using the cleaning cassette, this embodiment can, of course, be adapted to a cassette-less-type cleaning apparatus which does not use the cleaning cassette and which directly handles the wafer.

Thirty-Seventh Embodiment

Figure 78:
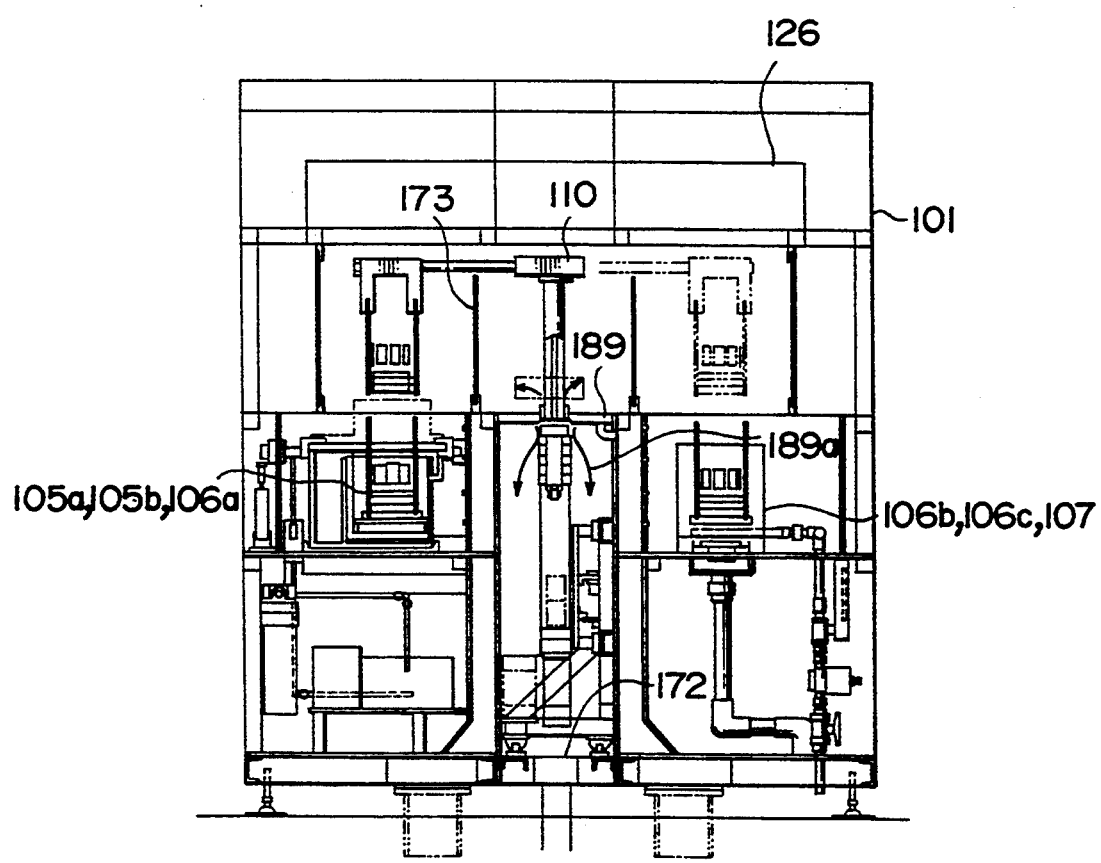
FIG. 78 is a cross sectional view which illustrates the inside portion of a cleaning apparatus according to a thirty-seventh embodiment.

FIG. 78 is a front cross sectional view which illustrates the detailed structure in a semiconductor cleaning apparatus according to a thirty-seventh embodiment. Referring to FIG. 78, reference numeral 189 represents a gas supply portion for supplying a gaseous material to a gap between at least any one of the cleaning portions 105a, 105b, the water cleaning portions 106a to 106c or the drying portion 107 and the conveyance portion 110. Reference numeral 189a represents gas, and 172 represents a fourth discharge portion for discharging air from the lower portion of the conveyance portion 110.

First, the quantity of the gas to be supplied from the gas supply portion 189 is previously determined to be larger than the quantity to be discharged from the fourth discharge portion 172. Since the gas 189a is supplied from the gas supply portion 189 to the gap among the cleaning portions 105a and 105, the water cleaning portions 106a to 106c, the drying portion 107 and the conveyance portion 110, the mist from the cleaning portions 105a and 105b, the water cleaning portions 106a to 106c and the drying portion 107 does not reach the conveyance portion 110. Therefore, the mechanism portion of the conveyance portion 110 can be protected from corrosion by the mist. Further, dust generated in the mechanism portion of the conveyance portion 110 is, together with a portion of the gas 189a, introduced into the fourth discharge portion 172. Therefore, the adhesion of the dust to the wafer, which is being cleaned, can be prevented.

This embodiment can be adapted to a cassette-type cleaning apparatus using the cleaning cassette and to a cassette-less-type cleaning apparatus which does not use the cleaning cassette and which directly handles the wafer.

Thirty-Eighth Embodiment

Figure 79:
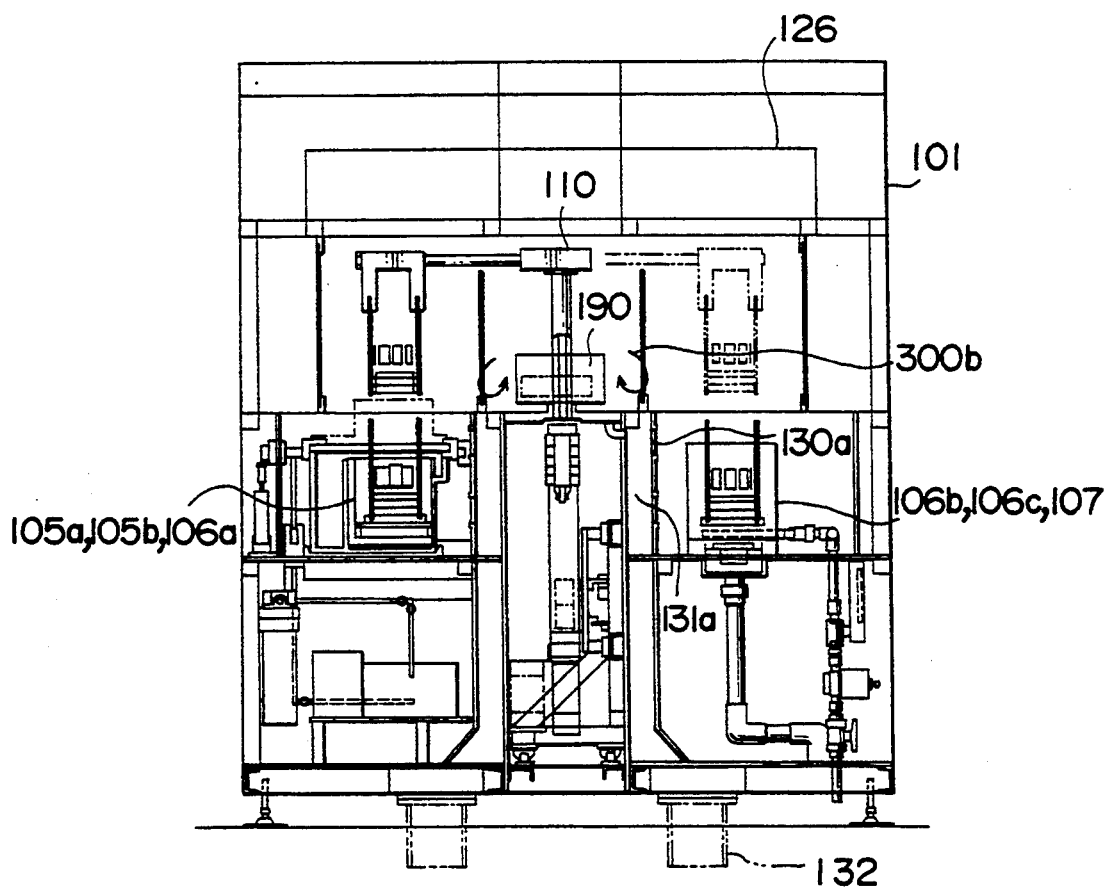
FIGS. 79 and 80 respectively are a cross sectional view and a plan view which illustrate a cleaning apparatus according to a thirty-eighth embodiment.
Figure 80:
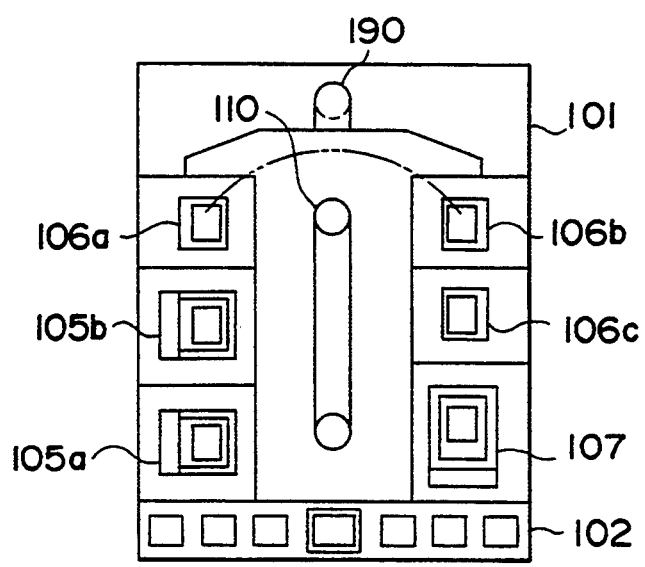

FIG. 79 is a front and cross sectional view which illustrates the detailed structure of the inside portion of a semiconductor cleaning apparatus according to a thirty-eighth embodiment. FIG. 80 is a plan view which illustrates the cleaning apparatus according to this embodiment. Referring to FIGS. 79 and 80, reference numeral 126 represents an air conditioning filter for supplying clean air into the cleaning apparatus, 131a represents a discharge duct communicated with a discharge pipe 132, 130a represents an opening portion communicated with the discharge duct 131a, 190 represents a fifth discharge portion for discharging air from the end portion of the locus of the conveyance portion 110, and 300b represents stagnant air.

The quantity of air to be supplied from the air conditioning filter 126 and the quantity of air discharged from the discharge pipe 132 are balanced previously. Air supplied from the air conditioning filter 126 passes through the opening portion 130a formed in the cleaning portions 105a and 105b, the water cleaning portions 106a to 106c and the drying portion 107 to be discharged to the discharge pipe 132 through the discharge duct 131a. A portion of air is undesirably stagnated at an end of the locus of the conveyance portion 110. The stagnant air 300b contains mist at the time of raising the wafer from each portion. In order to prevent introduction of the stagnant air 300b into the water cleaning portions 106a and 106b whenever the conveyance robot 110a of the conveyance portion 110 is operated which causes the adhesion of the mist to the wafer which is being cleaned with water or to the raised wafer which has been cleaned with water, the fifth discharge portion 190 discharges the stagnant air 300b from the end of the locus of the conveyance portion 110.

As a result, troubles occurring due to the mist in the cleaning apparatus can be prevented.

This embodiment can be adapted to a cassette-type cleaning apparatus using the cleaning cassette and to a cassette-less-type cleaning apparatus which does not use the cleaning cassette and which directly handles the wafer.

Thirty-Ninth Embodiment

Figure 81:
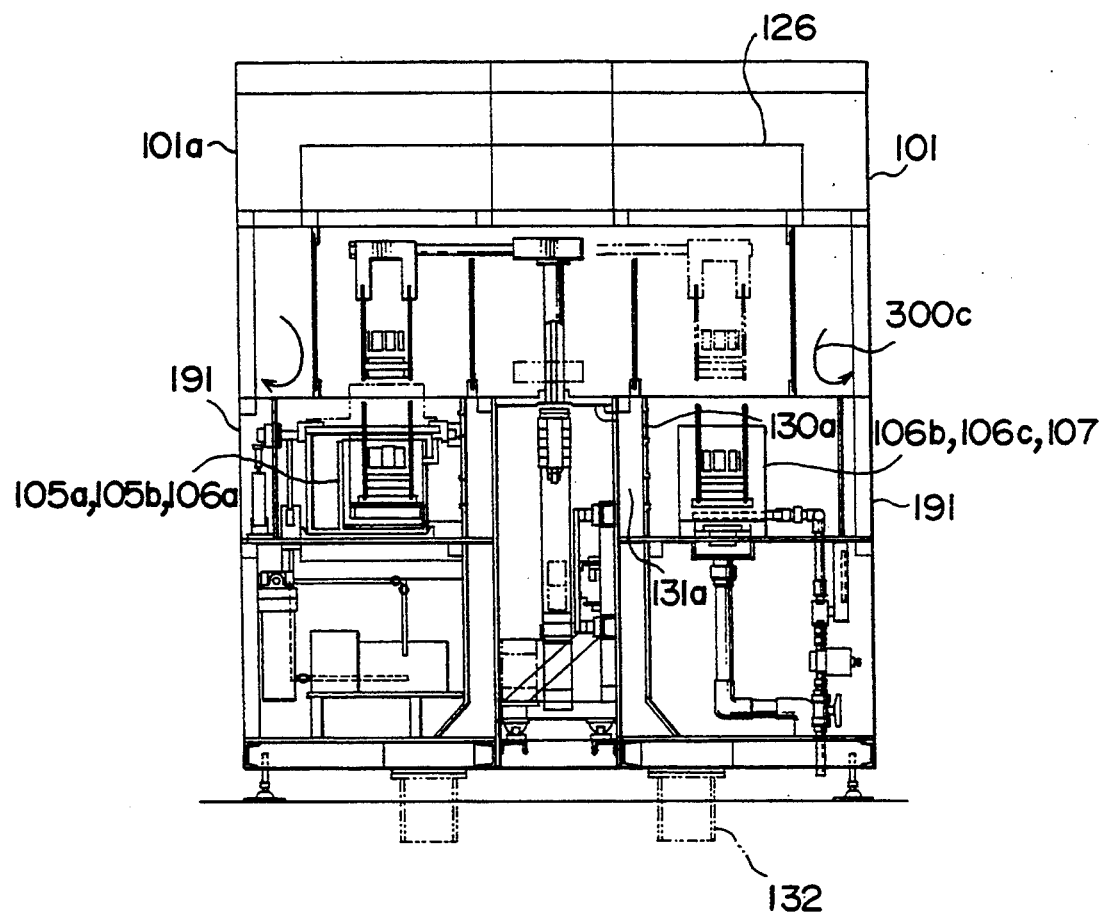
FIG. 81 is a cross sectional view which illustrates the inside portion of a cleaning apparatus according to a thirty-ninth embodiment.

FIG. 81 is a front cross sectional view which illustrates the detailed structure of the internal portion of a semiconductor cleaning apparatus according to a thirty-ninth embodiment. Referring to FIG. 81, reference numeral 191 represents a sixth discharge portion for discharging air from between at least any one of the cleaning portions 105a and 105b, the water cleaning portions 106a to 106 and the drying portion 107 and the outer wall 101 of the cleaning apparatus body 101. Reference numeral 300c represents stagnant air.

The quantity of air to be supplied from the air conditioning filter 126 and the quantity of air to be discharged from the discharge pipe 132 is previously balanced. Air supplied from the air conditioning filter 126 passes through the opening portion 130a formed in the cleaning portions 105a and 105b, the water cleaning portions 106a to 106c and the drying portion 107 and discharged to the exhaust pipe 132 through the discharge duct 131a. However, the presence of the outer wall 101a of the cleaning apparatus body 101 causes a portion of air to become stagnant among the cleaning portions 105a, 105b, the water cleaning portions 106c to 106c and the drying portion 107 and the outer wall 101a. The stagnant air 300c contains mist at the time of raising the wafer from each portion. In order to prevent introduction of the stagnant air 300c into each portion and adhesion of the mist to the wafer, which is being cleaned with water or the raised wafer which has been cleaned with water, the sixth discharge portion 191 discharges the stagnant air 300c.

As a result, troubles occurring due to the mist in the cleaning apparatus can be prevented.

This embodiment can be adapted to a cassette-type cleaning apparatus using the cleaning cassette and to a cassette-less-type cleaning apparatus which does not use the cleaning cassette and which directly handles the wafer.

Fortieth Embodiment

Figure 82:
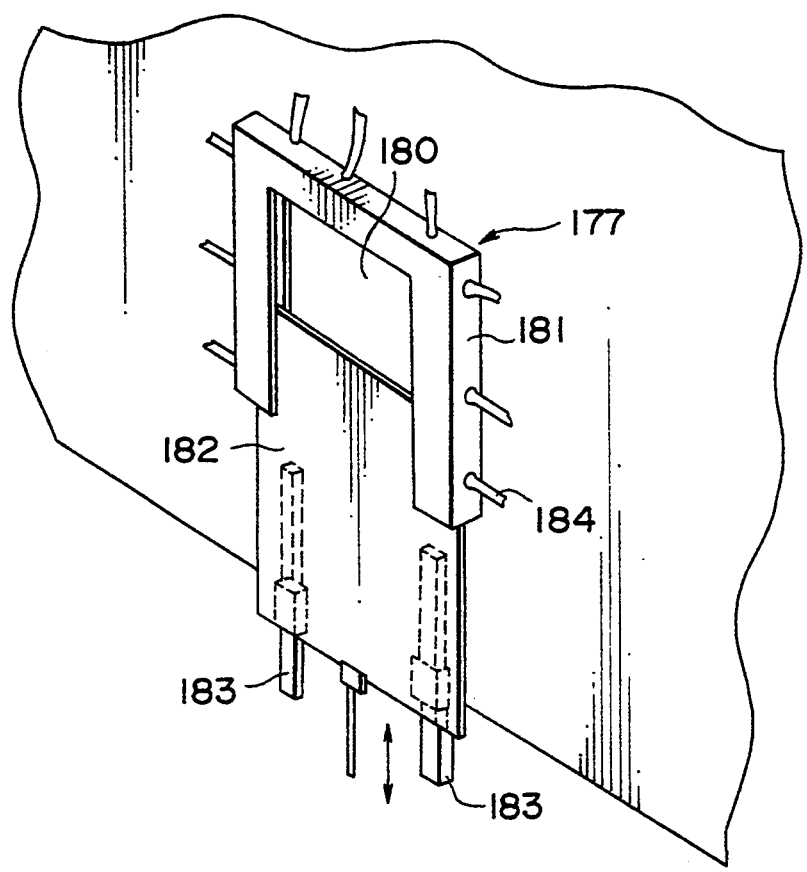
FIG. 82 is a perspective view which illustrates a window structure of a cleaning apparatus according to a fortieth embodiment.

FIG. 82 is a perspective view which illustrates a window structure of a semiconductor cleaning apparatus according to a fortieth embodiment. Referring to FIG. 82, reference numeral 80 represents an opening portion formed in a partition plate for sealing the cleaning portion, the water cleaning portion and the drying portion into sealed chambers, 181 represents an outer frame formed around the opening portion 180, 182 represents a door so disposed along the outer frame 181 to be opened as desired, and 183 represents a guide member for guiding the opening/closing operation of the door 182.

In order to seal the cleaning portion, the water cleaning portion and the drying portion into sealed chambers and causing the product cassette 22 or the cleaning wafer cassette 21 to be injected/ejected as desired, a window structure 177 arranged as shown in FIG. 82 is provided. The door 182 slides along the guide member 183 to open/close the opening portion 180 while preventing contact with the outer frame 181. The outer frame 181 has plural discharge ports 184 to discharge air through the discharge ports 184 at least when the door 182 is being opened or closed. As a result, introductions of dust generated due to opening/closing of the door 182 and mist from the cleaning apparatus can be prevented.

This embodiment may be adapted to a cassette-type cleaning apparatus using the cleaning cassette and a cassette-less-type cleaning apparatus which does not use the cleaning cassette and which directly handles the wafer.

Forty-First Embodiment

Figure 83:
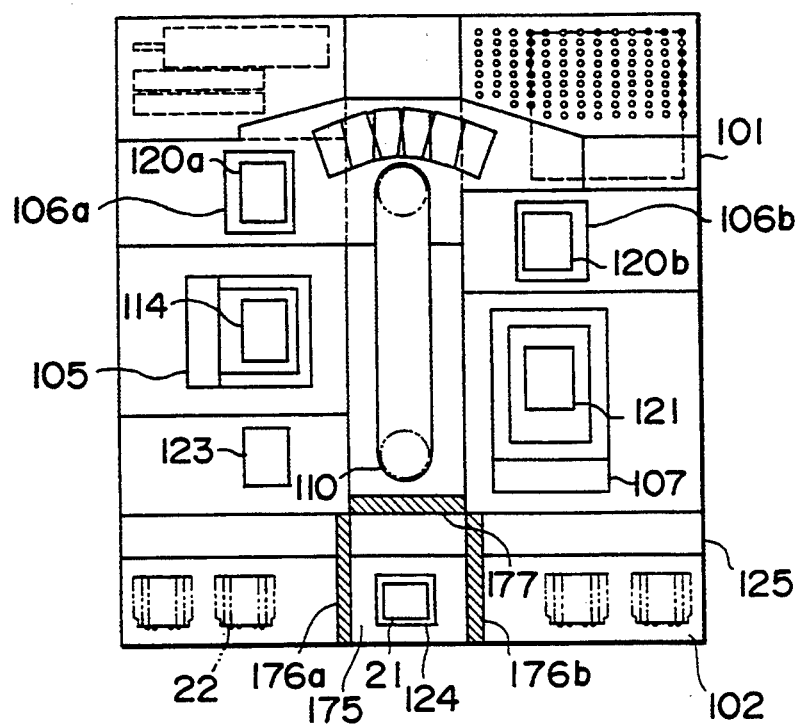
FIGS. 83 and 84 respectively are a plan view and a front elevational view which illustrate a cleaning apparatus according to a forty-first embodiment.
Figure 84:
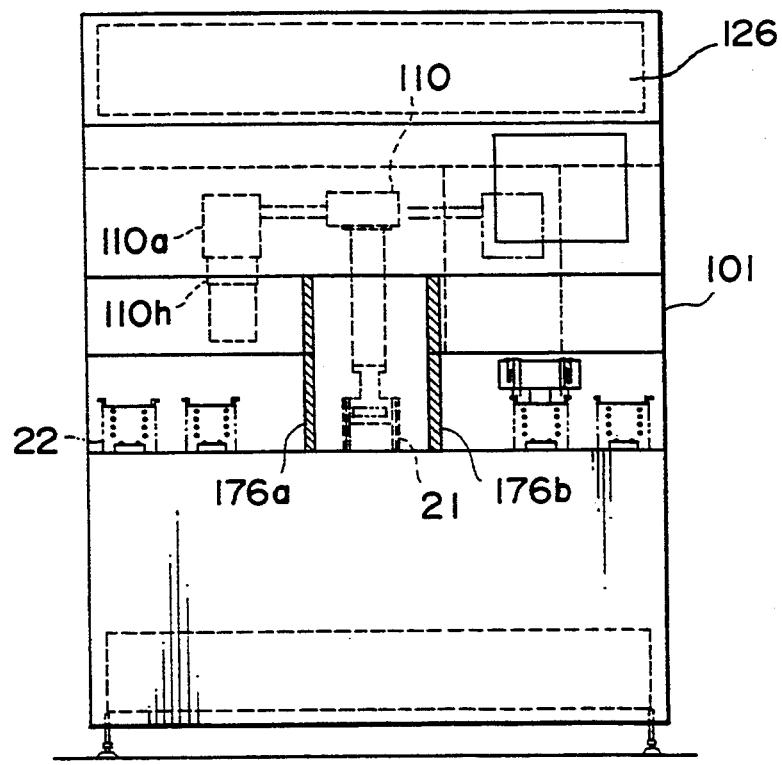

FIG. 83 is a plan view which illustrates a semiconductor cleaning apparatus according to a forty-first embodiment. FIG. 84 is a front elevational view which illustrates this embodiment. Referring to FIGS. 83 and 84, reference numeral 175 represents a load locking chamber adjacent to the window structure 177 between the cleaning apparatus body 101 and the loader/unloader portion 102, and 176a and 176b represent doors of load locking chamber 175 for injecting/ejecting the product cassette 22 to and from the load locking chamber 175.

As the initial stage for the load locking chamber 175, the doors 176a and 176b of the load locking chamber 175 and the window structure 177 are closed. The product cassette 22 accommodating the wafer is placed on the product cassette retaining frame of the loader/unloader portion 102. The shifting robot 125 takes out the wafer from the product cassette 22 and opens the doors 176a and 176b of the load locking chamber 175 to introduce the wafer into the load locking chamber 175 and shift it to the cleaning cassette 21 placed on the cleaning wafer cassette retaining frame 124. Then, the doors 176a and 176b of the load locking chamber 175 are closed. The cleaning cassette 21 thus accommodating the wafer is held by the cassette hand 110h of the product conveyance portion 110 after the window structure 177 of the load locking chamber 175 has been opened. As a result, it is shifted onto the cleaning wafer cassette retaining frame 123 is on standby on the cleaning wafer cassette retaining frame 123. Then, the window structure 177 of the load locking chamber 175 is closed.

After the cleaning process has been completed, the product conveyance portion 110 takes out the cleaning cassette 21 from the drying chamber 121, and opens the window structure 177 of the load locking chamber 175 to introduce the cleaning cassette 21 into the load locking chamber 175 and shift it on the cleaning wafer cassette retaining frame 124 of the loader/unloader portion 102. Then, the window structure 177 of the load locking chamber 175 is closed. Then, the shifting robot 125 opens the doors 176a and 176b of the load locking chamber 175, and then takes out the wafer from the cleaning cassette 21 placed on the cleaning wafer cassette retaining frame 124 to shift it to an empty product cassette 22 placed on the product cassette retaining frame. Then, the doors 176a and 176b of the load locking chamber 175 are closed. Therefore, even if there is a pressure difference between the static pressure in the cleaning apparatus body 101 and the external static pressure, the air flow generated due to the pressure difference and causing chemical mist generated in the cleaning portion and vapor of the drying portion to adhere to the component units in the sealed chamber resulting in that the component units are corroded. Further, adhesion to the wafer causing a defect and outward diffusion causing similar corrosion and generation of defects can be prevented.

This embodiment is, as described above, so arranged that the cleaning portion, the water cleaning portion, the drying portion and the conveyance portion are in the sealed chamber structures. Further, the load locking chamber 175 is formed on this side of the window structure 177, which can be opened/closed to inject/eject the wafer hand for holding the cleaning cassette 21 accommodating the wafer shifted from the product cassette 22 in the loader/unloader portion 102 or directly holding the wafer ejected from the product cassette 22. Therefore, the air flow generated due to the pressure difference between the static pressure in the sealed chamber and the static pressure of the external portion insulated by the window structure at the time of opening the window and causing chemical mist generated in the cleaning portion and vapor of the drying portion to adhere to the component units in the sealed chamber resulting in the component units being corroded is prevented. Further, adhesion to the wafer causing a defect and outward diffusion causing similar corrosion and generation of defects can be prevented.

Although the description has been about the cassette-type cleaning apparatus using the cleaning cassette, this embodiment may, of course, be adapted to a cassette-less-type cleaning apparatus which does not use a cleaning cassette and which directly handles the wafer.

Forty-Second Embodiment

Figure 85:
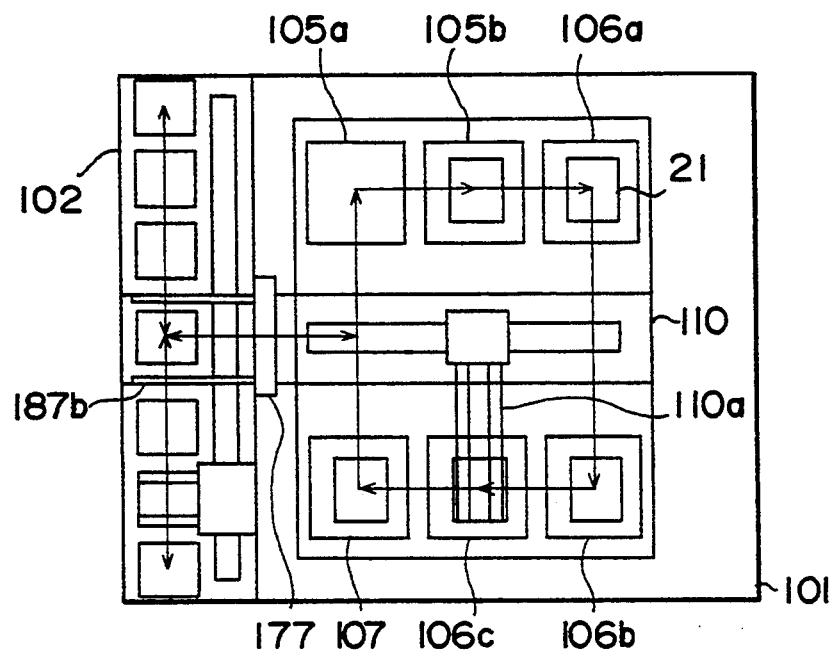
FIGS. 85 and 86 respectively are a plan view and a front elevational view which illustrate a cleaning apparatus according to a forty-second embodiment.
Figure 86:
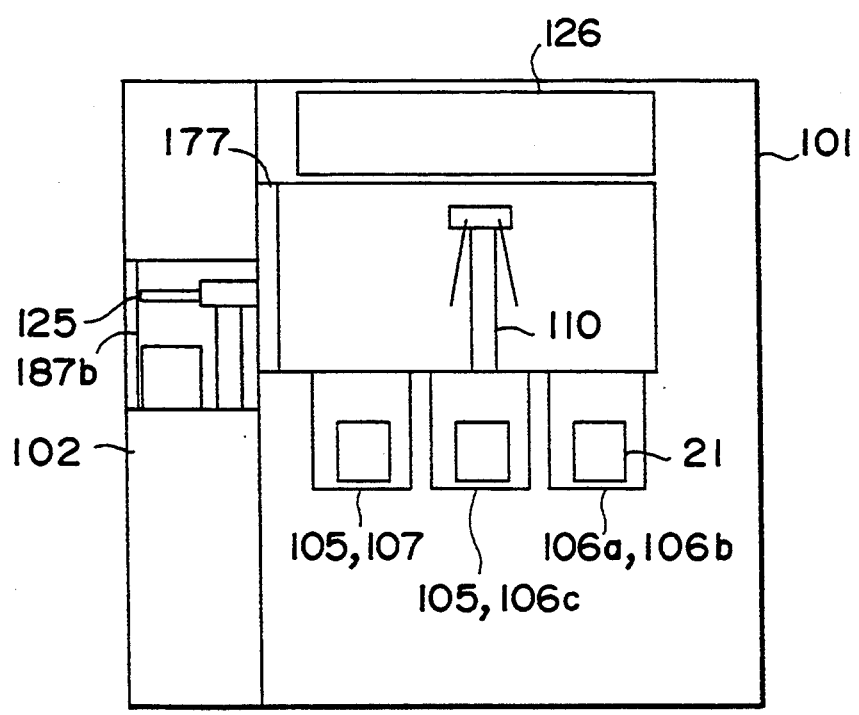

FIGS. 85 and 86 respectively are a plan view and a side elevational view which illustrate a semiconductor cleaning apparatus according to a forty-second embodiment. The product cassette accommodating the wafer, which has not been cleaned, is injected into the loader/unloader portion 102. The wafer in the product cassette is, by the shifting robot 125, taken out from the product cassette to be shifted to the shifting portion, the wafer being shifted to the cleaning cassette 21 in the shifting portion. After the shifting robot 125 has been removed from the shifting portion, the shielding plate 187b is closed and the window 177 is opened. The cleaning cassette 21 accommodating the wafer is held by the cassette hand of the conveyance robot 110a of the conveyance portion 110 to be injected into the cleaning portion 105a. Then, the window 177 is closed and the insulating plate 187b is opened. The cleaning cassette 21 injected into the cleaning portion 105a is sequentially shifted to the cleaning portion 105b, the water cleaning portions 106a to 106c and the drying portion 107. As a result, the wafer cleaning process is completed.

The insulating plate 187b is closed, the window 177 is opened, and the cleaning cassette 21 accommodating the wafer, which has been cleaned, is shifted to the shifting portion by the conveyance robot 110a. Then, the window 177 is closed and the insulating plate 187b is opened. The shifting robot 125 takes out the wafer from the cleaning cassette 21 to be shifted to the loader/unloader portion 102. The wafer is shifted to the product cassette in the loader/unloader portion 102 before it is discharged.

Figure 87:
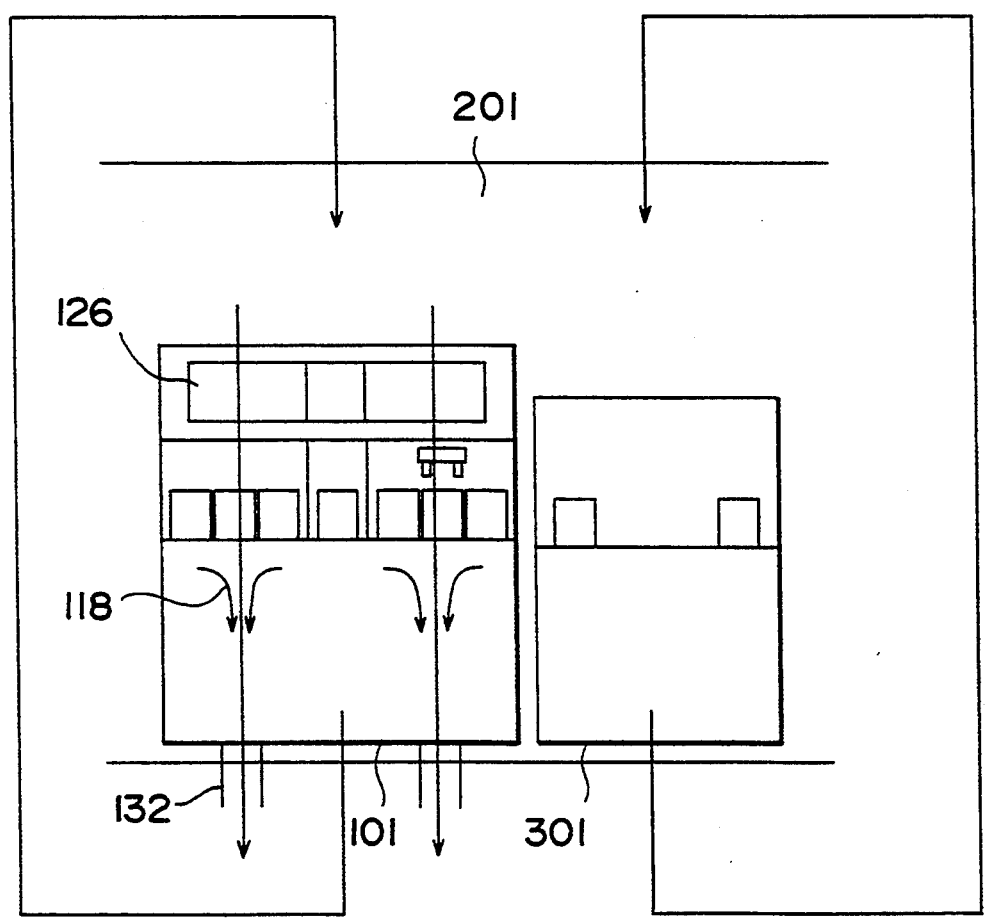
FIG. 87 illustrates a state where the cleaning apparatus according to the forty-second embodiment is used.

Then, a state where the cleaning apparatus according to this embodiment is used in a semiconductor manufacturing plant is shown in FIG. 87. Referring to FIG. 87, reference numeral 132 represents a discharge duct connected to the duct of the plant, 301 represents another manufacturing apparatus, 201 represents a dry zone exhibiting excellent cleanliness for another manufacturing apparatus, and 118 represents mist flying from the cleaning apparatus.

The cleaning apparatus 101 according to this embodiment is so arranged that the sealed chamber insulates the cleaning portion, the water cleaning portion and the drying portion from the dry zone 201. Further, the window 177 and the insulating plate 187b are not simultaneously opened even in a process of cleaning the wafer in the product cassette. Therefore, the fear of flying of the mist 118 from the cleaning apparatus 101 to the dry zone 201 can be completely eliminated. Therefore, the necessity of dividing the other manufacturing apparatus and the air conditioning facilities can be eliminated. Further, even if the air flow in the dry zone 201 is disordered due to the shift of the apparatus, articles, and persons, flying of the mist 118 to the dry zone 201 can be prevented. Therefore, generation of defective products and deterioration in the characteristics due to the mist can be prevented.

Although the description has been about the cassette-type cleaning apparatus using the cleaning cassette, this embodiment may, of course, be adapted to a cassette-less-type cleaning apparatus which does not use the cleaning cassette and which directly handles the wafer.

Forty-Third Embodiment

Figure 88:
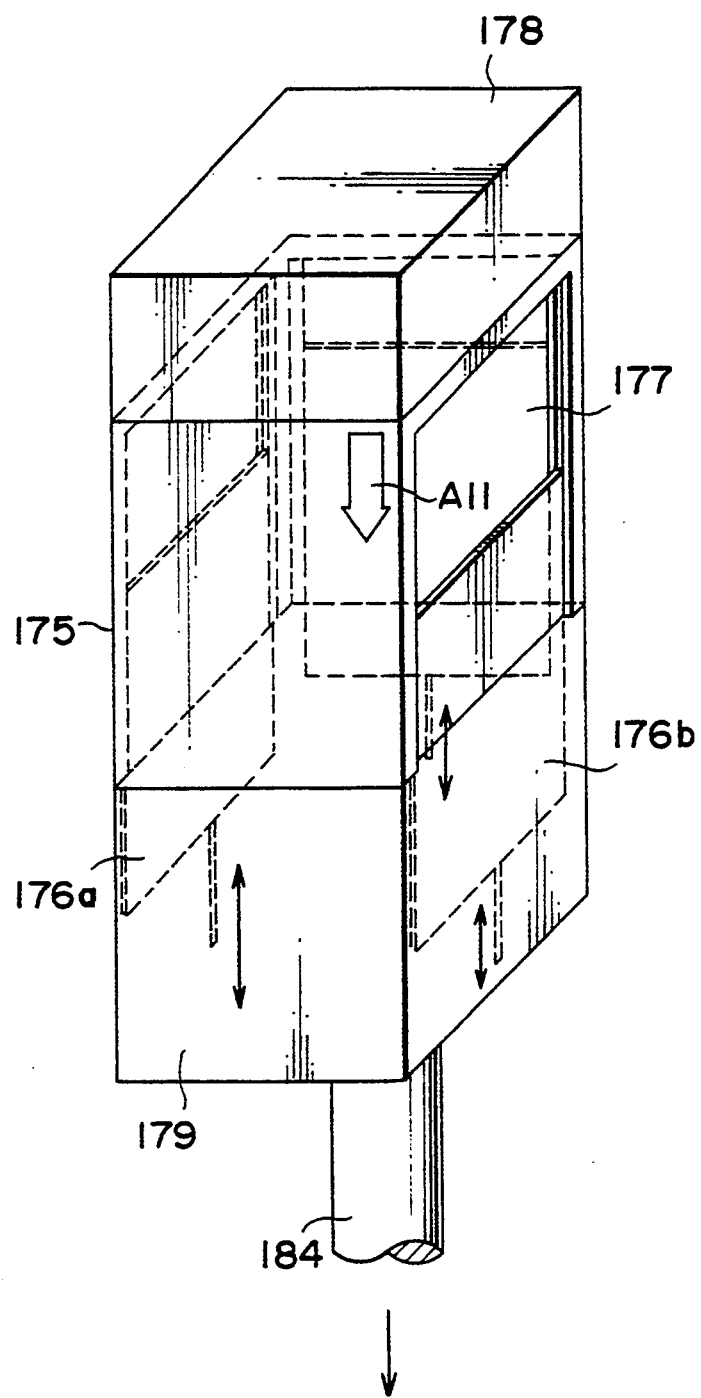
FIG. 88 is a perspective view which illustrates a load locking chamber of a cleaning apparatus according to a forty-third embodiment.

FIG. 88 is a perspective view which illustrates a load locking chamber of a semiconductor cleaning apparatus according to a forty-third embodiment. Referring to FIG. 88, reference numeral 175 represents a load locking chamber disposed adjacent to the window structure between the cleaning apparatus body 101 and the loader/unloader portion 102, 176a and 176b represent doors of the load locking chamber 175 which can be opened/closed to inject/eject the product cassette 22 to and from the load locking chamber 175, 178 represents an air conditioning filter disposed in the upper portion of the load locking chamber 175 and arranged to supply clean air to the load locking chamber 175, 179 represents a discharge portion for discharging air from the load locking chamber 175, and 184 represents a discharge pipe connected to the discharge portion 179 and arranged to finally discharge air to the outside of the load locking chamber 175.

The downflows A11 blown out from the air conditioning filter 178 pass through the load locking chamber 175, and are then discharged to the outside of the load locking chamber 175 through the discharge pipe 184 via the discharge portion 179. Therefore, the inside portion of the load locking chamber 175 can be always kept clean. Further, the static pressure in the load locking chamber 175 is made to be always the same as the pressure of the portion opened in the previous process. That is, even if the doors 176a and 176b of the load locking chamber are opened and then closed, the internal pressure of the load locking chamber 175 is the same as the static pressure of the external portion. Therefore, when the window structure 177 of the load locking chamber is then opened, a pressure difference is present between the internal static pressure of the load locking chamber 175 and the internal static pressure of the cleaning apparatus body 101. Although the air flow generated due to the pressure difference is very small as compared with the case where the load locking chamber 175 is not present because the capacity in the load locking chamber 175 is small, it must be completely prevented. Accordingly, the air supply pressure of the air conditioning filter 178 and the air discharge pressure from the discharge pipe 184 are changed, the static pressure in the load locking chamber 175 and that of the space which is communicated in the next process are detected, and the static pressure in the load locking chamber 175 and that in the space to be communicated in the next step are made to be the same in response to a signal denoting the detected static pressures.

Since this embodiment is, as described above, arranged so that the load locking chamber 175 is provided with the third air conditioning filter 178 for supplying clean air and the third discharge pipe 184 for discharging air from the load locking chamber 175, the inside portion of the load locking chamber 175 can be kept clean. Further, flying of dust due to the air flow generated depending upon the pressure difference from the pressure level in the chamber when the door of the load locking chamber 175 is opened can be prevented.

Although the description has been about the cassette-type cleaning apparatus using the cleaning cassette, this embodiment may, of course, be adapted to a cassette-less cleaning apparatus which does not use the cleaning cassette and which directly handles the wafer.

Forty-Fourth Embodiment

Figure 89:
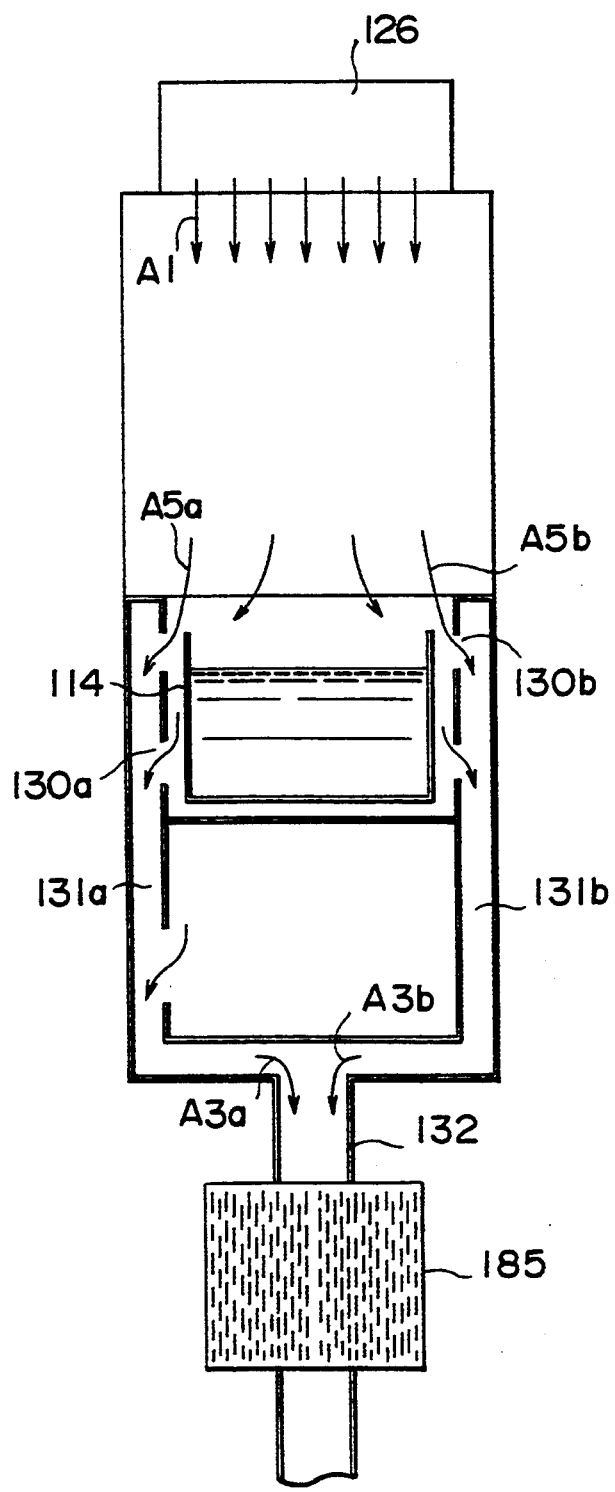
FIG. 89 is a cross sectional view which illustrates the inside portion of a cleaning apparatus according to a forty-fourth embodiment.
Figure 90:
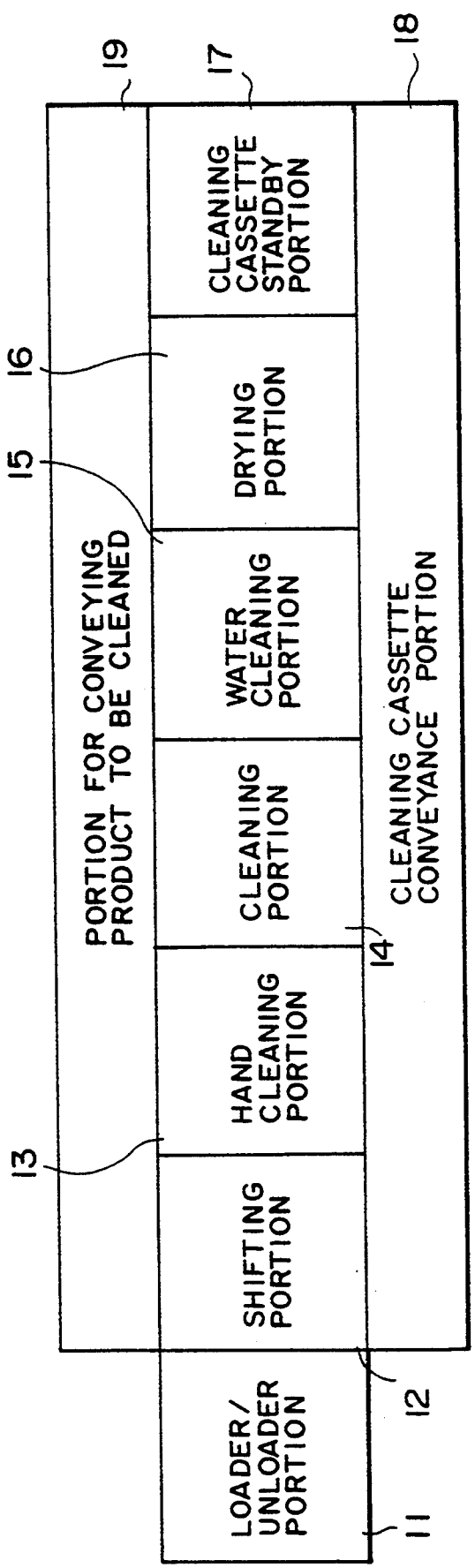
FIG. 90 is a block diagram which illustrates the overall structure of a conventional semiconductor cleaning apparatus.
Figure 91:
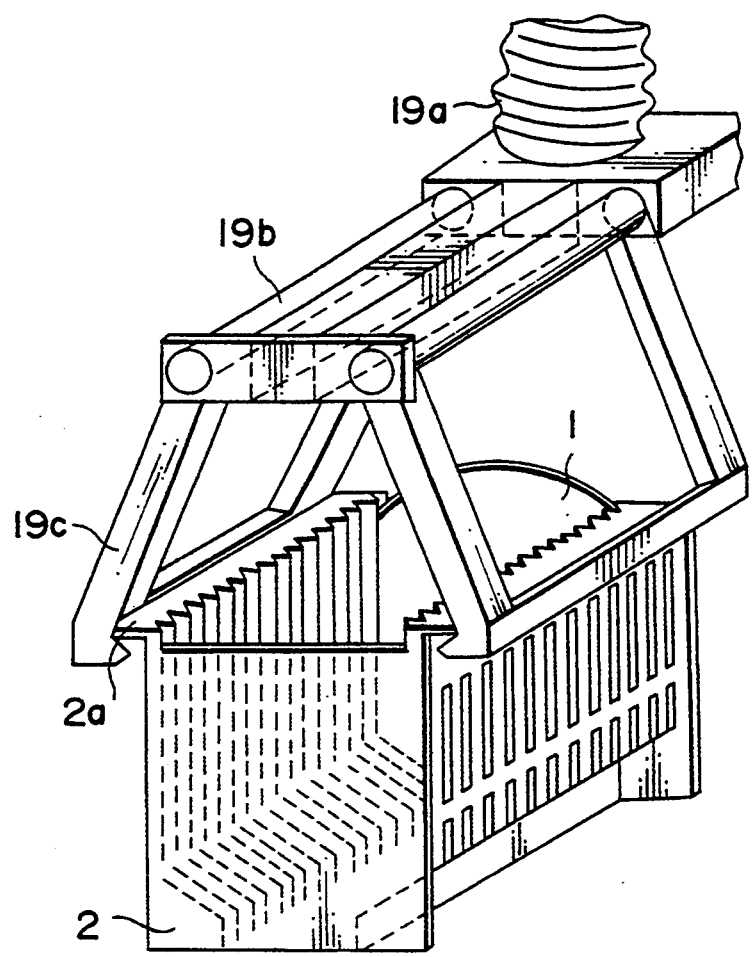
FIG. 91 is a perspective view which illustrates a conventional wafer cassette and a cassette hand.
Figure 92:
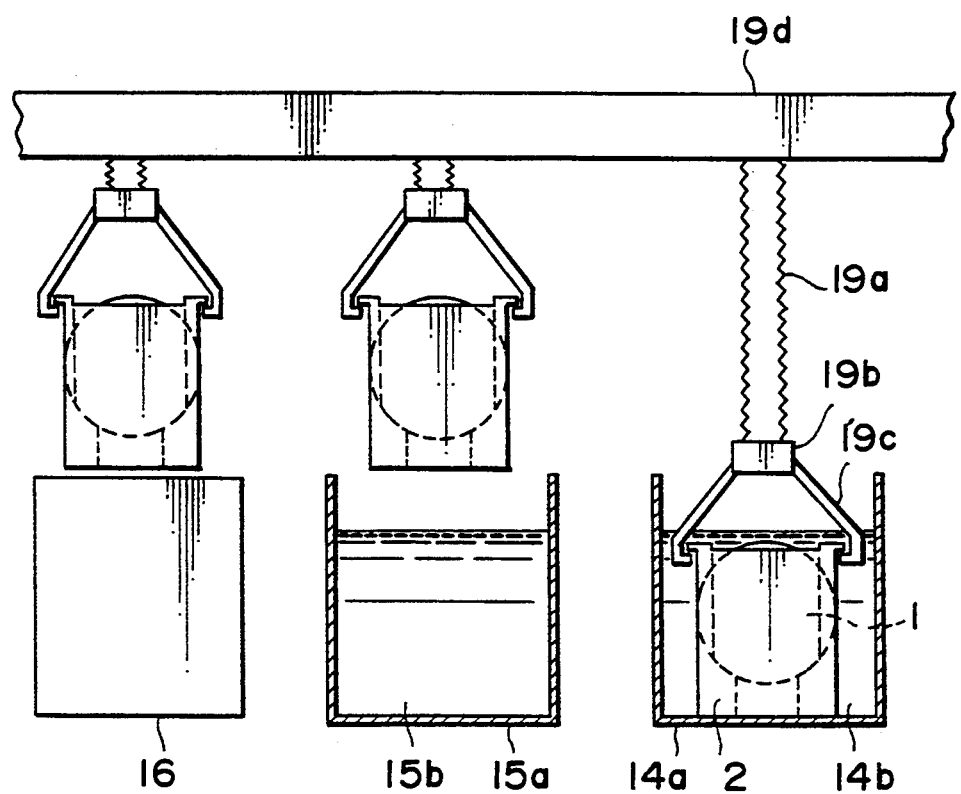
FIG. 92 illustrates a cleaning process adapted to the cleaning apparatus shown in FIG. 90.
Figure 93:
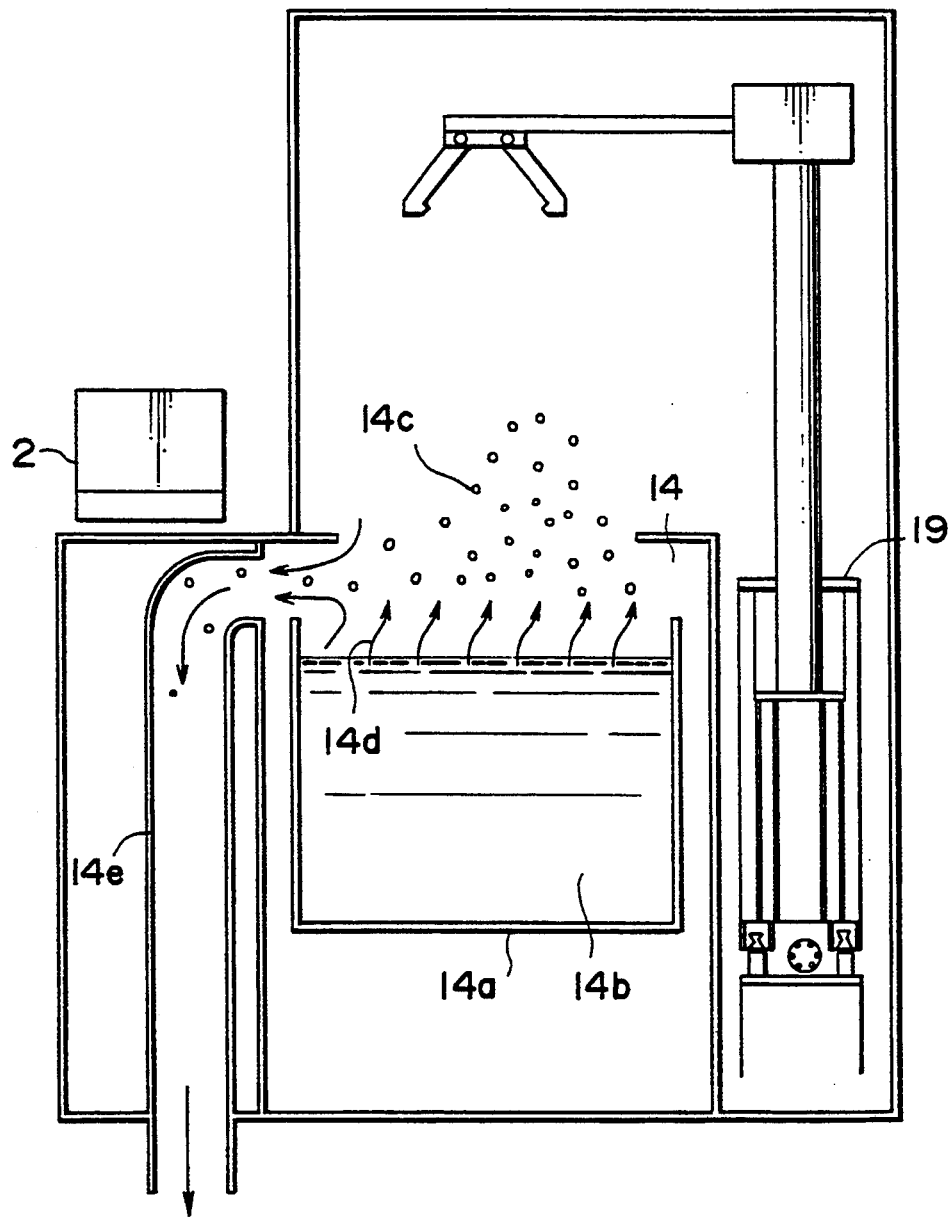
FIG. 93 is a cross sectional view which illustrates a cleaning portion of the cleaning apparatus shown in FIG. 90.

FIG. 89 is a front cross sectional view which illustrates the detailed structure of the inner portion of a semiconductor cleaning apparatus according to a forty-fourth embodiment. Referring to FIG. 89, reference numeral 126 represents an air conditioning filter disposed above the cleaning chamber 114 and arranged to supply clean air, 130a and 130b represent discharge ports for sucking and discharging air around the cleaning chamber 114, 131a and 131b represent discharge ducts connected to the discharge ports 130a and 130b, 132 represents a discharge pipe connected to the discharge ducts 131a and 131g and arranged to finally discharge air to the outside of the semiconductor cleaning apparatus 101, and 185 represents a demistor for removing chemical mist generated in the cleaning chamber 114 and mixed with the suction flows A5a and A5b and discharge flows A3a and A3b. Symbol A1 represents downflows to be sent from the air conditioning filter 126, A5a and A5b represent suction flows to be sucked into the discharge ports 130a and 130b, and A3a and A3b represent discharge flows to be discharged into the discharge pipe 132 via the discharge ducts 131a and 131b.

The downflows A1 blown out from the air conditioning filter 126 pass through a space above the cleaning chamber 114, trap the chemical mist generated in the cleaning chamber 114, sucked through the discharge ports 130a and 130b formed around the cleaning chamber 114 as designated by air flows A5a and A5b, and discharged from the discharge ducts 131a and 131b to the discharge pipe 132 as designated by discharge flows A3a and A3b. At this time, the demistor 185 formed by placing a net-shape sheet into the discharge pipe 132 is used to remove the chemical mist. As a result, the undesirable return of the chemical mist into the discharge pipe and undesirable re-sending of it to the clean room is prevented so that diffusion of the chemical mist and dried vapor in the overall clean room or into the cleaning apparatus causing the corrosion of the apparatus and generation of defects in the wafer can be prevented.

Although the demistor 185 is so arranged that the net-shape sheet is placed in the discharge pipe, the net-shape sheet may be a porous material or a structure which bubbles the discharge flow through pure water to obtain a similar effect.

This embodiment is, as described above, so arranged that the first filter 126 for supplying clean air to the cleaning portion, the water cleaning portion and the drying portion and the first discharge pipe 132 disposed in the vicinity of the chambers of the cleaning portion, the water cleaning portion and the drying portion are used. Further, the demistor 185 made of a porous material or the net-shape filler is disposed at an intermediate position of the discharge pipe 132. Therefore, chemical mist and dried vapor mixed into the discharged air can be removed so that diffusion of the chemical mist or the dried vapor wafting on the circulating air into the apparatus or toward the outside of the apparatus causing the corrosion of the apparatus and defects of the wafer can be prevented.

Although the description has been about the cassette-type cleaning apparatus using the cleaning cassette, this embodiment may, of course, be adapted to a cassette-less cleaning apparatus which does not use the cleaning cassette and which directly handles the wafer.

What is claimed is:
1. A semiconductor cleaning apparatus comprising:
   a cassette loader/unloader for accommodating a product cassette;
   a product loader/unloader for loading a wafer into and unloading a wafer from a product cassette in the cassette loader/unloader;
   a cleaning portion for cleaning a wafer;
   a water cleaning portion for cleaning with water a wafer that has been cleaned in the cleaning portion;

a drying portion for drying the wafer that has been cleaned with water in the water cleaning portion; and a conveyance having a wafer hand for directly holding a wafer unloaded from a product cassette, the hand sequentially conveying the wafer to the cleaning portion, the water cleaning portion, and the drying portion.

2. A semiconductor cleaning apparatus comprising:

a cassette loader/unloader for accommodating a product cassette;

a product loader/unloader for loading a wafer into and unloading a wafer from a product cassette in the cassette loader/unloader;

a cleaning portion for cleaning a wafer;

a water cleaning portion for cleaning with water a wafer that has been cleaned in the cleaning portion:

a drying portion for drying the wafer that has been cleaned with water in the water cleaning portion; and a conveyance having a wafer hand for directly holding a wafer unloaded from a product cassette, the hand sequentially conveying the wafer to the cleaning portion, the water cleaning portion and the drying portion, wherein the cassette loader/unloader has at least one wafer retaining frame for accommodating wafers unloaded from one of the product cassettes by the product loader/unloader and one or more product cassette retaining frames for accommodating one or more product cassettes capable of holding at least as many wafers as are simultaneously disposed in the cleaning portion, the water cleaning portion, and the drying portion.

3. A semiconductor cleaning apparatus comprising:

a cassette loader/unloader for accommodating a product cassette;

a product loader/unloader for loading a wafer into and unloading a wafer from a product cassette in the cassette loader/unloader and having rails for moving along the cassette loader/unloader, a hand for holding a wafer, an orientation flat aligning device for aligning orientation flats of wafers in a cassette, and a projecting member for upwardly projecting a wafer in a cassette to a position above the cassette;

a cleaning portion for cleaning a wafer;

a water cleaning portion for cleaning with water a wafer that has been cleaned in the cleaning portion;

a drying portion for drying the wafer that has been cleaned with water in the water cleaning portion; and a conveyance having a wafer hand for directly holding a wafer unloaded from a product cassette and sequentially conveying the wafer held by the wafer hand to the cleaning portion, the water cleaning portion, and the drying portion.

* * * * *